US009548130B2

(12) United States Patent
Dutta et al.

(10) Patent No.: US 9,548,130 B2
(45) Date of Patent: Jan. 17, 2017

(54) NON-VOLATILE MEMORY WITH PRIOR STATE SENSING

(71) Applicant: SANDISK TECHNOLOGIES INC., Plano, TX (US)

(72) Inventors: Deepanshu Dutta, Fremont, CA (US); Huai-Yuan Tseng, San Ramon, CA (US); Dana Lee, Saratoga, CA (US); Ken Oowada, Fujisawa (JP); Shih-Chung Lee, Yokohama (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/817,741

(22) Filed: Aug. 4, 2015

(65) Prior Publication Data
US 2016/0300619 A1 Oct. 13, 2016

Related U.S. Application Data

(60) Provisional application No. 62/144,831, filed on Apr. 8, 2015.

(51) Int. Cl.
| | |
|---|---|
| *G11C 16/04* | (2006.01) |
| *G11C 16/34* | (2006.01) |
| *G11C 11/56* | (2006.01) |
| *G11C 16/10* | (2006.01) |
| *G11C 16/28* | (2006.01) |

(52) U.S. Cl.
CPC ....... *G11C 16/3459* (2013.01); *G11C 11/5671* (2013.01); *G11C 16/0483* (2013.01); *G11C 16/10* (2013.01); *G11C 16/28* (2013.01)

(58) Field of Classification Search
CPC . G11C 16/3459; G11C 16/0483; G11C 16/10; G11C 16/28; G11C 11/5671
USPC ....................................... 365/185.03, 185.17
See application file for complete search history.

(56) References Cited

U.S. PATENT DOCUMENTS

| | | | | |
|---|---|---|---|---|
| 5,339,274 A | | 8/1994 | Dhong | |
| 6,075,727 A | * | 6/2000 | Morton | ........... G11C 16/10 |
| | | | | 365/185.22 |
| 6,141,244 A | | 10/2000 | Pawletko | |
| 6,888,758 B1 | | 5/2005 | Hemink | |

(Continued)

OTHER PUBLICATIONS

Dutta "Multiple Bit Line Voltage Sensing for Non-Volatile Memory," U.S. Appl. No. 14/817,767, filed Aug. 4, 2015.

(Continued)

*Primary Examiner* — Pho M Luu
(74) *Attorney, Agent, or Firm* — Vierra Magen Marcus LLP

(57) ABSTRACT

A non-volatile memory system comprises a plurality of memory cells arranged in a three dimensional structure and one or more control circuits in communication with the memory cells. The one or more control circuits are configured to program and verify programming for the memory cells. The verifying programming of the plurality of memory cells includes verifying programming for a first data state using a verify operation for a second data state. In one embodiment, the one or more control circuits are also configured to sense whether different memory cells of the plurality of memory cells are in different data states by applying different bit line voltages to the different memory cells.

21 Claims, 26 Drawing Sheets

(56) References Cited

U.S. PATENT DOCUMENTS

| | | | |
|---|---|---|---|
| 6,999,345 B1 * | 2/2006 | Park | G11C 16/3459 |
| | | | 365/185.18 |
| 7,002,843 B2 | 2/2006 | Guterman | |
| 7,020,026 B2 | 3/2006 | Guterman | |
| 7,023,733 B2 | 4/2006 | Guterman | |
| 7,068,539 B2 | 6/2006 | Guterman | |
| 7,073,103 B2 | 7/2006 | Gongwer | |
| 7,088,621 B2 | 8/2006 | Guterman | |
| 7,139,198 B2 | 11/2006 | Guterman | |
| 7,257,028 B2 | 8/2007 | Lee | |
| 7,280,408 B2 | 10/2007 | Guterman | |
| 7,301,812 B2 | 11/2007 | Guterman | |
| 7,317,638 B2 | 1/2008 | Guterman | |
| 7,349,264 B2 | 3/2008 | Mokhlesi | |
| 7,411,827 B2 | 8/2008 | Guterman | |
| 7,414,887 B2 | 8/2008 | Guterman | |
| 7,447,075 B2 | 11/2008 | Guterman | |
| 7,453,730 B2 | 11/2008 | Guterman | |
| 7,454,324 B1 | 11/2008 | Seawright et al. | |
| 7,460,406 B2 | 12/2008 | Mokhlesi | |
| 7,471,567 B1 | 12/2008 | Lee | |
| 7,508,715 B2 | 3/2009 | Lee | |
| 7,551,477 B2 | 6/2009 | Mokhlesi | |
| 7,616,481 B2 | 11/2009 | Mokhlesi | |
| 7,800,094 B2 | 9/2010 | Ho | |
| 7,800,945 B2 | 9/2010 | Cernea | |
| 7,826,271 B2 | 11/2010 | Cernea | |
| 7,835,183 B2 * | 11/2010 | Yamashita | G11C 16/28 |
| | | | 365/185.18 |
| 8,111,548 B2 | 2/2012 | Mokhlesi | |
| 8,218,381 B2 | 7/2012 | Li | |
| 8,223,556 B2 | 7/2012 | Dutta | |
| 8,233,324 B2 | 7/2012 | Sharon | |
| 8,321,727 B2 | 11/2012 | D'Abreu | |
| 8,456,912 B2 * | 6/2013 | Han | G11C 11/5628 |
| | | | 365/185.12 |
| 8,498,152 B2 | 7/2013 | Alrod | |
| 8,509,000 B2 | 8/2013 | Sharon | |
| 8,582,381 B2 | 11/2013 | Oowada | |
| 8,873,285 B2 | 10/2014 | Sharon | |
| 8,885,416 B2 | 11/2014 | Mui | |
| 2008/0247254 A1 | 10/2008 | Nguyen | |
| 2010/0002514 A1 | 1/2010 | Lutze | |
| 2010/0110792 A1 | 5/2010 | Lutze | |
| 2011/0209031 A1 | 8/2011 | Kim | |
| 2011/0235420 A1 | 9/2011 | Sharon | |
| 2014/0071761 A1 | 3/2014 | Sharon | |
| 2015/0103595 A1 | 4/2015 | Dunga | |

OTHER PUBLICATIONS

Office Action dated Feb. 24, 2016, U.S. Appl. No. 14/817,767.

PCT International Search Report and Written Opinion of the International Searching Authority, dated Jun. 8, 2016, PCT Patent Application PCT/US2016/025918.

* cited by examiner

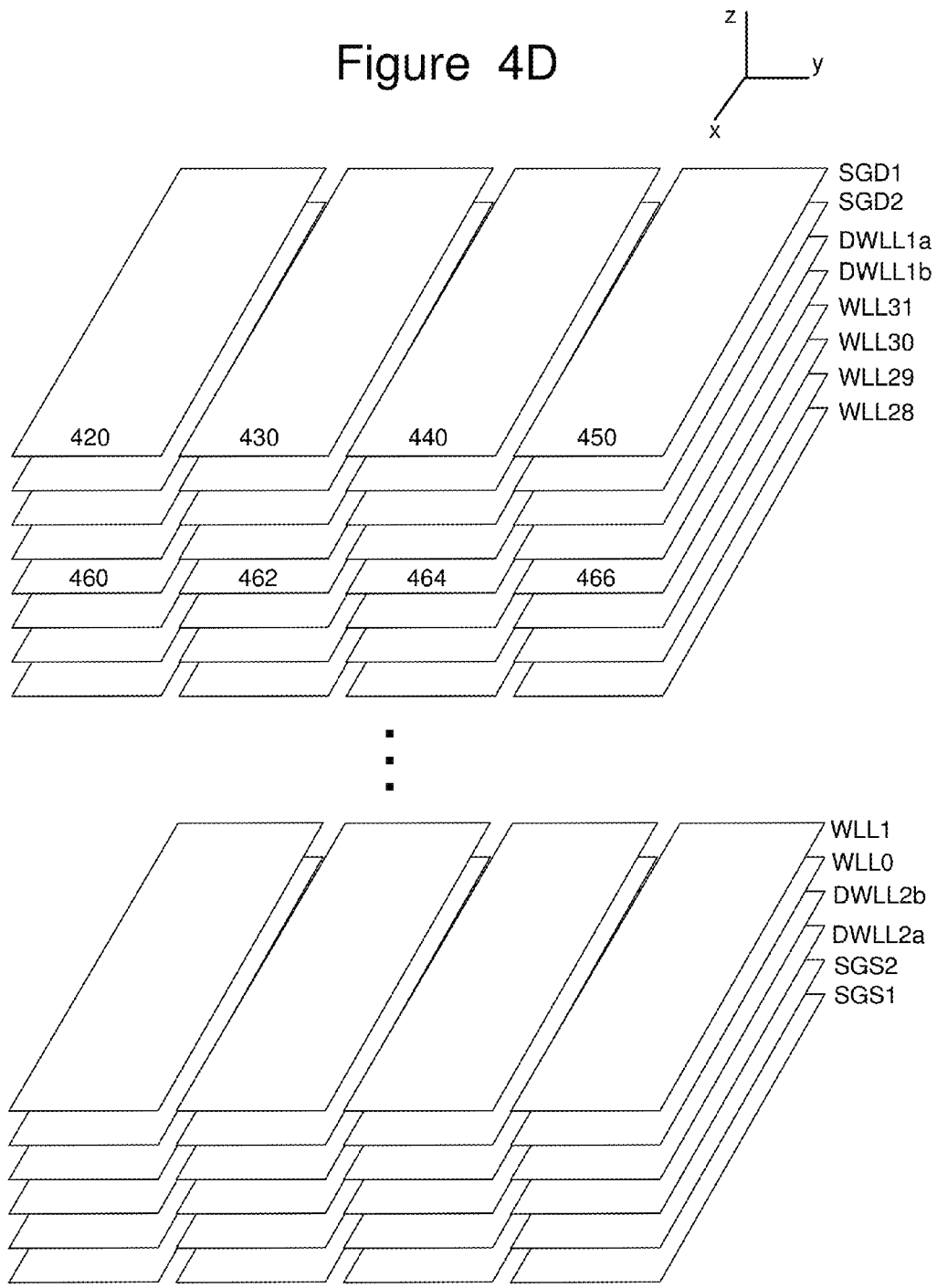

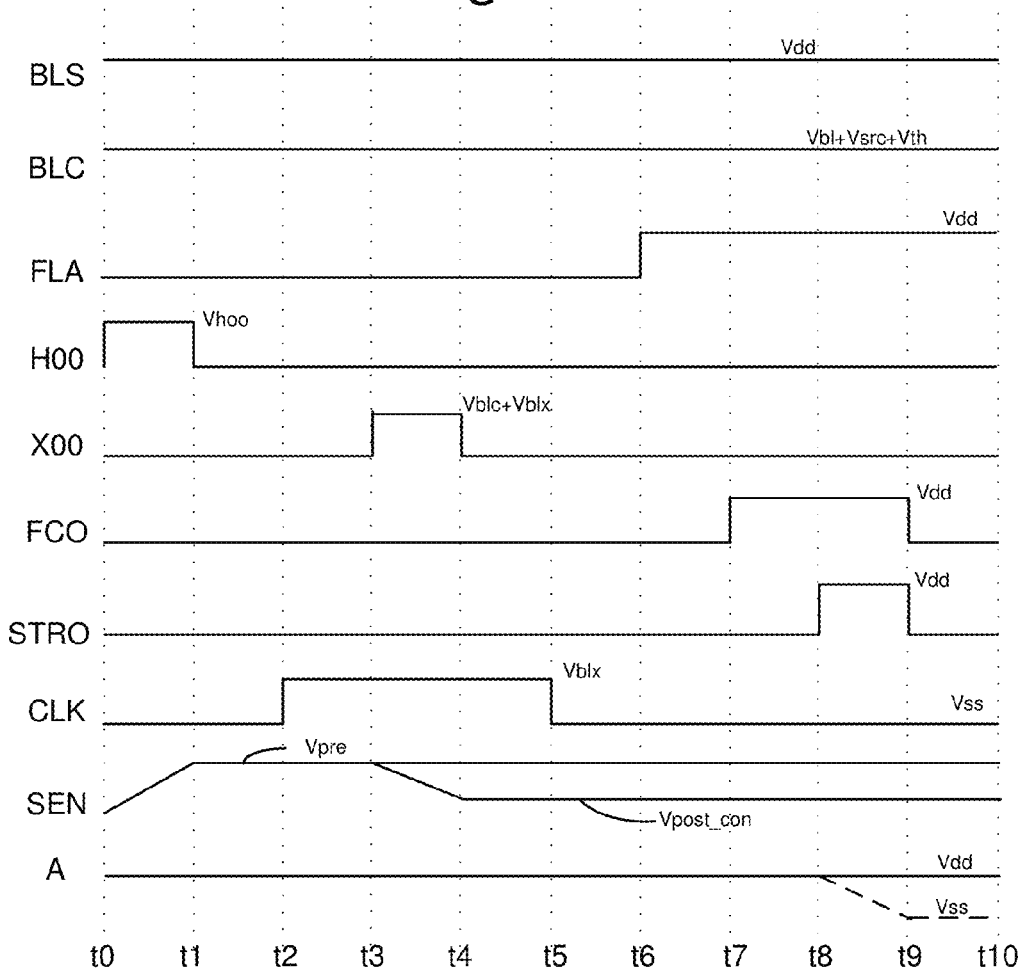
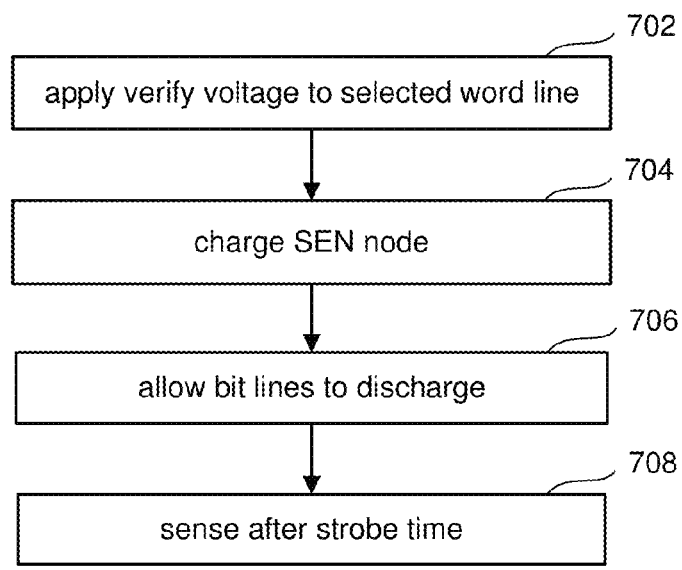

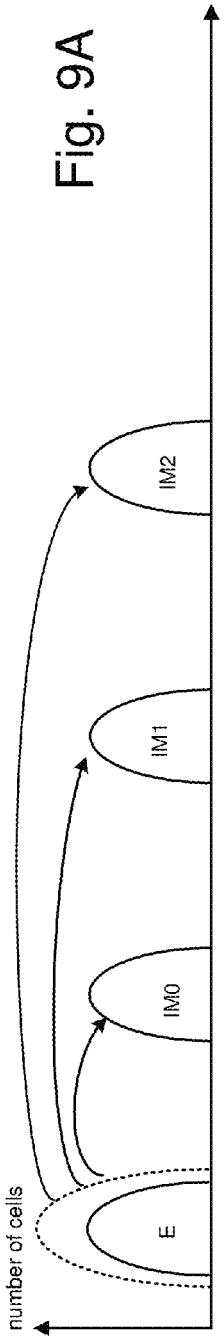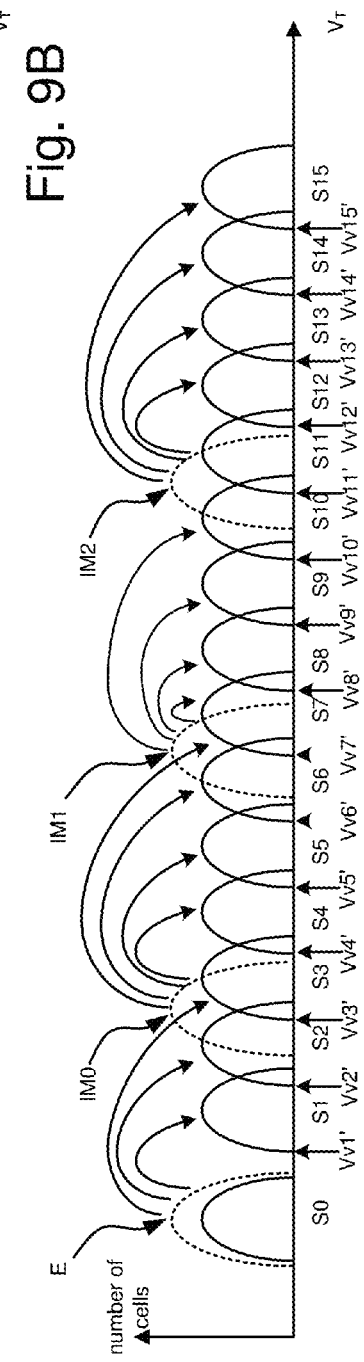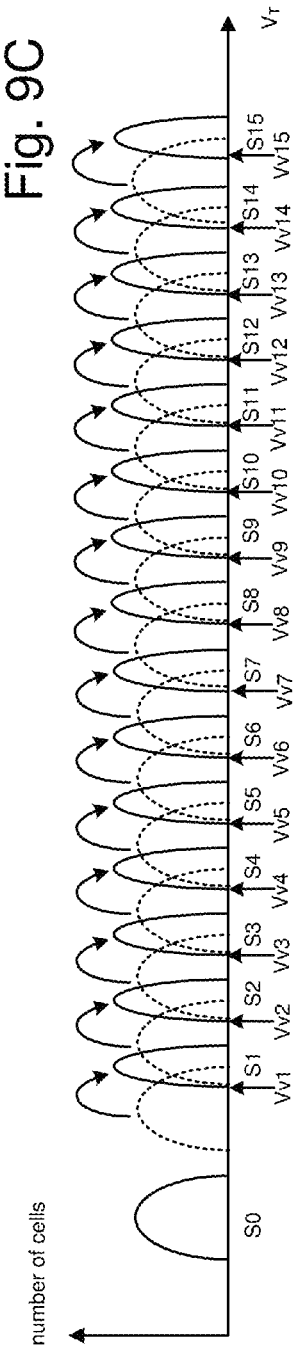

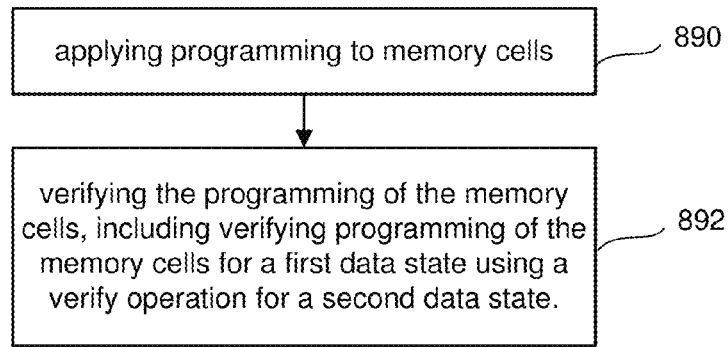
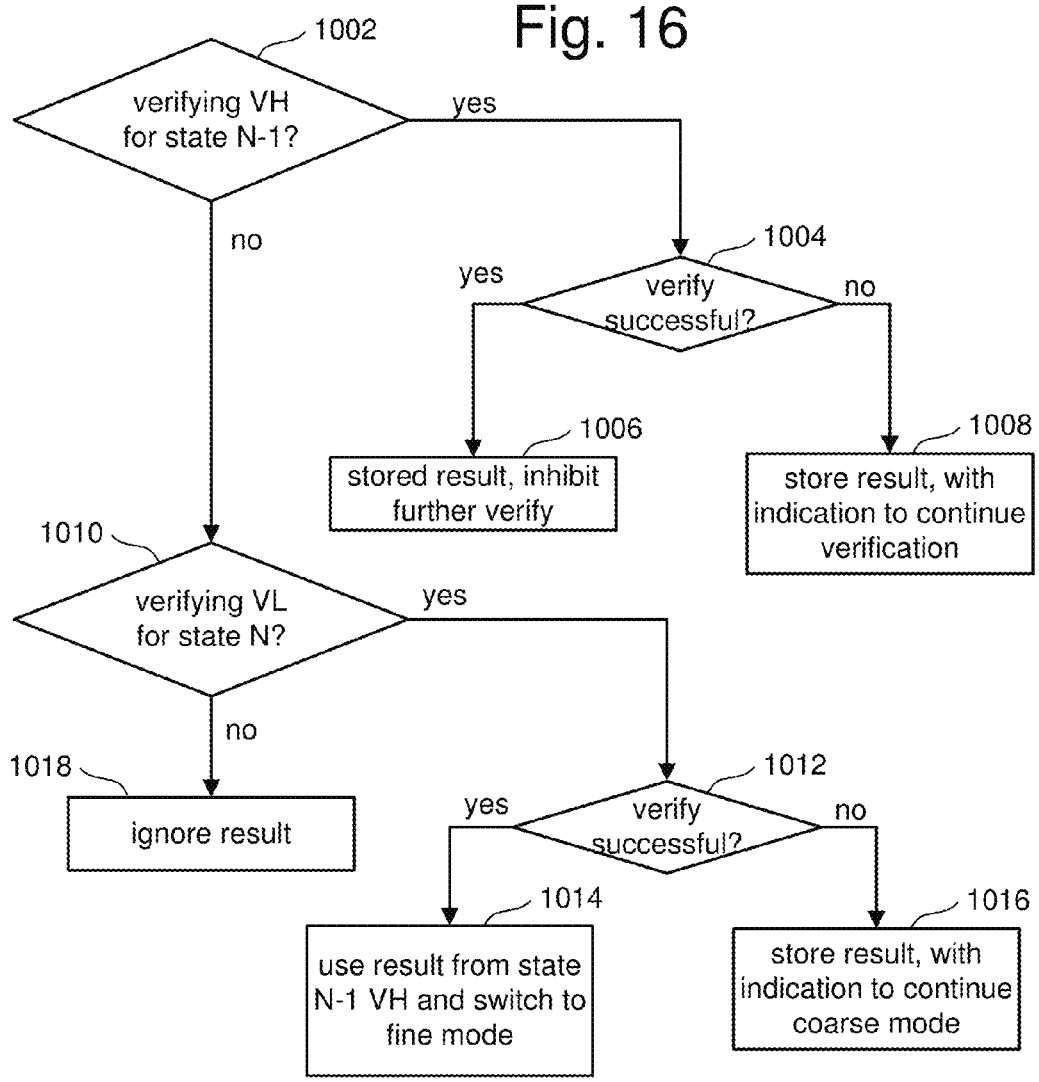

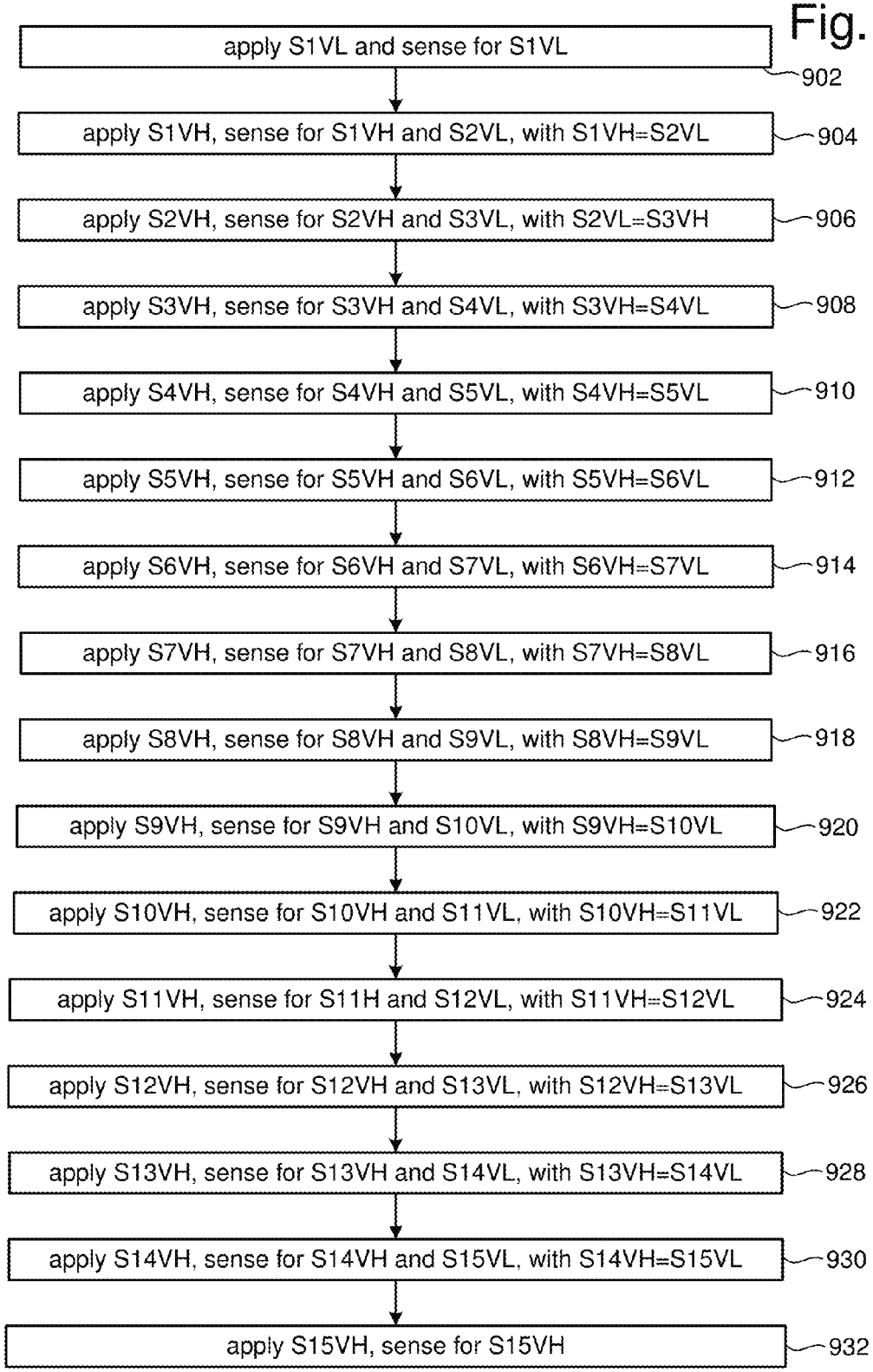

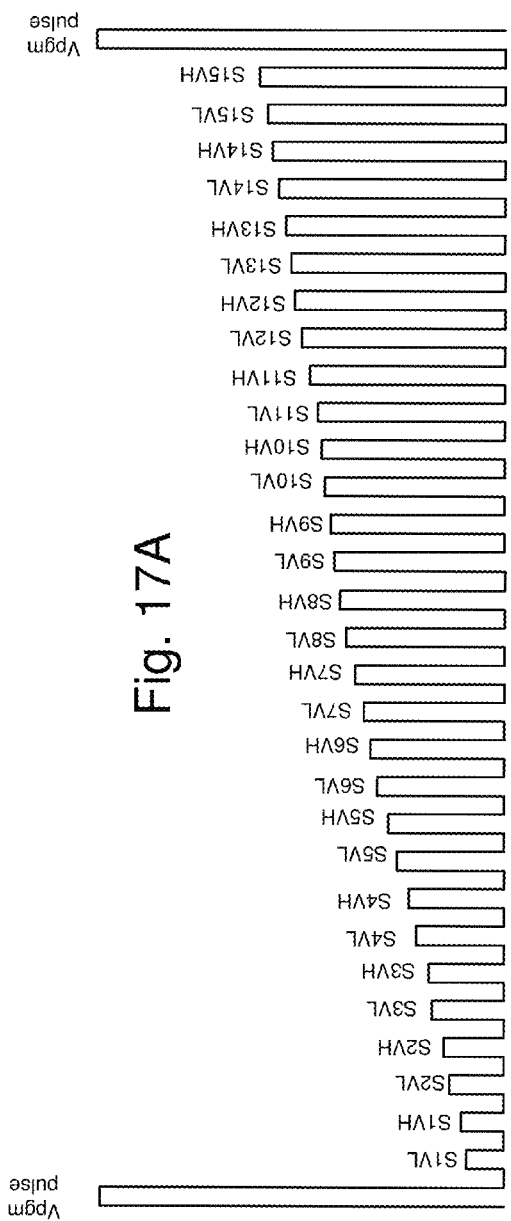
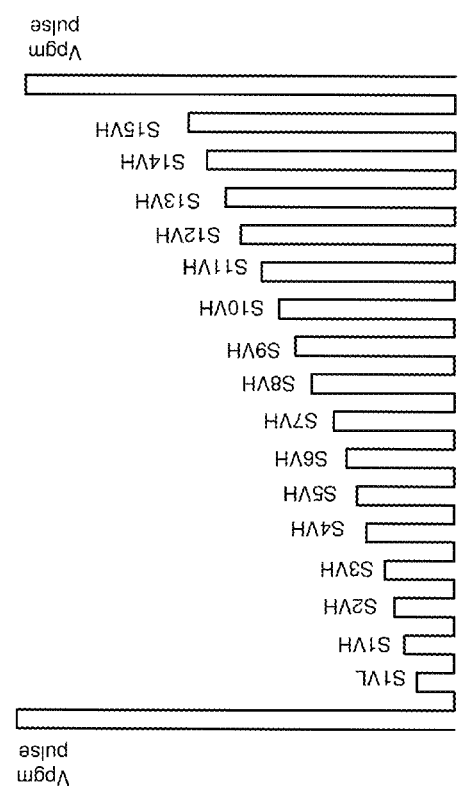

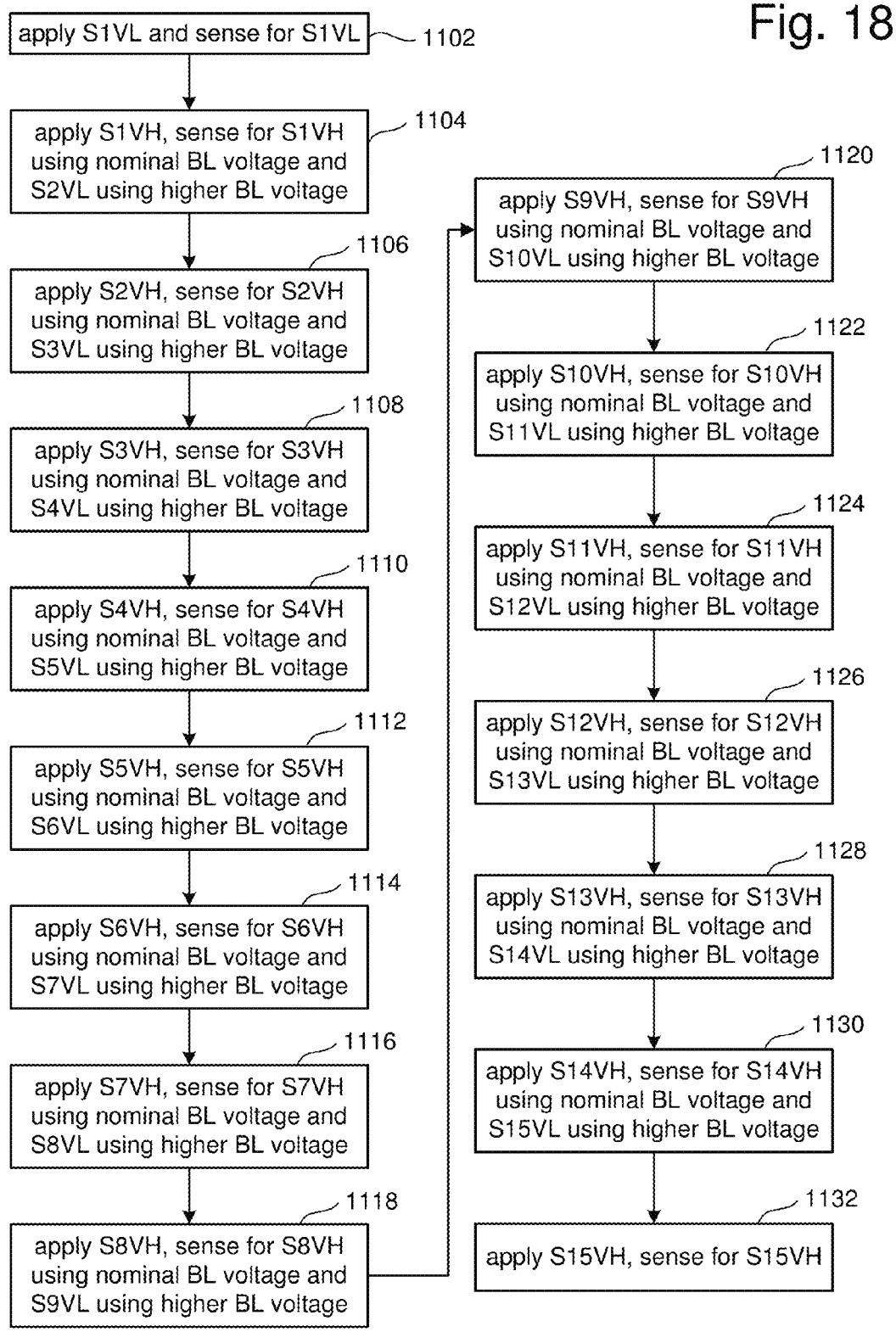

NON-VOLATILE MEMORY WITH PRIOR STATE SENSING

This application claims the benefit of U.S. Provisional Application 62/144,831, filed Apr. 8, 2015, titled "Prior Verify and Multi-BL Sensing For Non-Volatile Storage."

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

Some non-volatile memory devices are used to store two ranges of charges and, therefore, the memory cell can be programmed/erased between two ranges of threshold voltages that correspond to two data states: an erased state (e.g., data "1") and a programmed state (e.g., data "0"). Such a device is referred to as a binary or two-state device.

A multi-state (or multi-level) non-volatile memory is implemented by identifying multiple, distinct allowed ranges of threshold voltages. Each distinct rang of threshold voltages corresponds to a data state assigned a predetermined value for the set of data bits. The specific relationship between the data programmed into the memory cell and the ranges of threshold voltages depends upon the data encoding scheme adopted for the memory cells. For example, U.S. Pat. No. 6,222,762 and U.S. Patent Application Publication No. 2004/0255090 both describe various data encoding schemes for multi-state flash memory cells. While multi-state non-volatile memory can store more data than binary non-volatile memory, the process for programming and verifying the programming can take longer for multi-state non-volatile memory.

BRIEF DESCRIPTION OF THE DRAWINGS

Like-numbered elements refer to common components in the different figures.

FIG. 4D depicts a view of the select gate layers and word line layers.

FIG. 6 is a timing diagram that describes the behavior of certain signals depicted in the sense amplifier of FIG. 5.

FIG. 7 is a flow chart describing one embodiment of the operation of the circuit of FIG. 5.

FIGS. 9A, 9B and 9C depict threshold voltage distributions.

FIG. 14 is a flow chart describing one embodiment of a process for verifying programming.

FIG. 15 is a flow chart describing one embodiment of a process for verifying programming.

FIG. 16 is a flow chart describing one embodiment of a process for verifying programming.

FIGS. 17A and 17B depict signal waveforms for a word line voltage.

FIG. 18 is a flow chart describing one embodiment of a process for verifying programming.

DETAILED DESCRIPTION

In general, the more data states implemented in a multi-state non-volatile memory, the longer it takes to verify programming. Therefore, technology is disclosed for reducing the time needed to verify programming for multi-state non-volatile memory. The proposed process for verifying includes verifying programming for a first data state using a verify operation for a second data state, thereby reducing the number of verify operations. In one embodiment, the one or more control circuits are configured to sense whether different memory cells of the plurality of memory cells are in different data states by applying different bit line voltages to the different memory cells during a sensing operation.

The following discussion provides details of one example of a suitable structure for a memory devices that can implement the proposed technology.

Figure 1:
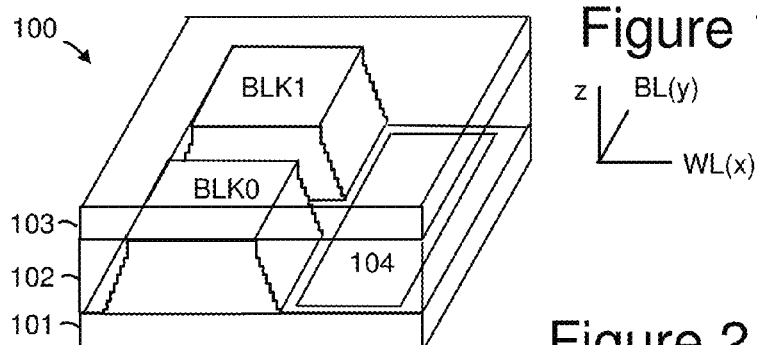
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
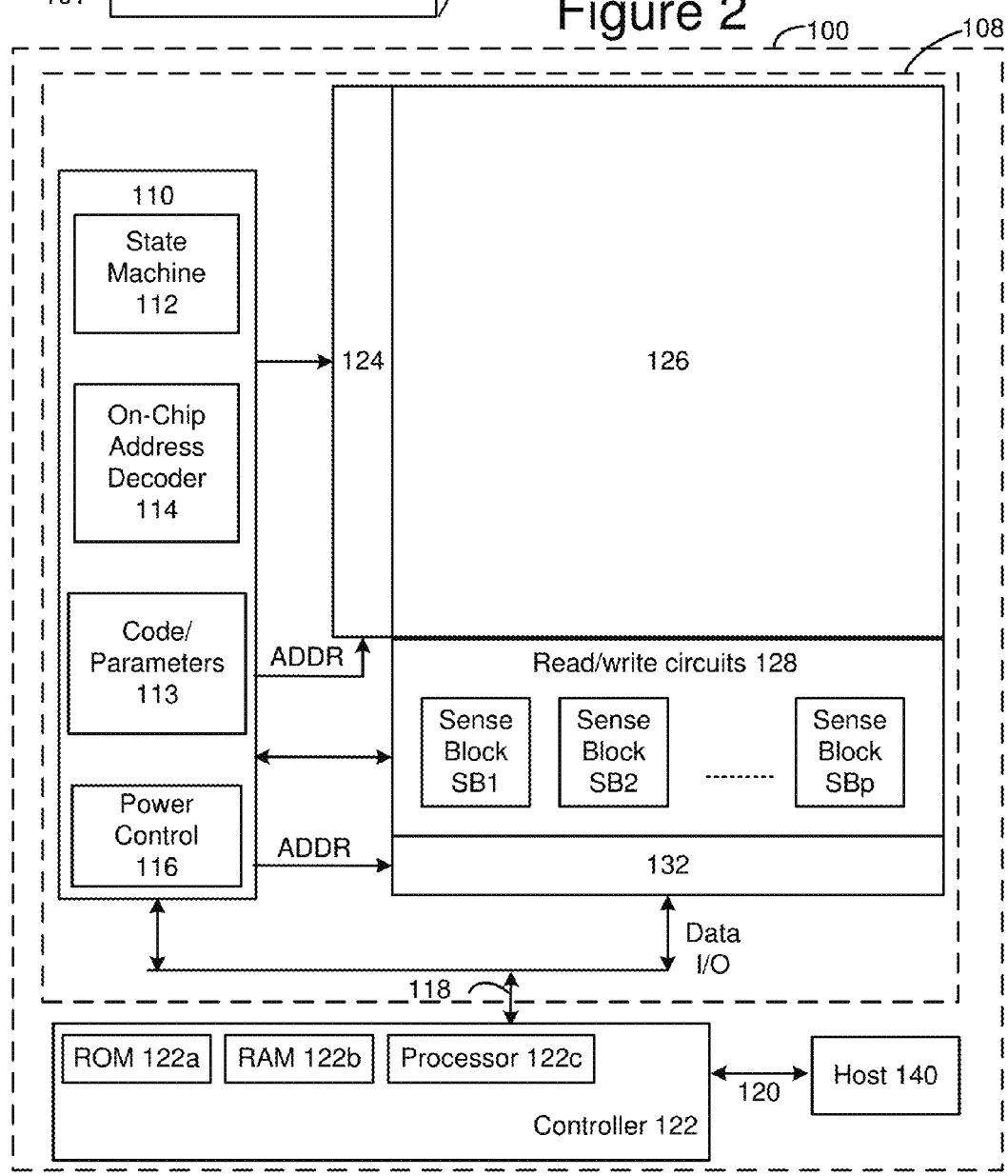
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered one or more control circuits that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

Figure 3A:
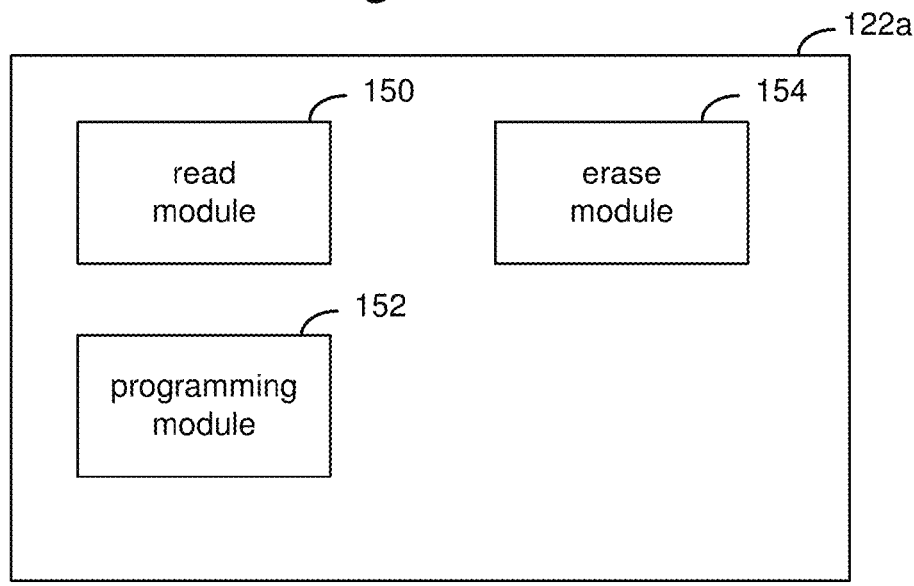
FIG. 3A is a block diagram depicting software modules for programming one or more processors in a Controller.

FIG. 3A is a block diagram depicting software modules for programming one or more processors in controller 122. FIG. 3A depicts read module 150, programming module 152, and erase module 154 being stored in ROM 122a. These software modules can also be stored in RAM or memory die 108. Read module 150 includes software that programs processor(s) 122C to perform read operations. Programming module 152 includes software that programs processor(s) 122C to perform programming operations (including verification of programming). Erase module 154 includes software that programs processor(s) 122C to perform erase operations. Based on the software, controller 122 instructs memory die 108 to perform memory operations.

Figure 3B:
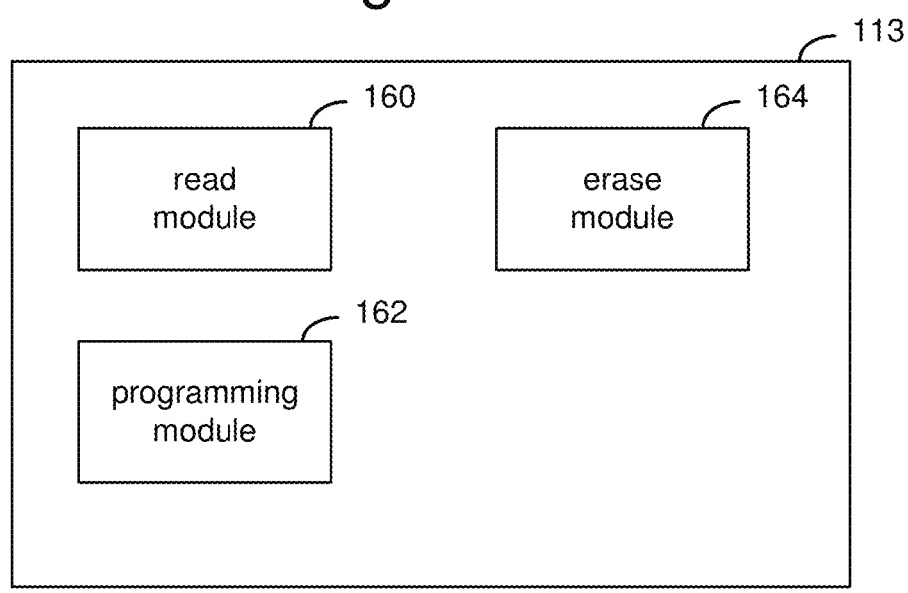
FIG. 3B is a block diagram depicting software modules for programming a state machine or other processor on a memory die.

FIG. 3B is a block diagram depicting software modules for programming state machine 112 (or other processor on memory die 108). FIG. 3B depicts read module 160, programming module 162, and erase module 164 being stored in code and parameter storage 113. These software modules can also be stored in RAM or in memory structure 126. Read module 160 includes software that programs state machine 112 to perform read operations. Programming module 152 includes software that programs state machine 112 to perform programming operations (including verification of programming). Erase module 154 includes software that programs state machine 112 to perform erase operations. Alternatively, state machine 112 (which is an electronic circuit) can be completely implemented with hardware so that no software is needed to perform these functions.

Figure 4A:
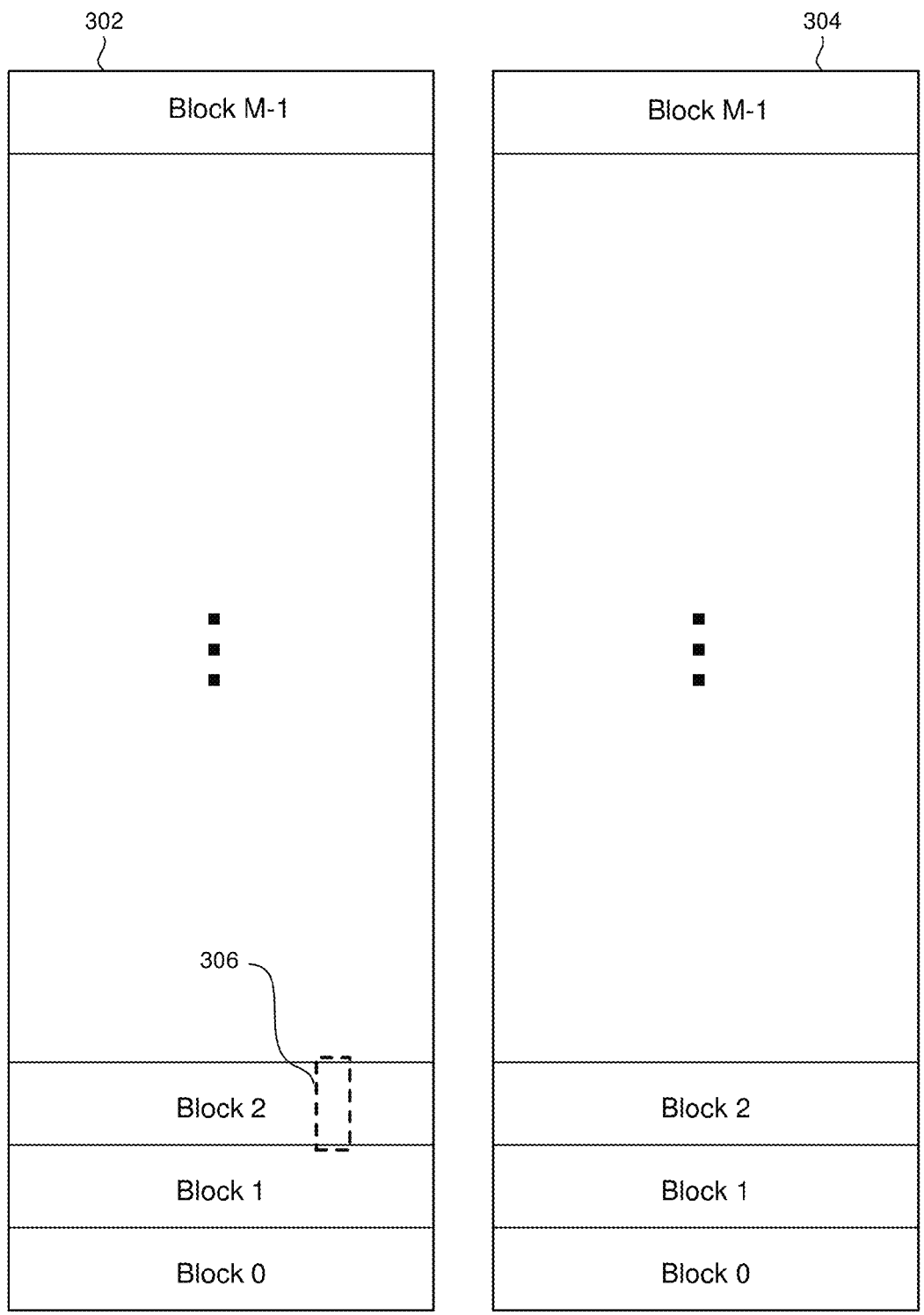
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4B:
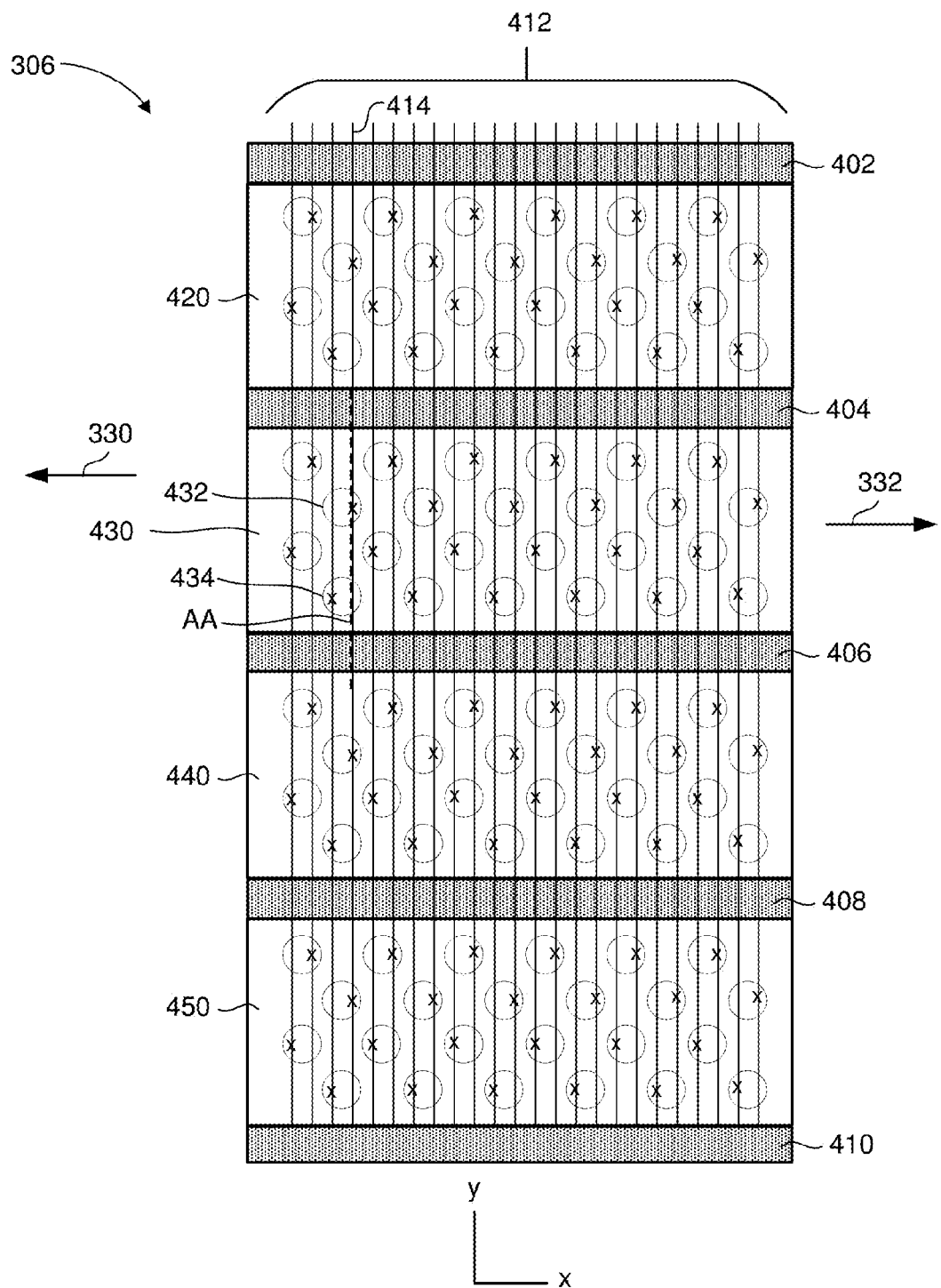
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 48 layers. Other embodiments have less than or more than 48 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
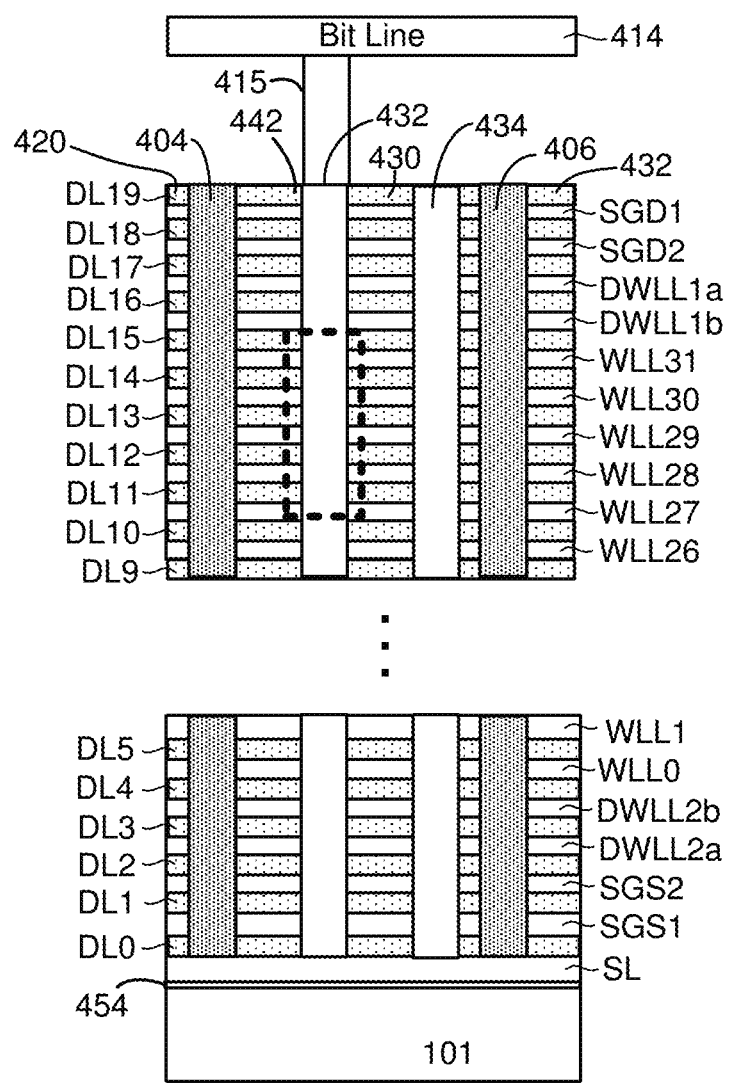
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed. Drain side select layers SGD1 and SGD1 are used to electrically connect and disconnect NAND strings from bit lines. Source side select layers SGS1 and SGS2 are used to electrically connect and disconnect NAND strings from the source line SL.

FIG. 4D depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4C. As mentioned above with respect to FIG. 4B, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 4E:
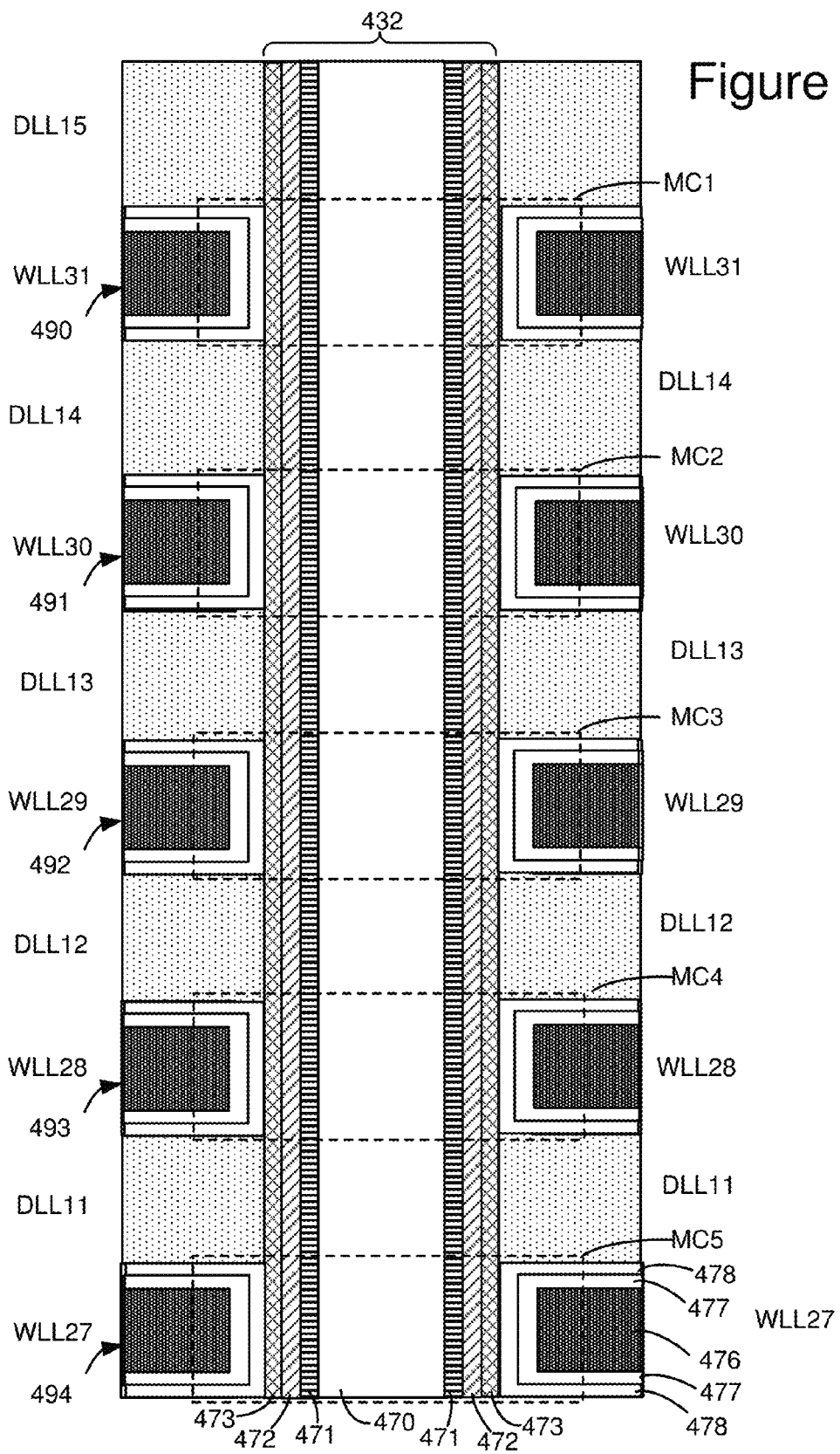
FIG. 4E is a cross sectional view of a vertical column of memory cells.

FIG. 4E depicts a cross sectional view of region 442 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel or holes recombine with electrons.

Figure 5:
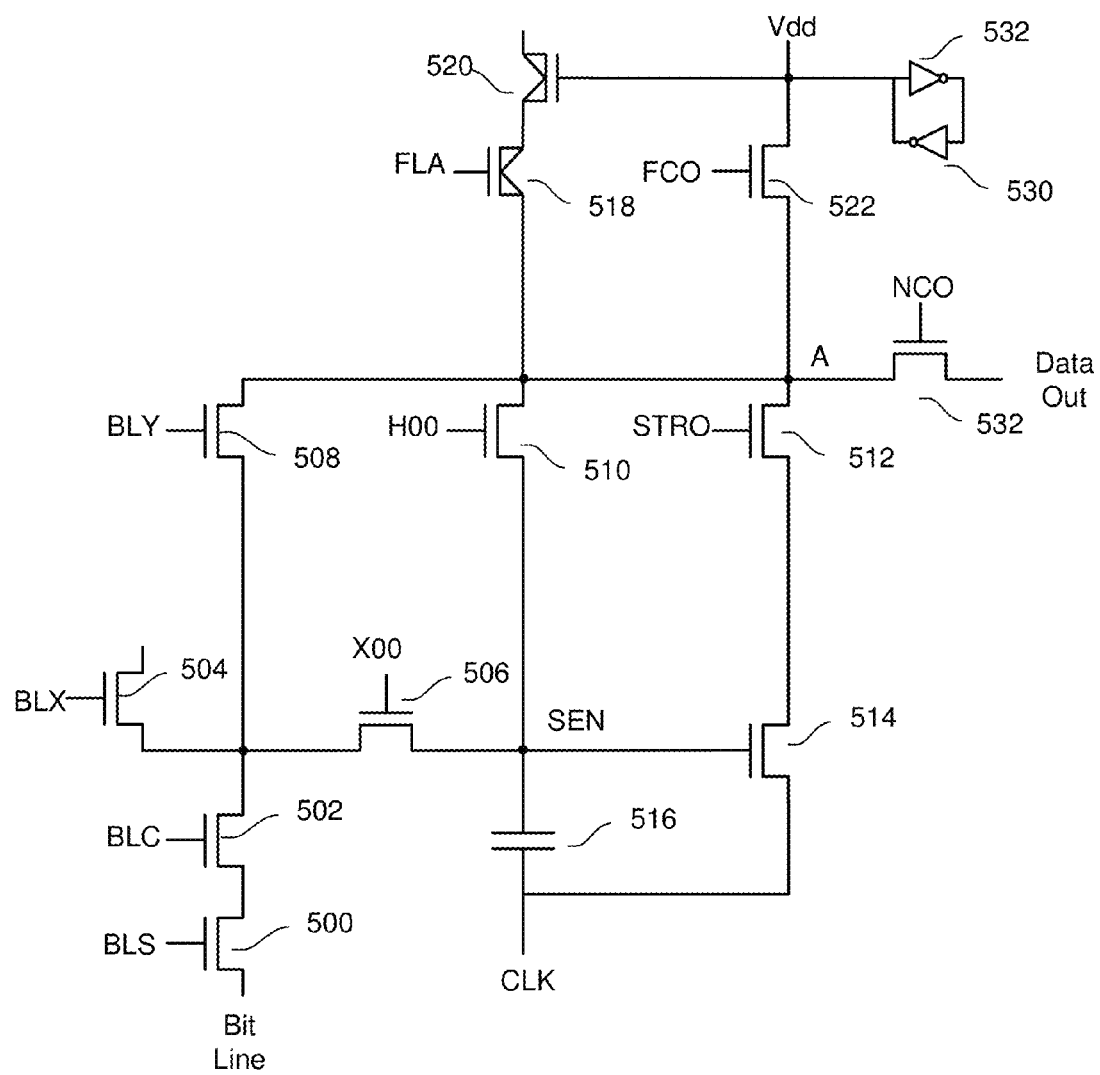
FIG. 5 is a schematic diagram of a sense amplifier.

FIG. 5 is a schematic diagram depicting a sense amplifier circuit. Each sense block SB1, SB2, . . . , SBp (see FIG. 2) would include multiple sense amplifier circuits. As described below, the circuit of FIG. 4 will pre-charge a capacitor (or other charge storage device) to a pre-charge magnitude, discharge the capacitor through the memory cell for a strobe time, and sense voltage at the capacitor after the strobe time. The sense voltage will be indicative of whether the memory cells conducted the current being sensed for, which is indicative of whether the threshold voltage of the memory cell is greater than or less than threshold voltage being tested for (corresponding to the control gate voltage). If the threshold voltage of the memory cell is greater than the threshold voltage being tested, then, during a verify operation, the memory cell will complete programming, as appropriate based on the processes described herein. FIG. 5 shows transistor 500 connected to the Bit Line and transistor 502. Transistor 500 receives the signal BLS at its gate, and is used to connect to or isolate the Bit Line. Transistor 502 receives the signal BLC at its gate, and is used as a voltage clamp. The gate voltage BLC is biased at a constant voltage equal to the desired Bit Line voltage plus the threshold voltage of transistor 502. The function of transistor 502, therefore, is to maintain a constant Bit Line voltage during a sensing operation (during read or verify), even if the current through the Bit Line changes.

Transistor 502 is connected to transistors 504, 506 and 508. Transistor 506 is connected to capacitor 516 at the node marked SEN. The purpose of transistor 506 is to connect capacitor 516 to Bit Line 500 and disconnect capacitor 516 from Bit Line 500 so that capacitor 516 is in selective communication with Bit Line 500. In other words, transistor 506 regulates the strobe time. That is, while transistor 506 is turned on capacitor 516 can discharge through the Bit Line, and when transistor 506 is turned off capacitor 516 cannot discharge through the Bit Line.

The node at which transistor 506 connects to capacitor 516 is also connected to transistor 510 and transistor 514. Transistor 510 is connected to transistors 508, 512 and 518. Transistor 518 is also connected to transistor 520. Transistors 518 and 520 are PMOS transistors while the other transistors of FIG. 5 are NMOS transistors. Transistors 510, 518, and 520 provide a pre-charging path to capacitor 516. A voltage (e.g. Vdd or other voltage) is applied to the source of transistor 520. By appropriately biasing transistors 510, 518 and 520, the voltage applied to the source of transistor 520 can be used to pre-charge capacitor 516. After pre-charging, capacitor 516 can discharge through the Bit Line via transistor 506 (assuming that transistors 500 and 502 are conducting).

The circuit of FIG. 5 includes inverters 530 and 532 forming a latch circuit. The output of inverter 532 is connected to the input of inverter 530 and the output of inverter 530 is connected to the input of inverter 532 as well as transistors 520 and 522. The input of inverter 532 will receive Vdd and the two inverters 530, 532 will act as a latch to store Vdd. The input of inverter 532 can also be connected to another value. Transistors 512 and 522 provide a path for communicating the data stored by inverters 530 and 532 to transistor 514. Transistor 522 receives the signal FCO at its gate. Transistor 512 receives the signal STRO at its gate. By raising or lowering FCO and STRO, a path is provided or cut off between the inverters 530, 532 and transistor (sensing switch) 514. The gate of transistor 514 is connected capacitor 516, transistor 506 and transistor 510 at the node marked SEN. The other end of capacitor 516 is connected to the signal CLK.

As discussed above, capacitor 516 is pre-charged via transistors 510, 518 and 520. This will raise the voltage at the SEN node to a pre-charge voltage level (Vpre). When transistor 506 turns on, capacitor 516 can discharge its charge through the Bit Line and the selected memory cell if the threshold voltage of the memory cell is below the voltage level being tested for. If the capacitor 516 is able to discharge, then the voltage at the capacitor (at the SEN node) will decrease.

The pre-charge voltage (Vpre) at the SEN node is greater than the threshold voltage of transistor 914; therefore, prior to the strobe time, transistor 514 is on (conducting). Since transistor 514 is on during the strobe time, then transistor 512 should be off. If the capacitor does not discharge during the strobe time, then the voltage at the SEN node will remain above the threshold voltage of transistor 514 and the charge at the inverters 530, 532 can be discharged into the CLK signal when STRO turns on transistor 512. If the capacitor discharges sufficiently during the strobe time, then the voltage at the SEN node will decrease below the threshold voltage of transistor 514; thereby, turning off transistor 914 and the data (e.g., Vdd) stored at inverters 530, 532 from being discharged through CLK. So testing whether the diodes 530, 532 maintain their charge or discharge will indicate the result of the verification process. In one embodiment, the result can be read at node A via transistor 534 (Data Out) by turning on transistor 534 gate signal NCO.

The pre-charge level of capacitor 516 (and, thus, the pre-charge voltage at node SEN) is limited by the current passing through transistor 510. The current that passes through transistor 510 is limited by the gate voltage H00. As such, the pre-charge voltage at node SEN is limited by the voltage H00 less the threshold voltage of transistor 510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read or verify operation (both are sense operations), the voltage applied to the control gate of the cell may cause the channel (connected to the bit line) of the cell to conduct. If this happens, a capacitor is discharged through the channel, lowering in voltage as it discharges.

FIG. 6 is a timing diagram describing the behavior of various signals from FIG. 5. The signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 502. The signal FLA starts at Vss at t0 and goes to Vdd at t6. When the signal FLA is at Vss, the pre-charging path is regulated by transistor 510. At t0, the voltage of H00 is raised from ground to a pre-charge level. The raising of the voltage at H00 turns on transistor 510 and opens up the pre-charge path. The magnitude of the voltage at H00 is set. FIG. 6 shows H00 going to Vhoo. The signal H00 will stay at the pre-charge voltage (Vhoo) until time t1. While H00 is high, transistor 510 turns on and capacitor 516 will pre-charge between t0 and t1, as depicted by the voltage at SEN. At time t1, H00 is brought down to Vss and the pre-charging is completed.

The signal X00 is used to allow capacitor 516 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, known as the strobe time, capacitor 516 will be in communication with the Bit Line in order to allow it to discharge through the Bit Line and the selected memory cell (depending on the threshold voltage of the selected memory cell). The signal CLK is raised to Vblx at time t2 and lowered back down to Vss at time t5 to prevent any fighting conditions in the circuit and to allow proper discharge of capacitor 516.

As discussed above, because H00 is raised between t0 and t1, capacitor 516 (and SEN node) will charge up between t0 and t1 (the pre-charge). This is depicted in FIG. 6 with the SEN node charging from Vss to Vpre. The solid line for Vpre represents an example pre-charging of the node SEN (and capacitor 516) in response to Vh00 being applied to the gate of transistor 510.

When X00 is raised up at t3, capacitor 516 can initially pre-charge the bit line and then discharge through the Bit Line (if the threshold voltage is at the appropriate level). As depicted in FIG. 6 between t3 and t4, the voltage at the SEN node can will dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 516 will not discharge and the voltage will remain at Vpre. The period between t3 and t4 is the strobe time and can be adjusted, as described above.

FIG. 6 shows that the signal FCO is raised to Vdd at t7 and lowered to Vss at T9. The signal STRO is raised to Vdd at t8 and lowered at t9. Between times t8 and t9, there is a path between the inverters 530, 532 and transistor 514. If the voltage at the node SEN is greater than the threshold voltage of transistor 514, then there will be a path from the inverters 530, 532 to CLK and the data at the inverters 530, 532 will dissipate through the signal CLK and through the transistor 514. If the voltage at the node SEN is lower than threshold voltage of transistor 514 (e.g. if the capacitor discharged), then transistor 514 will turn off and the voltage stored by the inverters 530, 532 will not dissipate into CLK. FIG. 6 shows the voltage level at node A at Vdd. If the voltage of the capacitor does not dissipate (e.g., due to not enough current flowing because the threshold voltage of the selected memory cell is greater than the voltage being tested for), then transistor 514 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 514 will turn off and the voltage at node A will remain at Vdd (as depicted by the solid line). The output of node A is provided to the Data Out signal via transistor 534 by applying Vdd to the signal NCO.

FIG. 7 is a flow chart describing a single strobe sensing operation performed according to the timing diagram of FIG. 6. In step 702, the appropriate verify reference voltage (e.g., Vv, Vv1, Vv2, Vv3, Vv4, Vv5, Vv6, or Vv7—see FIG. 8A) is applied is applied to the selected word line. The selected word line is connected to the memory cells being programmed and verified. The bit lines connected to the memory cells being programmed and verified are charged to a pre-determined pre-charge level. In step 704, all of the SEN nodes are pre-charged. In step 706, the bit lines are allowed to discharge, for example, by discharging the capacitor 516 (see t5-t6 of FIG. 6). After a predetermined time period, referred to as the "strobe time" or "integration time" the voltage of the capacitor 516 (or the SEN node) is sampled as described above to see whether the respective memory cell(s) conducted in step 708. As described above, the verification process is performed simultaneously for thousands of memory cells connected to the same word line and different bit lines.

Figure 8A:
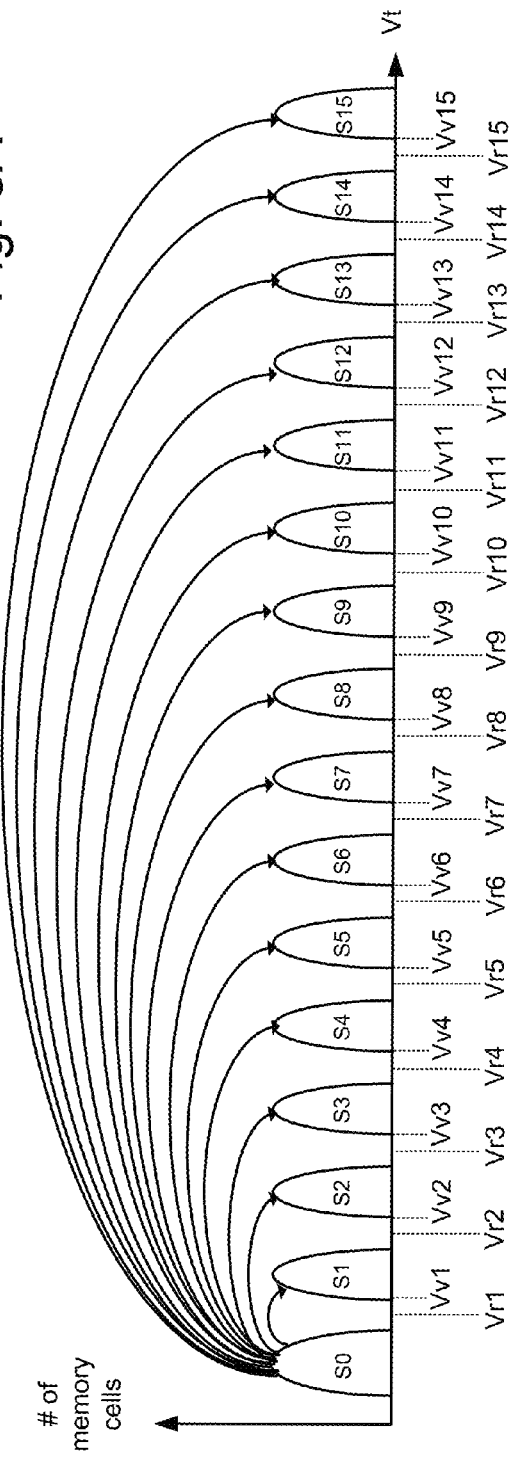
FIGS. 8A and 8B depict threshold voltage distributions.

At the end of a successful programming process (with verification), the threshold voltages of the memory cells should be within one or more distributions of threshold voltages for programmed memory cells or within a distribution of threshold voltages for erased memory cells, as appropriate. FIG. 8A illustrates example threshold voltage distributions for the memory cell array when each memory cell stores four bits of data. Other embodiments, however, may use other data capacities per memory cell (e.g., such as one, two, three, or five bits of data per memory cell). FIG. 8A shows sixteen threshold voltage distributions (corresponding to sixteen data states). The first threshold voltage distribution (data state) S0 represents memory cells that are erased. The other fifteen threshold voltage distributions (data states) S1-S15 represent memory cells that are programmed. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. Note that state N−1 is an adjacent lower data state for state N; for example, state 7 is an adjacent lower data state for state 8.

FIG. 8A also shows fifteen read reference voltages, Vr1, Vr2, Vr3, Vr4, Vr5, Vr6, Vr7, Vr8, Vr9, Vr10, Vr11, Vr12, Vr13, Vr14 and Vr15, for reading data from memory cells. By testing whether the threshold voltage of a given memory cell is above or below the fifteen read reference voltages, the system can determine what data state (i.e., S0, S1, S2, S3, . . . ) the memory cell is in.

FIG. 8A also shows fifteen verify reference voltages, Vv1, Vv2, Vv3, Vv4, Vv5, Vv6, Vv7, Vv8, Vv9, Vv10, Vv11, Vv12, Vv13, Vv14 and Vv15. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7. When programming memory cells to data state S8, the system will test whether those memory cells have a threshold voltage greater than or equal to Vv8. When programming memory cells to data state S9, the system will test whether those memory cells have a threshold voltage greater than or equal to Vv9. When programming memory cells to data state S10, the system will test whether those memory cells have a threshold voltage greater than or equal to Vv10. When programming memory cells to data state S11, the system will test whether those memory cells have a threshold voltage greater than or equal to Vv11. When programming memory cells to data state S12, the system will test whether those memory cells have a threshold voltage greater than or equal to Vv12. When programming memory cells to data state S13, the system will test whether those memory cells have a threshold voltage greater than or equal to Vv13. When programming memory cells to data state S14, the system will test whether those memory cells have a threshold voltage greater than or equal to Vv14. When programming memory cells to data state S15, the system will test whether those memory cells have a threshold voltage greater than or equal to Vv15.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S9, S10, S11, S12, S13, S14 and/or S15. For example, while some memory cells are being programmed from data state S0 to data state S1, other memory cells are being programmed from data state S0 to data state S2 and/or from data state S0 to data state S3, and so on. The arrows of FIG. 8A represent the full sequence programming.

Figure 8B:
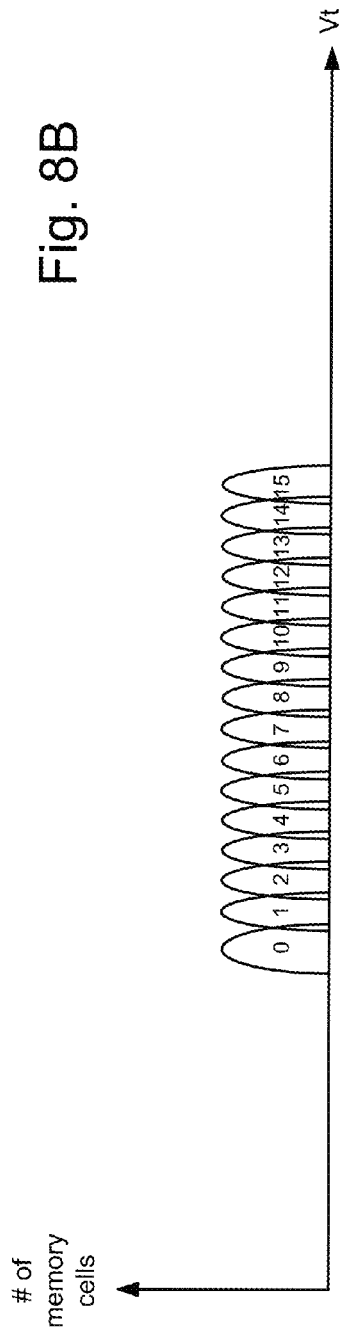

FIG. 8B illustrates that another embodiment of threshold voltage distributions corresponding to data states S0-S15 that can partially overlap since the error correction can handle a certain percentage of memory cells that are in error. Because of the size of the drawing, the references to the data states have been truncated such that 0 is used rather than S0, 1 is used rather than S1, 2 is used rather than S2, and so on.

FIGS. 9A-D describe a three stage programming process for programming data into memory cells that store four bits of data. Prior to programming, all of the memory cells for a block will be erased into an erased threshold voltage distribution. For example, FIG. 9A shows a block of memory cells starting in an erased threshold voltage distribution E (depicted with a dotted line). In some embodiments, erased threshold voltage E is below zero volts. In other embodiments, erased threshold voltage distribution E is above zero volts, or partially above zero volts.

In this embodiment, the programming process includes three phases. During the first phase of programming, those memory cells whose targets (due to the data to be stored in those memory cells) are data states S4, S5, S6 or S7 are programmed to an intermediate state IM0. Those memory cells whose targets are data states S8, S9, S10 or S11 are programmed to an intermediate state IM1. Those memory cells whose targets are data states S12, S13, S14 or S15 are programmed to an intermediate state IM2. Those memory cells are targeted for data states S0, S1, S2 or S3 and remain in the erased threshold voltage distribution E. The first phase is graphically depicted by FIG. 9A.

During the second phase of the programming process of FIGS. 9A-C, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM0 to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. Memory cells are also programmed from the intermediate state IM1 to various data states S8-S11. For example, those memory cells to be programmed to data state S11 are programmed from the intermediate state IM1 to data state S11, those memory cells targeted to be in data state S10 are programmed from intermediate state IM1 to data state S10, those memory cells to be programmed to data state S9 are programmed from intermediate state IM1 to data state S9, and those memory cells to be programmed to data state S8 are programmed from intermediate state IM1 to data state S8. Memory cells are also programmed from the intermediate state IM2 to various data states S12-S15. For example, those memory cells to be programmed to data state S15 are programmed from the intermediate state IM2 to data state S15, those memory cells targeted to be in data state S14 are programmed from intermediate state IM2 to data state S14, those memory cells to be programmed to data state S13 are programmed from intermediate state IM2 to data state S13, and those memory cells to be programmed to data state S12 are programmed from intermediate state IM2 to data state S12. This second phase of programming is illustrated in FIG. 9B.

As can be seen in FIG. 9B, at the end of the second phase of programming data states S1-S15 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7, and so on. In some embodiments, all or some of the data states do not overlap.

In the third phase of programming, each of data states S1-S15 are tightened so that they no longer overlap with neighboring states. This is depicted graphically by FIG. 9C. In some embodiments, data state S0 is wider than data states S1-S15.

Figure 10:
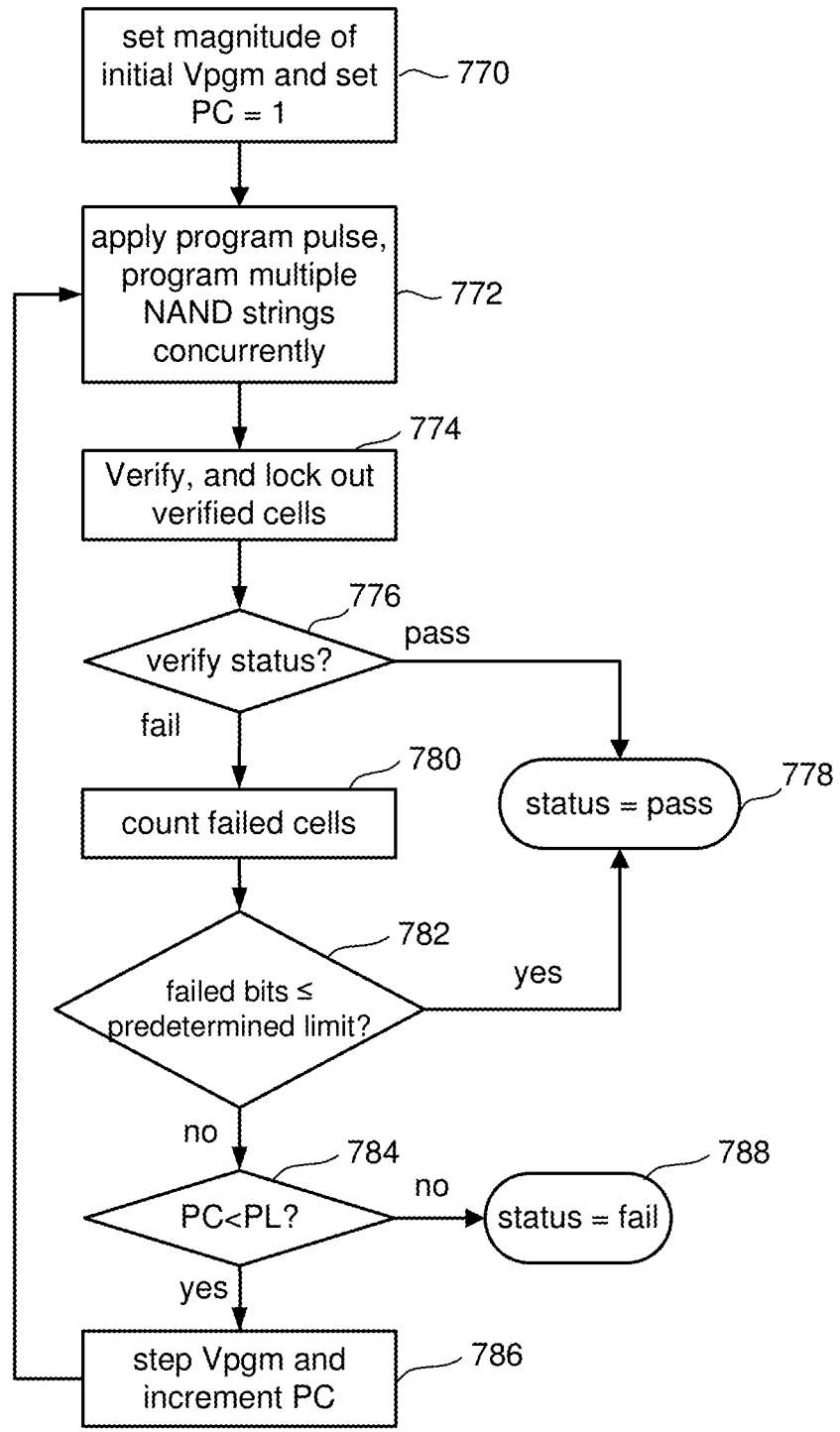
FIG. 10 is a flow chart describing one embodiment of a process for programming.

FIG. 10 is a flow chart describing one embodiment of a process for performing programming on memory cells connected to a common word line to one or more targets (e.g., data states or threshold voltage ranges). The process of FIG. 10 can be performed one or multiple times to program data to a set of memory cells. For example, the process of FIG. 10 can be used to program memory cells from S0 to any of S1-S15 in the full sequence programming of FIG. 8A. The process of FIG. 10 can be used to program memory cells for any of the three phases of FIGS. 9A-C.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 770 of FIG. 10, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of target levels to perform one or more verify operations. In one embodiment, the verification process is performed by applying the testing whether the threshold voltages of the memory cells selected for programming have reached the appropriate verify reference voltage (Vv1, Vv2, Vv3, Vv4, Vv5, Vv6, and Vv7).

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

One programming strategy for achieving tight threshold distributions without unreasonably slowing down the programming process is to use a coarse/fine programming operation. The coarse programming includes attempts to raise the threshold voltage in a faster manner, paying relatively less attention to achieving a tight threshold distribution. The fine programming attempts to raise the threshold voltage in a slower manner in order to reach the target threshold voltage while also achieving a tighter threshold distribution.

Figure 11A:
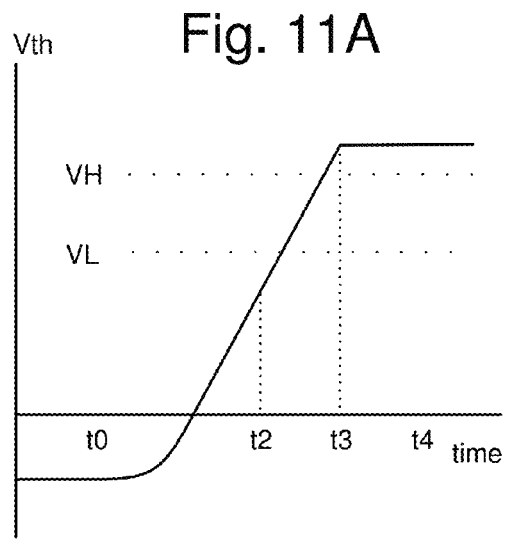
FIGS. 11A, 11B, 12A and 12B are graphs that describe one embodiment of coarse/fine programming.
Figure 12A:
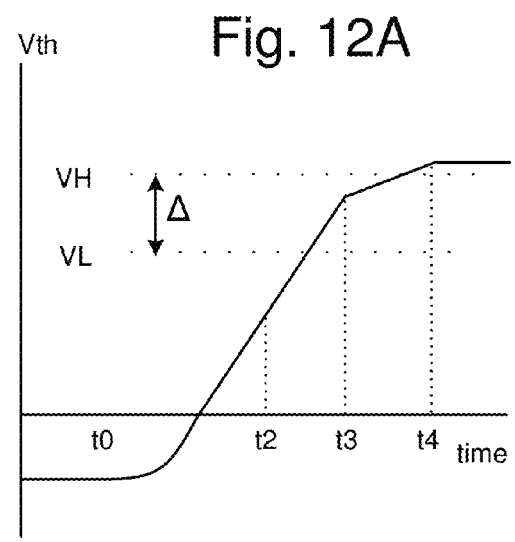
Figure 11B:
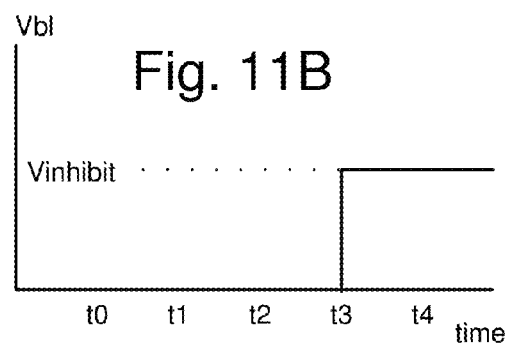
Figure 12B:
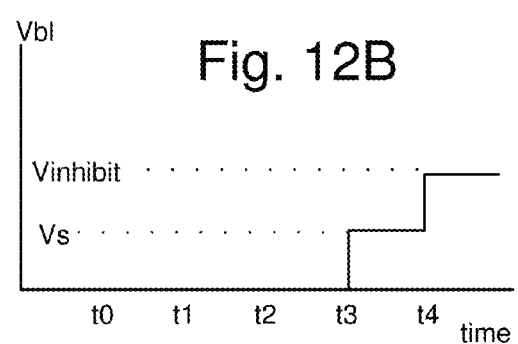

FIGS. 11A, 11B, 12A and 13B provide more details of one example of a coarse/fine programming methodology. FIGS. 11A and 12A depict the threshold voltage of the memory cells being programmed. FIGS. 11B and 11B depict the bit line voltages for the memory cells being programmed. This example of FIGS. 11A, 11B, 12A and 12B uses two verify levels, indicated in the Figures as VH and VL. The final target level is VH (also referred to as a fine verify level or a high verify level for a data state). When a threshold voltage of the memory cell has reached VH, the memory cell will be inhibited from further programming by applying an inhibit voltage to the bit line corresponding to that memory cell. For example, the bit line voltage (or control gate or word line voltage—in some embodiments) can be raised to Vinhibit (e.g., Vdd) or similar voltage (See FIG. 11B and FIG. 12B). However, when a memory cell has reached a threshold voltage close to (but lower than) the target value VH, the threshold voltage shift for the memory cell during subsequent programming pulses is slowed down by applying a certain bias voltage to the bit line, typically in the order of 0.3 v to 1.2 v. Because the rate of threshold voltage shift is reduced during the next few programming pulses, the final threshold voltage distribution can be narrower than with other programming methods. To implement this method, a second verify level that is lower than that of VH is used. This second verify level is depicted in 11A and 12A as VL (can also be referred to as the coarse verify level), with VH>VL. When the threshold voltage of the memory cell is larger than VL, but still lower than VH, the threshold voltage shift to the memory cell will be reduced for subsequent programming pulses by applying a bit line bias Vs (FIG. 12B). Note that in this case, two verify operations are required for each state. One verify operation at the corresponding VH for each state, and one verify operation at the corresponding VL for each state.

FIGS. 11A and 11B show the behavior of a memory cell whose threshold voltage moves past VH and VL in one programming pulse at t2. For example, the threshold voltage is depicted in FIG. 11A to pass VH and VL in between t2 and t3. Thus, prior to t3, the memory cell is in the coarse phase. After t3, the memory cell is in the inhibit mode.

FIGS. 12A and 12B depict a memory cell that enters both the coarse and fine programming phases. The threshold voltage of the memory cell crosses VL in between time t2 and time t3 (e.g., from a programming pulse applies starting at t2). Prior to t3, the memory cell is in the coarse phase. After t3, the bit line voltage is raised to Vs; therefore, the memory cell is in the fine phase. In between t3 and t4, the threshold voltage of the memory cell crosses VH; therefore, the memory cell is inhibited from further programming by raising the bit line voltage to Vinhibit at t4. If the coarse/fine programming scheme was not being used, the threshold voltage of the memory cells could exceed VH by a margin much more than depicted in FIG. 12A.

Figure 13:
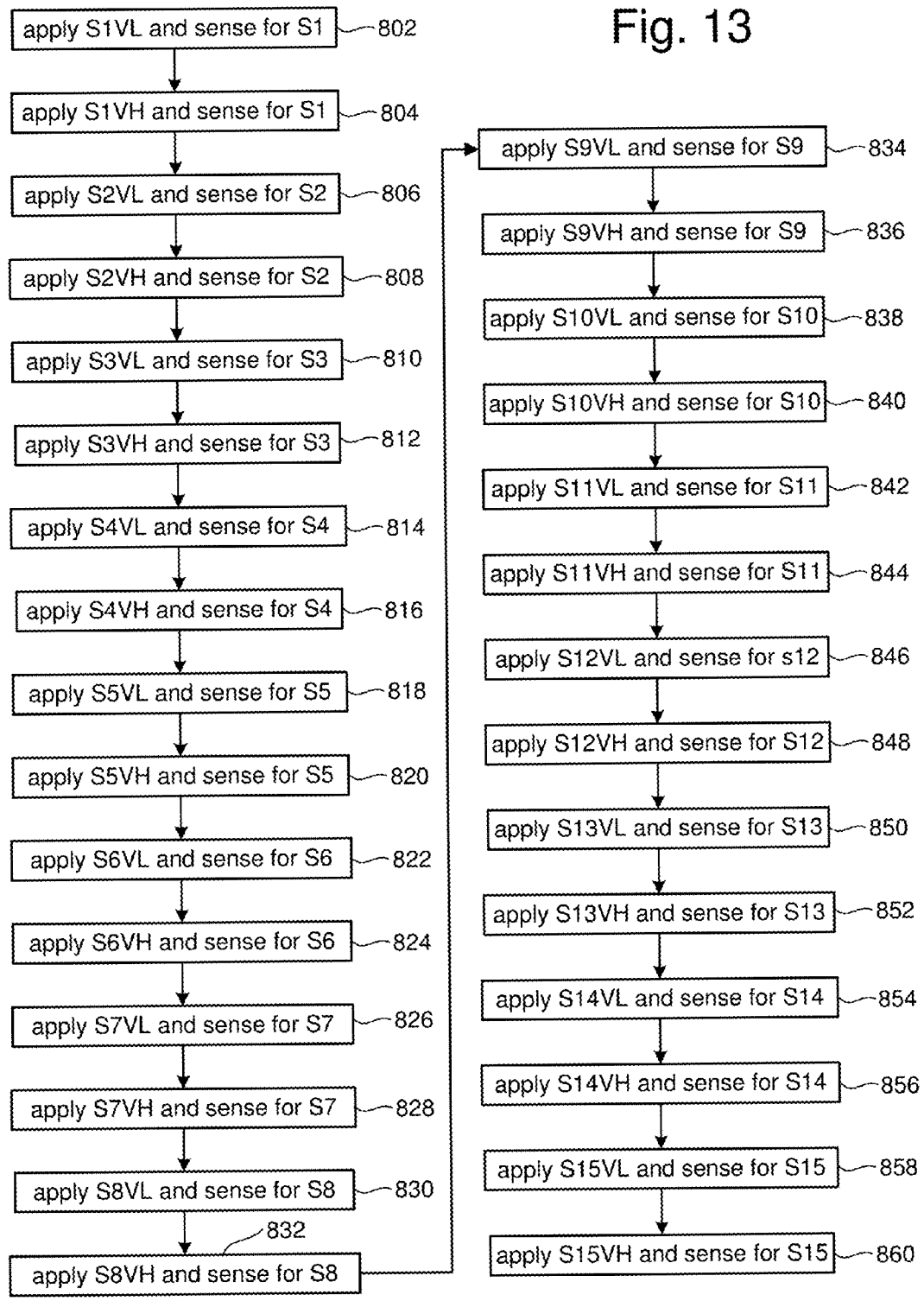
FIG. 13 is a flow chart describing one embodiment of a process for verifying programming.

Note that in the coarse/fine programming of FIGS. 11A/B and 12A/B, two verify operations are required for each data state. One verify operation at the corresponding VH for each state, and one verify operation at the corresponding VL for each data state. For a system that uses sixteen data states to store four bits of data in each memory cell, the process for verifying (step 774 of FIG. 10) would require thirty verify operations. This is depicted in FIG. 13, which is a flow chart describing one embodiment of a process for verifying. The process of FIG. 13 is performed for each iteration of step 774 of FIG. 10. In step 802 of FIG. 13, S1VL is applied to the selected word line. The voltage S1VL is the lower verify level VL (also called the coarse verify level) for state S1. The system will sense for the coarse verification for state S1 using the circuit of FIG. 4 and the processes of FIGS. 6 and 7. In step 804 of FIG. 13, S1VH is applied to the selected word line. The voltage S1VH is the higher verify level VH (also called the fine verify level) for state 1. The system will sense for the fine verification for state S1 using the circuit of FIG. 4 and the processes of FIGS. 6 and 7.

In step 806, S2VL is applied to the selected word line. The voltage S2VL is the lower verify level VL (also called the coarse verify level) for state S2. The system will sense for the coarse verification for state S2. In step 808, S2VH is applied to the selected word line. The voltage S2VH is the higher verify level VH (also called the fine verify level) for state S2. The system will sense for the fine verification for state S2.

In step 810, S2VL is applied to the selected word line. The voltage S3VL is the lower verify level VL (also called the coarse verify level) for state S3. The system will sense for the coarse verification for state S3. In step 812, S3VH is applied to the selected word line. The voltage S3VH is the higher verify level VH (also called the fine verify level) for state S3. The system will sense for the fine verification for state S3.

In step 814, S4VL is applied to the selected word line. The voltage S4VL is the lower verify level VL (also called the coarse verify level) for state S4. The system will sense for the coarse verification for state S4. In step 816, S4VH is applied to the selected word line. The voltage S4VH is the higher verify level VH (also called the fine verify level) for state S4. The system will sense for the fine verification for state S4.

In step 818, S5VL is applied to the selected word line. The voltage S5VL is the lower verify level VL (also called the coarse verify level) for state S5. The system will sense for the coarse verification for state S5. In step 820, S5VH is applied to the selected word line. The voltage S5VH is the higher verify level VH (also called the fine verify level) for state S5. The system will sense for the fine verification for state S5.

In step 822 S6VL is applied to the selected word line. The voltage S6VL is the lower verify level VL (also called the coarse verify level) for state S6. The system will sense for the coarse verification for state S6. In step 824, S6VH is applied to the selected word line. The voltage S6VH is the higher verify level VH (also called the fine verify level) for state S6. The system will sense for the fine verification for state S6.

In step 826, S7VL is applied to the selected word line. The voltage S7VL is the lower verify level VL (also called the coarse verify level) for state S7. The system will sense for the coarse verification for state S7. In step 828, S7VH is applied to the selected word line. The voltage S7VH is the higher verify level VH (also called the fine verify level) for state S7. The system will sense for the fine verification for state S7.

In step 830, S8VL is applied to the selected word line. The voltage S8VL is the lower verify level VL (also called the coarse verify level) for state S8. The system will sense for the coarse verification for state S8. In step 832, S8VH is applied to the selected word line. The voltage S8VH is the higher verify level VH (also called the fine verify level) for state S8. The system will sense for the fine verification for state S8.

In step 834, S9VL is applied to the selected word line. The voltage S9VL is the lower verify level VL (also called the coarse verify level) for state S9. The system will sense for the coarse verification for state S9. In step 836, S9VH is applied to the selected word line. The voltage S9VH is the higher verify level VH (also called the fine verify level) for state S9. The system will sense for the fine verification for state S9.

In step 838, S10VL is applied to the selected word line. The voltage S10VL is the lower verify level VL (also called the coarse verify level) for state S10. The system will sense for the coarse verification for state S10. In step 840, S10VH is applied to the selected word line. The voltage S10VH is the higher verify level VH (also called the fine verify level) for state S10. The system will sense for the fine verification for state S10.

In step 842, S11VL is applied to the selected word line. The voltage S11VL is the lower verify level VL (also called the coarse verify level) for state S11. The system will sense for the coarse verification for state S11. In step 844, S11VH is applied to the selected word line. The voltage S11VH is the higher verify level VH (also called the fine verify level) for state S11. The system will sense for the fine verification for state S11.

In step 846, S12VL is applied to the selected word line. The voltage S12VL is the lower verify level VL (also called the coarse verify level) for state S12. The system will sense for the coarse verification for state S12. In step 848, S12VH is applied to the selected word line. The voltage S12VH is the higher verify level VH (also called the fine verify level) for state S12. The system will sense for the fine verification for state S12.

In step 850, S13VL is applied to the selected word line. The voltage S13VL is the lower verify level VL (also called the coarse verify level) for state S13. The system will sense for the coarse verification for state S13. In step 852, S13VH is applied to the selected word line. The voltage S13VH is the higher verify level VH (also called the fine verify level) for state S13. The system will sense for the fine verification for state S13.

In step 854, S14VL is applied to the selected word line. The voltage S14VL is the lower verify level VL (also called the coarse verify level) for state S14. The system will sense for the coarse verification for state S14. In step 856, S14VH is applied to the selected word line. The voltage S14VH is the higher verify level VH (also called the fine verify level) for state S14. The system will sense for the fine verification for state S14.

In step 858, S15VL is applied to the selected word line. The voltage S15VL is the lower verify level VL (also called the coarse verify level) for state S15. The system will sense for the coarse verification for state S15. In step 860, S15VH is applied to the selected word line. The voltage S15VH is the higher verify level VH (also called the fine verify level) for state S15. The system will sense for the fine verification for state S15. In another embodiment, the coarse verify level for highest state S15 may be skipped. Since the upper-tail of highest state doesn't contribute to errors, a wider S15 may be acceptable.

In some embodiments, a subset of verify operations can be skipped in circumstances when the system knows that no memory cells being programmed have a threshold voltage in the range of certain data state. However, as can been seen, up to thirty verify operations are performed. Performing thirty verify operations can slow down the programming process.

FIG. 14 is a flow chart describing one embodiment of a process that reduces the time needed to verify programming for multi-state non-volatile memory. In step 890, programming is applied to one or more memory cells. As described above, in one embodiment, the memory cells are part of NAND strings in a three dimensional memory structure that includes multiple vertical levels of memory cells, and each of the memory cells being programmed are connected to a common word line and are on a common level of the three dimensional memory structure. In step 892, the programming of the memory cells is verified, including verifying programming of the memory cells for a first data state using a verify operation for a second data state. This process contemplates a verify operation be used to verify for more than one data state; therefore, less verify operations need to be performed. In one embodiment, step 890 and 892 are example implementations of steps 772 and 774 of FIG. 10.

FIG. 15 is a flow chart describing one embodiment of a process for verifying programming, and is one example implementation of step 892 of FIG. 14 for a system that is implementing coarse/fine programming. In one embodiment, the process of FIG. 15 is performed during each iteration of step 774 of FIG. 10. The verification process of FIG. 15 includes verifying programming of the memory cells for a first data state using a verify operation for a second data state. In the embodiment of FIG. 15, the VL for state N is set at the same voltage level as the VH for state N−1; therefore, two adjacent data states are sharing a verify level (state N−1 is an adjacent lower data state for state N). As a result, the number of different verify reference voltages is reduced from thirty down to sixteen and the number of verify operations is reduced from thirty down to sixteen. Note that each of the steps of FIG. 15 represent one verify operation performed using one word line voltage to perform verification for two data states.

In step 902, the voltage S1VL is applied to the selected word line. Note that the selected word line is the word line connected to the plurality of memory cells being concurrently programmed and verified. While S1VL is applied to the selected word line (and, therefore, applied to the control gates of the memory cells being verified), the sense amplifier (discussed above) is used to sense whether the threshold voltages of the memory cells connected to the selected word line are above or below S1VL. Those memory cells whose threshold voltage is below S1VL will turn on. Those memory cells whose threshold voltage is above S1VL will turn remain off. In step 902, only state S1 is being verified.

In step 904, the voltage S1VH is applied to the selected word line. While S1VH is applied to the selected word line (and, therefore, applied to the control gates of the memory cells being verified), the sense amplifier (discussed above) is used to sense whether the threshold voltages of a first subset of the memory cells connected to the selected word line are above or below S1VH and whether the threshold voltages of a second subset of the memory cells connected to the selected word line are above or below S2VL. This is done concurrently because in this embodiment, S1VH=S2VL. The first subset of the memory cells connected to the selected word line are those memory cells being programmed to data state S1 and the second subset of the memory cells connected to the selected word line are those memory cells being programmed to data state S2. The individual sense blocks (SB1, SB2, . . . ) know what state their respective memory cells are being programmed to because they store the programming data as part of the programming process. Therefore, as described above, in step 904 the system is performing verification operations for data states S1 and S2 using a word line voltage for state S1.

In step 906, the voltage S2VH is applied to the selected word line. While S2VH is applied to the selected word line (and, therefore, applied to the control gates of the memory cells being verified), the sense amplifier (discussed above) is used to sense whether the threshold voltages of a first subset of the memory cells connected to the selected word line are above or below S2VH and whether the threshold voltages of a second subset of the memory cells connected to the selected word line are above or below S3VL. This is done concurrently because in this embodiment, S2VH=S3VL. The first subset of the memory cells connected to the selected word line are those memory cells being programmed to data state S1 and the second subset of the memory cells connected to the selected word line are those memory cells being programmed to data state S3. The individual sense blocks (SB1, SB2, . . . ) know what state their respective memory cells are being programmed to because they store the programming data as part of the programming process. Therefore, as described above, in step 906 the system is performing verification operations for data states S2 and S3 using a word line voltage for state S2.

In step 908, the voltage S3VH is applied to the selected word line. While S3VH is applied to the selected word line (and, therefore, applied to the control gates of the memory cells being verified), the sense amplifier (discussed above) is used to sense whether the threshold voltages of a first subset of the memory cells connected to the selected word line are above or below S3VH and whether the threshold voltages of a second subset of the memory cells connected to the selected word line are above or below S4VL. This is done concurrently because in this embodiment, S3VH=S4VL. The first subset of the memory cells connected to the selected word line are those memory cells being programmed to data state S1 and the second subset of the memory cells connected to the selected word line are those memory cells being programmed to data state S4. The individual sense blocks (SB1, SB2, . . . ) know what state their respective memory cells are being programmed to because they store the programming data as part of the programming process. Therefore, as described above, in step 908 the system is performing verification operations for data states S3 and S4 using a word line voltage for data state S3.

In step 910, the voltage S4VH is applied to the selected word line. While S4VH is applied to the selected word line (and, therefore, applied to the control gates of the memory cells being verified), the sense amplifier (discussed above) is used to sense whether the threshold voltages of a first subset of the memory cells connected to the selected word line are above or below S4VH and whether the threshold voltages of a second subset of the memory cells connected to the selected word line are above or below S5VL. This is done concurrently because in this embodiment, S4VH=S5VL. The first subset of the memory cells connected to the selected word line are those memory cells being programmed to data state S1 and the second subset of the memory cells connected to the selected word line are those memory cells being programmed to data state S5. The individual sense blocks (SB1, SB2, . . . ) know what state their respective memory cells are being programmed to because they store the programming data as part of the programming process. Therefore, as described above, in step 910 the system is performing verification operations for data states S4 and S5 using a word line voltage for data state S4.

In step 912, the voltage S5VH is applied to the selected word line. While S5VH is applied to the selected word line (and, therefore, applied to the control gates of the memory cells being verified), the sense amplifier (discussed above) is used to sense whether the threshold voltages of a first subset of the memory cells connected to the selected word line are above or below S5VH and whether the threshold voltages of a second subset of the memory cells connected to the selected word line are above or below S6VL. This is done concurrently because in this embodiment, S5VH=S6VL. The first subset of the memory cells connected to the selected word line are those memory cells being programmed to data state S1 and the second subset of the memory cells connected to the selected word line are those memory cells being programmed to data state S6. The individual sense blocks (SB1, SB2, . . . ) know what state their respective memory cells are being programmed to because they store the programming data as part of the programming process. Therefore, as described above, in step 912 the system is performing verification operations for data states S5 and S6 using a word line voltage for data state S5.

In step 914, the voltage S6VH is applied to the selected word line. While S6VH is applied to the selected word line (and, therefore, applied to the control gates of the memory cells being verified), the sense amplifier (discussed above) is used to sense whether the threshold voltages of a first subset of the memory cells connected to the selected word line are above or below S6VH and whether the threshold voltages of a second subset of the memory cells connected to the selected word line are above or below S7VL. This is done concurrently because in this embodiment, S6VH=S7VL. The first subset of the memory cells connected to the selected word line are those memory cells being programmed to data state S6 and the second subset of the memory cells connected to the selected word line are those memory cells being programmed to data state S7. The individual sense blocks (SB1, SB2, . . . ) know what state their respective memory cells are being programmed to because they store the programming data as part of the programming process. Therefore, as described above, in step 914 the system is performing verification operations for data states S6 and S7 using a word line voltage for data state S6.

In step 916, the voltage S7VH is applied to the selected word line. While S7VH is applied to the selected word line (and, therefore, applied to the control gates of the memory cells being verified), the sense amplifier (discussed above) is used to sense whether the threshold voltages of a first subset of the memory cells connected to the selected word line are above or below S7VH and whether the threshold voltages of a second subset of the memory cells connected to the selected word line are above or below S8VL. This is done concurrently because in this embodiment, S7VH=S8VL. The first subset of the memory cells connected to the selected word line are those memory cells being programmed to data state S7 and the second subset of the memory cells connected to the selected word line are those memory cells being programmed to data state S8. The individual sense blocks (SB1, SB2, . . . ) know what state their respective memory cells are being programmed to because they store the programming data as part of the programming process. Therefore, as described above, in step 916 the system is performing verification operations for data states S7 and S8 using a word line voltage for data state S7.

In step 918, the voltage S8VH is applied to the selected word line. While S8VH is applied to the selected word line (and, therefore, applied to the control gates of the memory cells being verified), the sense amplifier (discussed above) is used to sense whether the threshold voltages of a first subset of the memory cells connected to the selected word line are above or below S8VH and whether the threshold voltages of a second subset of the memory cells connected to the selected word line are above or below S9VL. This is done concurrently because in this embodiment, S8VH=S9VL. The first subset of the memory cells connected to the selected word line are those memory cells being programmed to data state S8 and the second subset of the memory cells connected to the selected word line are those memory cells being programmed to data state S9. The individual sense blocks (SB1, SB2, . . . ) know what state their respective memory cells are being programmed to because they store the programming data as part of the programming process. Therefore, as described above, in step 918 the system is performing verification operations for data states S8 and S9 using a word line voltage for data state S8.

In step 920, the voltage S9VH is applied to the selected word line. While S9VH is applied to the selected word line (and, therefore, applied to the control gates of the memory cells being verified), the sense amplifier (discussed above) is used to sense whether the threshold voltages of a first subset of the memory cells connected to the selected word line are above or below S9VH and whether the threshold voltages of a second subset of the memory cells connected to the selected word line are above or below S10VL. This is done concurrently because in this embodiment, S9VH=S10VL. The first subset of the memory cells connected to the selected word line are those memory cells being programmed to data state S1 and the second subset of the memory cells connected to the selected word line are those memory cells being programmed to data state S10. The individual sense blocks (SB1, SB2, . . . ) know what state their respective memory cells are being programmed to because they store the programming data as part of the programming process. Therefore, as described above, in step 920 the system is performing verification operations for data states S9 and S10 using a word line voltage for data state S9.

In step 922, the voltage S10VH is applied to the selected word line. While S10VH is applied to the selected word line (and, therefore, applied to the control gates of the memory cells being verified), the sense amplifier (discussed above) is used to sense whether the threshold voltages of a first subset of the memory cells connected to the selected word line are above or below S10VH and whether the threshold voltages of a second subset of the memory cells connected to the selected word line are above or below S11VL. This is done concurrently because in this embodiment, S10VH=S11VL. The first subset of the memory cells connected to the selected word line are those memory cells being programmed to data state S1 and the second subset of the memory cells connected to the selected word line are those memory cells being programmed to data state S11. The individual sense blocks (SB1, SB2, . . . ) know what state their respective memory cells are being programmed to because they store the programming data as part of the programming process. Therefore, as described above, in step 922 the system is performing verification operations for data states S10 and S11 using a word line voltage for data state S10.

In step 924, the voltage S11VH is applied to the selected word line. While S11VH is applied to the selected word line (and, therefore, applied to the control gates of the memory cells being verified), the sense amplifier (discussed above) is used to sense whether the threshold voltages of a first subset of the memory cells connected to the selected word line are above or below S11VH and whether the threshold voltages of a second subset of the memory cells connected to the selected word line are above or below S12VL. This is done concurrently because in this embodiment, S11VH=S12VL. The first subset of the memory cells connected to the selected word line are those memory cells being programmed to data state S1 and the second subset of the memory cells connected to the selected word line are those memory cells being programmed to data state S12. The individual sense blocks (SB1, SB2, . . . ) know what state their respective memory cells are being programmed to because they store the programming data as part of the programming process. Therefore, as described above, in step 924 the system is performing verification operations for data states S11 and S12 using a word line voltage for data state S11.

In step 926, the voltage S12VH is applied to the selected word line. While S12VH is applied to the selected word line (and, therefore, applied to the control gates of the memory cells being verified), the sense amplifier (discussed above) is used to sense whether the threshold voltages of a first subset of the memory cells connected to the selected word line are above or below S12VH and whether the threshold voltages of a second subset of the memory cells connected to the selected word line are above or below S13VL. This is done concurrently because in this embodiment, S12VH=S13VL. The first subset of the memory cells connected to the selected word line are those memory cells being programmed to data state S1 and the second subset of the memory cells connected to the selected word line are those memory cells being programmed to data state S13. The individual sense blocks (SB1, SB2, . . . ) know what state their respective memory cells are being programmed to because they store the programming data as part of the programming process. Therefore, as described above, in step 926 the system is performing verification operations for data states S12 and S13 using a word line voltage for data state S12.

In step 928, the voltage S13VH is applied to the selected word line. While S13VH is applied to the selected word line (and, therefore, applied to the control gates of the memory cells being verified), the sense amplifier (discussed above) is used to sense whether the threshold voltages of a first subset of the memory cells connected to the selected word line are above or below S13VH and whether the threshold voltages of a second subset of the memory cells connected to the selected word line are above or below S14VL. This is done concurrently because in this embodiment, S13VH=S14VL. The first subset of the memory cells connected to the selected word line are those memory cells being programmed to data state S1 and the second subset of the memory cells connected to the selected word line are those memory cells being programmed to data state S14. The individual sense blocks (SB1, SB2, . . . ) know what state their respective memory cells are being programmed to because they store the programming data as part of the programming process. Therefore, as described above, in step 928 the system is performing verification operations for data states S13 and S14 using a word line voltage for data state S13.

In step 930, the voltage S14VH is applied to the selected word line. While S14VH is applied to the selected word line (and, therefore, applied to the control gates of the memory cells being verified), the sense amplifier (discussed above) is used to sense whether the threshold voltages of a first subset of the memory cells connected to the selected word line are above or below S14VH and whether the threshold voltages of a second subset of the memory cells connected to the selected word line are above or below S15VL. This is done concurrently because in this embodiment, S14VH=S15VL. The first subset of the memory cells connected to the selected word line are those memory cells being programmed to data state S1 and the second subset of the memory cells connected to the selected word line are those memory cells being programmed to data state S2. The individual sense blocks (SB1, SB2, . . . ) know what state their respective memory cells are being programmed to because they store the programming data as part of the programming process. Therefore, as described above, in step 930 the system is performing verification operations for data states S14 and S15 using a word line voltage for data state S14.

In step 932, the voltage S15VH is applied to the selected word line. While S15VH is applied to the selected word line (and, therefore, applied to the control gates of the memory cells being verified), the sense amplifier (discussed above) is used to sense whether the threshold voltages of a first subset of the memory cells connected to the selected word line are above or below S15VH.

As described above, in each of steps 904-930 the system is configured to verify a first subset of the memory cells for a first data state using a verify reference voltage and verify a second subset of the memory cells for a second data state using the same verify reference voltage. That is, the system applies a verify reference voltage for a second data state to the plurality of memory cells, verifies a first subset of the plurality of memory cells for the first data state while applying the verify reference voltage to the first subset of the plurality of memory cells and verifies a second subset of the plurality of memory cells for a second data state while applying the verify reference voltage to second subset of the plurality of memory cells.

FIG. 16 is a flow chart describing a portion of the verification process. The method of FIG. 16 is performed during each of steps 904-930 for each memory cell. In step 1002, the system determines whether the memory cell is being verified VH for data state N−1. If so, then in step 1004 the system determines whether the verify was successful. If so, the result is stored (step 1006) and further verification for this memory cell is inhibited. If not, then the result (fail) is stored and verification will continue. If, in step 1002, it is determined that the memory cell is not being verified for VH of data state N−1, then the system determines whether the memory cell is being verified VL for data state N. If not, the result of the verify is ignored (step 1018). If the memory cell is being verified VL for data state N, then in step 1012 it is determined whether the verify was successful. If the verify was successful, the result (which is from VH of data state N−1) is stored/used and the verification for the memory cell is switched from coarse mode to fine mode of program/verify so that future verification will be for VH of state N. If the verification was not successful, then the result is stored and the coarse mode of program/verify continues. The process of FIGS. 14, 15 and 16 can be performed by any of the one or more control circuits mentioned above. In one embodiment, it is preferred that the process of FIGS. 14, 15 and 16 be performed at the direction of the state machine using the decoders and sense blocks of FIG. 2.

FIGS. 17A and 17B depict signal waveforms for a word line voltage during program/verify, and show how the embodiment of FIGS. 14-16 improve performance. The waveform of FIG. 17A depicts the selected word line voltage for the system of FIG. 13. Two program pulses (Vpgm pulse) are depicted. Between the two program pulses are thirty verify pulses, one verify pulse for each of S1VL, S1VH, S2VL, S2VH, S3VL, S3VH, S4VL, S4VH, S5VL, S5VH, S6VL, S6VH, S7VL, S7VH, S8VL, S8VH, S9VL, S9VH, S10VL, S10VH, S11VL, S11VH, S12VL, S12VH, S13VL, S13VH, S14VL, S14VH, S15VL and S15VH.

The waveform of FIG. 17B depicts the selected word line voltage for the system of FIGS. 14-16. Two program pulses (Vpgm pulse) are depicted. Between the two program pulses are sixteen verify pulses, one verify pulse for each of S1VL, S1VH, S2VH, S3VH, S4VH, S5VH, S6VH, S7VH, S8VH, S9VH, S10VH, S11VH, S12VH, S13VH, S14VH, and S15VH. As explained above, S2VL is verified using the verify operation for S2VH, so no separate pulse is needed for S2VL. This same explanation applies to S3VL-S15VL. Thus, the system of FIGS. 14-16 saves the time needed to perform fourteen verify operations.

Looking back at FIGS. 11A, 11B, 12A and 12B that explain coarse/fine programming, the voltage VH is greater than the voltage VL by a difference referred to as Δ (see FIG. 12A). In some instances it is desirable to optimize Δ. If Δ is too large, the memory cell spends more time in the fine phases (which is slower than the coarse phase), therefore, the programming process is slower. Additionally, after a few pulses in the fine phase, the memory cell threshold voltage will start to change in a manner more like the coarse phase, which defeats the purpose of the fine phase If Δ is too small, too many memory cells will pass VL and VH in the same pulse, thereby eliminating the fine phase and defeating the purpose of coarse/fine programming (e.g., tighter threshold voltage distributions). Either deviation of Δ (too large or too small) can serve to unnecessarily widen the threshold voltage distributions and potentially result in errors during reading. In one example, Δ is optimized by setting it to be the same as half the step size for successive program pulses In the embodiments of FIGS. 14-16, data state N-1 VH is used for state N's VL. Therefore, it is difficult to independently tune a state's Δ. FIGS. 18-26 describe a set of embodiments that allow Δ to be more easily tuned. More specifically, FIG. 18 is a flow chart describing one set of embodiments that vary the bit line voltage during a verify operation to move a memory cell's Id-Vg curve based on Drain Induced Barrier Lowering (DIBL). Changing the voltage that a bit line is charged to for a verify operation, causes a shift in the apparent (i.e., measured) threshold voltage of a memory cell connected to the bit line. For example, lowering the bit line voltage is like shortening the strobe time, which makes the apparent threshold voltage of the memory cell seem higher. Conversely, increasing the bit line voltage is like increasing the strobe time, which makes the apparent threshold voltage of the memory cell seem lower. One explanation is that using a higher bit line voltage causes the energy barrier to decrease, making it easier for electrons to move. Therefore, using a higher bit line voltage during sensing is effectively sensing the memory cell for a higher threshold voltage than the control gate (word line) voltage being applied. The process of FIG. 18 uses this theory to adjust the bit line voltages so that for a set of memory cells being connected to a common bit line, some of the memory cells will be verified for VH of data state N-1 and other memory cells will be concurrently verified for VL of data state N. In one set of embodiments, the word line voltage applied is for VH of state N-1, and higher bit line voltages are applies to bit lines connected to memory cells to be verified for VL of state N. By adjusting the bit line voltage, the magnitude of VL tested for can be adjusted so that the Δ (discussed above) can be tuned. This tuning can happen via simulation during the engineering design, during manufacturing (e.g., during testing/trimming), or in the field as part of an automated background process.

FIG. 18 is a flow chart describing one embodiment of a process for verifying programming, and is one example implementation of step 892 of FIG. 14 for a system that is implementing coarse/fine programming. In one embodiment, the process of FIG. 18 is performed during each iteration of step 774 of FIG. 10. The verification process of FIG. 18 includes verifying programming of the memory cells for a first data state using a verify operation for a second data state. In the embodiment of FIG. 18, the VL tested for state N is independently set to a voltage level that is greater than the VH for state N-1; however, memory cells connected to a common word line can be tested for either verify compare levels concurrently. As a result, the number of verify operations is reduced from thirty down to sixteen. Note that each of the steps of FIG. 18 represent one verify operation. Steps 1104-1130 represent one verify operation being performed using one word line voltage to perform verification for two data states. In the process of FIG. 18, the verifying programming includes applying different bit line voltages to bit lines connected to different memory cells of the set of memory cells in order to sense whether different memory cells of the set of memory cells are in different data states.

In step 1102, the voltage S1VL is applied to the selected word line. Note that the selected word line is the word line connected to the plurality of memory cells being concurrently programmed and verified. While S1VL is applied to the selected word line (and, therefore, applied to the control gates of the memory cells being verified), the sense amplifier (discussed above) is used to sense whether the threshold voltages of the memory cells connected to the selected word line are above or below S1VL. Those memory cells whose threshold voltage is below S1VL will turn on. Those memory cells whose threshold voltage is above S1VL will turn remain off. In step 1102, only data state S1 is being verified.

In step 1104, the voltage S1VH is applied to the selected word. While S1VH is applied to the selected word line (and, therefore, applied to the control gates of the memory cells being verified), the sense amplifier (discussed above) is used to sense whether the threshold voltages of a first subset of the memory cells connected to the selected word line are above or below S1VH and whether the threshold voltages of a second subset of the memory cells connected to the selected word line are above or below S2VL. This is done concurrently because in this embodiment the bit lines for memory cells being verified for S2VL (because they are being programmed to data state S2) receive a higher voltage for the verify operation. The first subset of the memory cells connected to the selected word line are those memory cells being programmed to data state S1 and verified for S1VH. The second subset of the memory cells are those memory cells being programmed to data state S2 and verified for S2VL. The state machine and the individual sense blocks (SB1, SB2, ... ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. In one example, the bit line voltage for the second subset of the memory cells is ~200 mV higher than the bit line voltage for the first subset of the memory cells; however, other voltage differences can also be used. Therefore, as described above, in step 1104, the system is concurrently performing verification operations for data states S1 and S2 using a word line voltage for state S1.

In step 1106, the voltage S2VH is applied to the selected word. While S2VH is applied to the selected word line (and, therefore, applied to the control gates of the memory cells being verified), the sense amplifier (discussed above) is used to sense whether the threshold voltages of a first subset of the memory cells connected to the selected word line are above or below S2VH and whether the threshold voltages of a second subset of the memory cells connected to the selected word line are above or below S3VL. This is done concurrently because in this embodiment the bit lines for memory cells being verified for S3VL (because they are being programmed to data state S3) receive a higher voltage for the verify operation. In this step, the first subset of the memory cells are those memory cells being programmed to data state S2 and verified for S2VH, and the second subset of the memory cells are those memory cells being programmed to data state S3 and verified for S3VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1106, the system is concurrently performing verification operations for data states S2 and S3 using a word line voltage for state S2.

In step 1108, the voltage S3VH is applied to the selected word. While S3VH is applied to the selected word line (and, therefore, applied to the control gates of the memory cells being verified), the sense amplifier (discussed above) is used to sense whether the threshold voltages of a first subset of the memory cells connected to the selected word line are above or below S3VH and whether the threshold voltages of a second subset of the memory cells connected to the selected word line are above or below S4VL. This is done concurrently because in this embodiment the bit lines for memory cells being verified for S4VL (because they are being programmed to data state S4) receive a higher voltage for the verify operation. In this step, the first subset of the memory cells are those memory cells being programmed to data state S3 and verified for S3VH, and the second subset of the memory cells are those memory cells being programmed to data state S4 and verified for S4VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1106, the system is concurrently performing verification operations for data states S3 and S4 using a word line voltage for state S3.

In step 1110, the voltage S4VH is applied to the selected word. While S4VH is applied to the selected word line (and, therefore, applied to the control gates of the memory cells being verified), the sense amplifier (discussed above) is used to sense whether the threshold voltages of a first subset of the memory cells connected to the selected word line are above or below S4VH and whether the threshold voltages of a second subset of the memory cells connected to the selected word line are above or below S5VL. This is done concurrently because in this embodiment the bit lines for memory cells being verified for S5VL (because they are being programmed to data state S5) receive a higher voltage for the verify operation. In this step, the first subset of the memory cells are those memory cells being programmed to data state S4 and verified for S4VH, and the second subset of the memory cells are those memory cells being programmed to data state S5 and verified for S5VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1110, the system is concurrently performing verification operations for data states S4 and S5 using a word line voltage for state S4.

In step 1112, the voltage S5VH is applied to the selected word. While S5VH is applied to the selected word line (and, therefore, applied to the control gates of the memory cells being verified), the sense amplifier (discussed above) is used to sense whether the threshold voltages of a first subset of the memory cells connected to the selected word line are above or below S5VH and whether the threshold voltages of a second subset of the memory cells connected to the selected word line are above or below S6VL. This is done concurrently because in this embodiment the bit lines for memory cells being verified for S6VL (because they are being programmed to data state S6) receive a higher voltage for the verify operation. In this step, the first subset of the memory cells are those memory cells being programmed to data state S5 and verified for S5VH, and the second subset of the memory cells are those memory cells being programmed to data state S6 and verified for S6VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1112, the system is concurrently performing verification operations for data states S5 and S6 using a word line voltage for state S5.

In step 1114, the voltage S6VH is applied to the selected word. While S6VH is applied to the selected word line (and, therefore, applied to the control gates of the memory cells being verified), the sense amplifier (discussed above) is used to sense whether the threshold voltages of a first subset of the memory cells connected to the selected word line are above or below S6VH and whether the threshold voltages of a second subset of the memory cells connected to the selected word line are above or below S7VL. This is done concurrently because in this embodiment the bit lines for memory cells being verified for S7VL (because they are being programmed to data state S7) receive a higher voltage for the verify operation. In this step, the first subset of the memory cells are those memory cells being programmed to data state S6 and verified for S6VH, and the second subset of the memory cells are those memory cells being programmed to data state S7 and verified for S7VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1106, the system is concurrently performing verification operations for data states S6 and S7 using a word line voltage for state S6.

In step 1116, the voltage S7VH is applied to the selected word. While S7VH is applied to the selected word line (and, therefore, applied to the control gates of the memory cells being verified), the sense amplifier (discussed above) is used to sense whether the threshold voltages of a first subset of the memory cells connected to the selected word line are above or below S7VH and whether the threshold voltages of a second subset of the memory cells connected to the selected word line are above or below S8VL. This is done concurrently because in this embodiment the bit lines for memory cells being verified for S8VL (because they are being programmed to data state S8) receive a higher voltage for the verify operation. In this step, the first subset of the memory cells are those memory cells being programmed to data state S7 and verified for S7VH, and the second subset of the memory cells are those memory cells being programmed to data state S8 and verified for S8VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1116, the system is concurrently performing verification operations for data states S7 and S8 using a word line voltage for state S7.

In step 1118, the voltage S8VH is applied to the selected word. While S8VH is applied to the selected word line (and, therefore, applied to the control gates of the memory cells being verified), the sense amplifier (discussed above) is used to sense whether the threshold voltages of a first subset of the memory cells connected to the selected word line are above or below S8VH and whether the threshold voltages of a second subset of the memory cells connected to the selected word line are above or below S9VL. This is done concurrently because in this embodiment the bit lines for memory cells being verified for S9VL (because they are being programmed to data state S9) receive a higher voltage for the verify operation. In this step, the first subset of the memory cells are those memory cells being programmed to data state S8 and verified for S8VH, and the second subset of the memory cells are those memory cells being programmed to data state S9 and verified for S9VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1118, the system is concurrently performing verification operations for data states S8 and S9 using a word line voltage for state S8.

In step 1120, the voltage S9VH is applied to the selected word. While S9VH is applied to the selected word line (and, therefore, applied to the control gates of the memory cells being verified), the sense amplifier (discussed above) is used to sense whether the threshold voltages of a first subset of the memory cells connected to the selected word line are above or below S9VH and whether the threshold voltages of a second subset of the memory cells connected to the selected word line are above or below S10VL. This is done concurrently because in this embodiment the bit lines for memory cells being verified for S10VL (because they are being programmed to data state S10) receive a higher voltage for the verify operation. In this step, the first subset of the memory cells are those memory cells being programmed to data state S9 and verified for S9VH, and the second subset of the memory cells are those memory cells being programmed to data state S10 and verified for S10VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1120, the system is concurrently performing verification operations for data states S9 and S10 using a word line voltage for state S9.

In step 1122, the voltage S10VH is applied to the selected word. While S10VH is applied to the selected word line (and, therefore, applied to the control gates of the memory cells being verified), the sense amplifier (discussed above) is used to sense whether the threshold voltages of a first subset of the memory cells connected to the selected word line are above or below S10VH and whether the threshold voltages of a second subset of the memory cells connected to the selected word line are above or below S11VL. This is done concurrently because in this embodiment the bit lines for memory cells being verified for S11VL (because they are being programmed to data state S11) receive a higher voltage for the verify operation. In this step, the first subset of the memory cells are those memory cells being programmed to data state S10 and verified for S10VH, and the second subset of the memory cells are those memory cells being programmed to data state S11 and verified for S11VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1122, the system is concurrently performing verification operations for data states S10 and S11 using a word line voltage for state S10.

In step 1124, the voltage S11VH is applied to the selected word. While S11VH is applied to the selected word line (and, therefore, applied to the control gates of the memory cells being verified), the sense amplifier (discussed above) is used to sense whether the threshold voltages of a first subset of the memory cells connected to the selected word line are above or below S11VH and whether the threshold voltages of a second subset of the memory cells connected to the selected word line are above or below S12VL. This is done concurrently because in this embodiment the bit lines for memory cells being verified for S12VL (because they are being programmed to data state S12) receive a higher voltage for the verify operation. In this step, the first subset of the memory cells are those memory cells being programmed to data state S11 and verified for S11VH, and the second subset of the memory cells are those memory cells being programmed to data state S12 and verified for S12VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1124, the system is concurrently performing verification operations for data states S11 and S12 using a word line voltage for state S11.

In step 1126, the voltage S12VH is applied to the selected word. While S12VH is applied to the selected word line (and, therefore, applied to the control gates of the memory cells being verified), the sense amplifier (discussed above) is used to sense whether the threshold voltages of a first subset of the memory cells connected to the selected word line are above or below S12VH and whether the threshold voltages of a second subset of the memory cells connected to the selected word line are above or below S13VL. This is done concurrently because in this embodiment the bit lines for memory cells being verified for S13VL (because they are being programmed to data state S13) receive a higher voltage for the verify operation. In this step, the first subset of the memory cells are those memory cells being programmed to data state S12 and verified for S12VH, and the second subset of the memory cells are those memory cells being programmed to data state S13 and verified for S13VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1126, the system is concurrently performing verification operations for data states S12 and S13 using a word line voltage for state S12.

In step 1128, the voltage S13VH is applied to the selected word. While S13VH is applied to the selected word line (and, therefore, applied to the control gates of the memory cells being verified), the sense amplifier (discussed above) is used to sense whether the threshold voltages of a first subset of the memory cells connected to the selected word line are above or below S13VH and whether the threshold voltages of a second subset of the memory cells connected to the selected word line are above or below S14VL. This is done concurrently because in this embodiment the bit lines for memory cells being verified for S14VL (because they are being programmed to data state S14) receive a higher voltage for the verify operation. In this step, the first subset of the memory cells are those memory cells being programmed to data state S13 and verified for S13VH, and the second subset of the memory cells are those memory cells being programmed to data state S14 and verified for S14VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1128, the system is concurrently performing verification operations for data states S13 and S14 using a word line voltage for state S13.

In step 1130, the voltage S14VH is applied to the selected word. While S14VH is applied to the selected word line (and, therefore, applied to the control gates of the memory cells being verified), the sense amplifier (discussed above) is used to sense whether the threshold voltages of a first subset of the memory cells connected to the selected word line are above or below S14VH and whether the threshold voltages of a second subset of the memory cells connected to the selected word line are above or below S15VL. This is done concurrently because in this embodiment the bit lines for memory cells being verified for S15VL (because they are being programmed to data state S15) receive a higher voltage for the verify operation. In this step, the first subset of the memory cells are those memory cells being programmed to data state S14 and verified for S14VH, and the second subset of the memory cells are those memory cells being programmed to data state S15 and verified for S15VL. The state machine and the individual sense blocks (SB1, SB2, . . . ) know what data state the memory cells are being programmed to because they store the programming data as part of the programming process. Thus, the bit lines connected to the first subset of the memory cells receive the nominal bit line voltage, while the bit lines connected to the second subset of the memory cells receive the higher bit line voltage. Therefore, as described above, in step 1130, the system is concurrently performing verification operations for data states S14 and S15 using a word line voltage for state S14.

In step 1133, the voltage S15VH is applied to the selected word. While S15VH is applied to the selected word line (and, therefore, applied to the control gates of the memory cells being verified), the sense amplifier (discussed above) is used to sense whether the threshold voltages of the memory cells connected to the selected word line are above or below S15VH.

As described above, in each of steps 1104-1130 the system is configured to verify a first subset of the plurality of memory cells for a first data state using a verify reference voltage and verify a second subset of the plurality of memory cells for a second data state using the same verify reference voltage. That is, the system applies a verify reference voltage for a second data state to the plurality of memory cells, verifies a first subset of the plurality of memory cells for the first data state while applying the verify reference voltage to the first subset of the plurality of memory cells and verifies a second subset of the plurality of memory cells for a second data state while applying the verify reference voltage to second subset of the plurality of memory cells.

Figure 19:
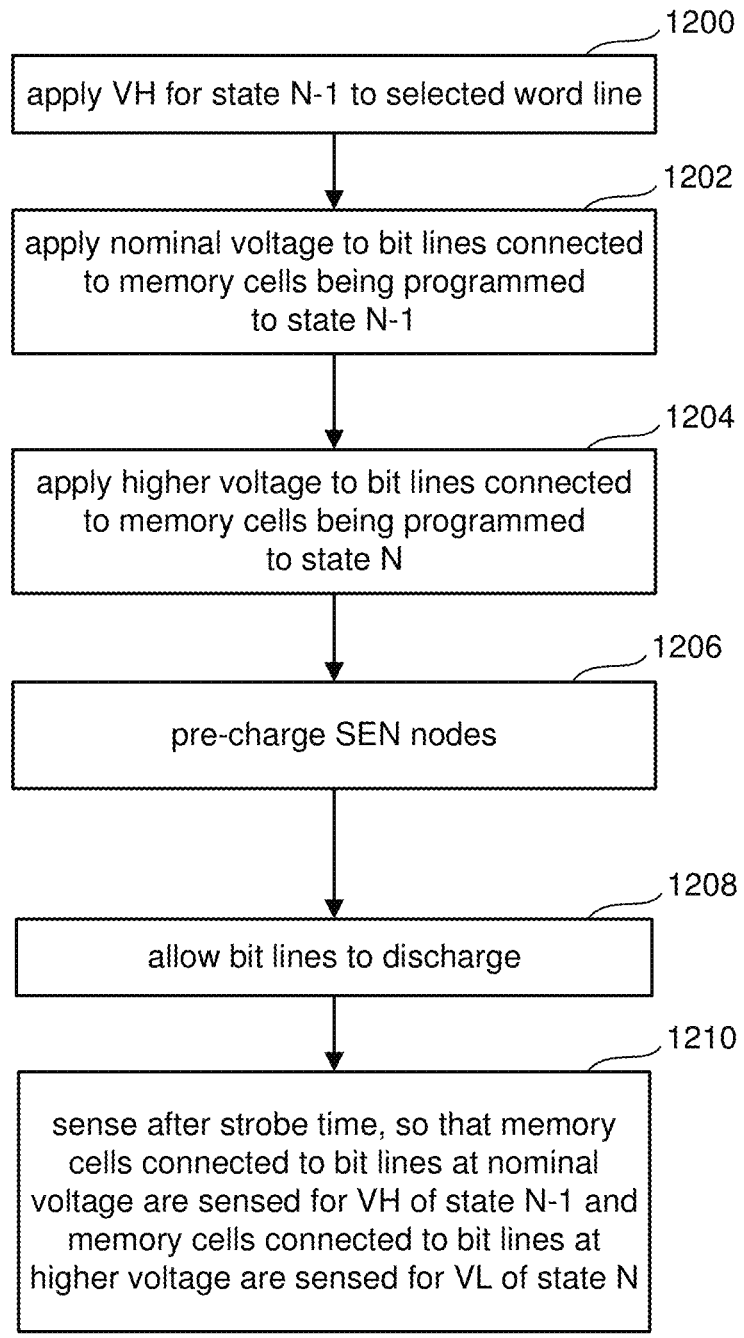
FIG. 19 is a flow chart describing one embodiment of a process for sensing.

FIG. 19 is a flow chart describing a single strobe sensing operation performed during each of steps 1104-1130. The process of FIG. 19 includes the one or more control circuits sensing whether different memory cells of the plurality of memory cells are in different data states by applying different bit line voltages to different bit lines connected to the different memory cells. In step 1200, the appropriate data state N-1 VH verify reference voltage (e.g., S1VH, S2VH, S3VH, S4VH, S5VH, S6VH, S7VH, S8VH, S9VH, S10VH, S11VH, S12VH, S13VH, and S14VH) is applied to the selected word line. The selected word line is connected to the memory cells being programmed and verified. In step 1202, the nominal bit line voltage e.g., 0.5 volts is applied to the bit lines connected to memory cells being programmed to and verified for data state N-1 (e.g., verified to VH for data state N-1). In step 1204, a voltage that is higher than the nominal bit line voltage is applied to bit lines connected to memory cells being programmed to and verified for data state N (e.g., verified to VL for data state N). In one embodiment, steps 1202 and 1204 are performed simultaneously such that the nominal bit line voltage is applied on state N-1 cells and higher bit line voltage is applied on state N cells simultaneously. In step 1206, all of the SEN nodes of the sense amplifiers are pre-charged, as discussed above. In step 1208, the bit lines are allowed to discharge, for example, by discharging the capacitor 516 (see t5-t6 of FIG. 6), as discussed above. In step 1210, after a predetermined time period, referred to as the "strobe time" or "integration time" the voltage of the capacitor 516 (or the SEN node) is sampled as described above to see whether the respective memory cell(s) conducted so that memory cells connected to bit lines at nominal voltage are sensed for VH of state N-1 and memory cells connected to bit lines at higher voltage are sensed for VL of state N. As described above, the verification process is performed simultaneously for thousands of memory cells connected to the same word line and different bit lines. The process of FIGS. 18 and 19 can be performed by any of the one or more control circuits mentioned above. In one embodiment, it is preferred that the process of FIGS. 18 and 19 be performed at the direction of the state machine using the decoders and sense blocks of FIG. 2.

Figure 20:
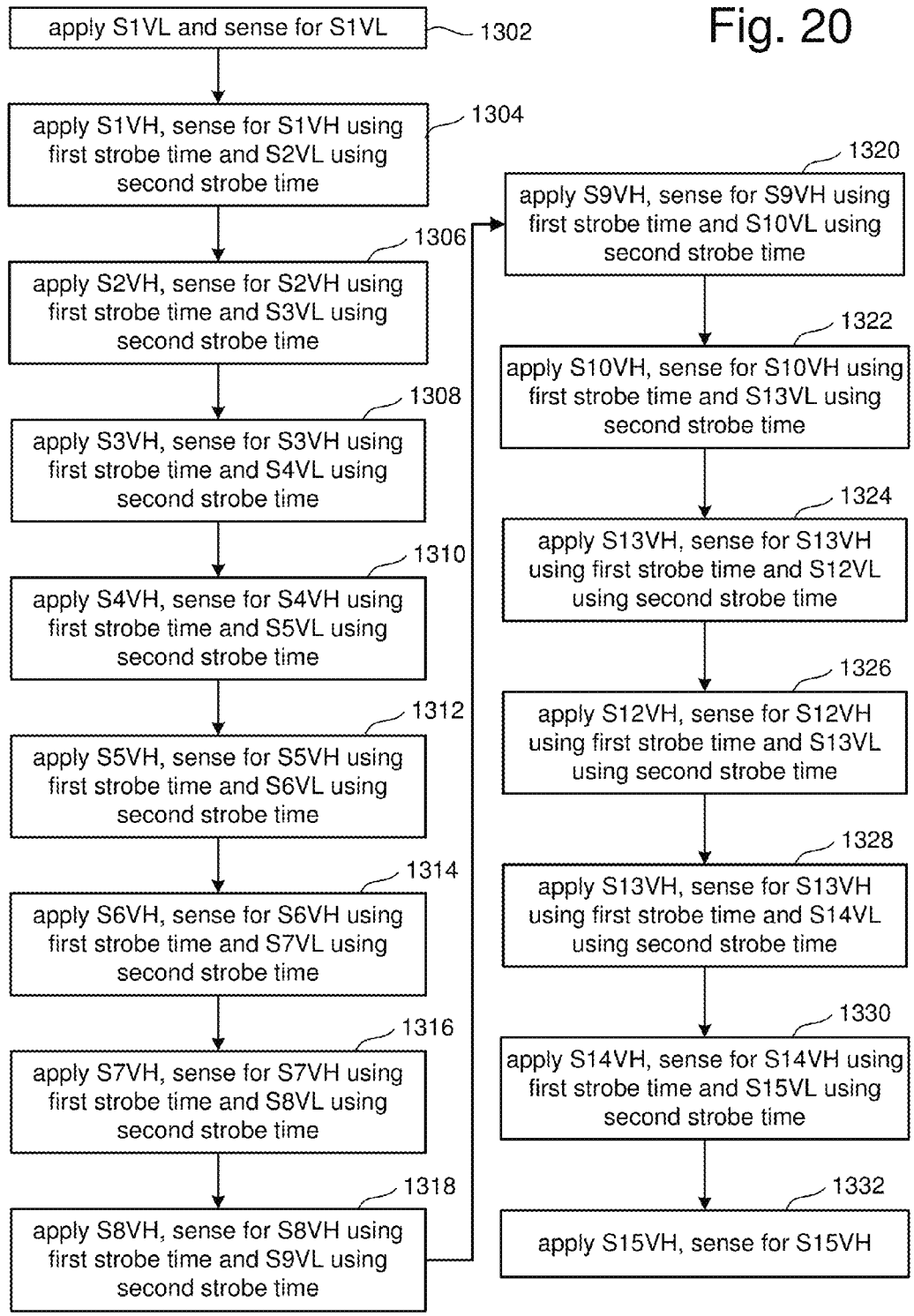
FIG. 20 is a flow chart describing one embodiment of a process for verifying programming.
Figure 21:
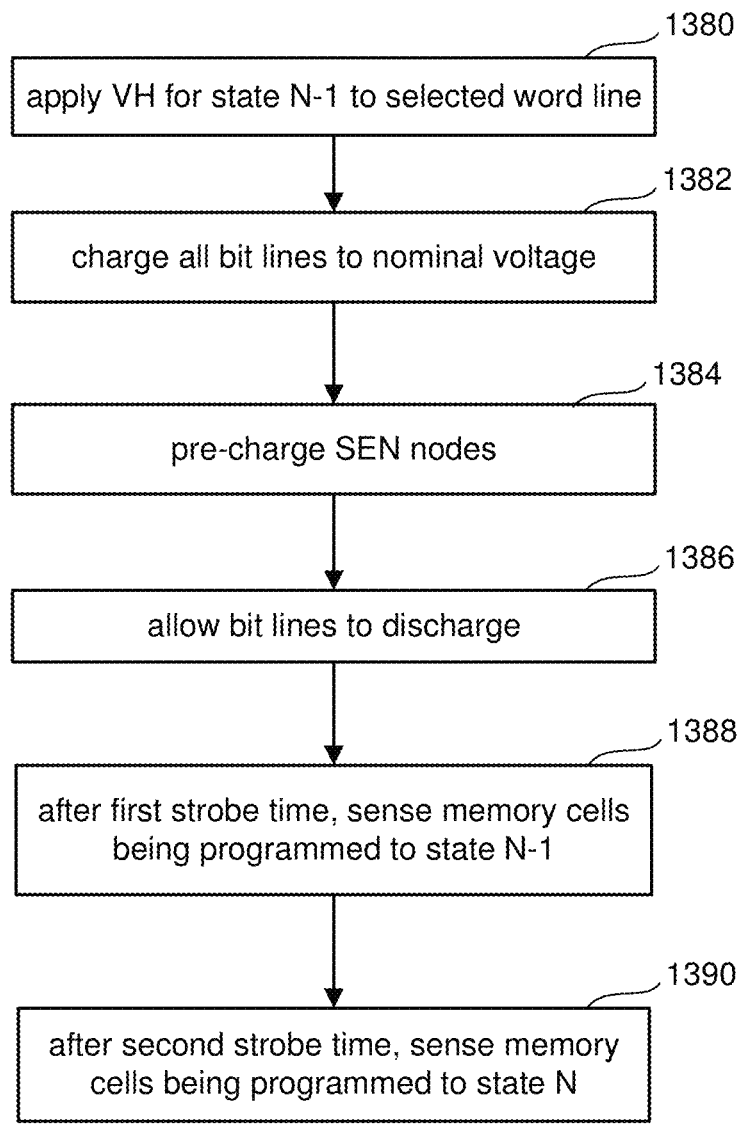
FIG. 21 is a flow chart describing one embodiment of a process for sensing.

While the embodiment of FIGS. 18 and 19 varied the bit line voltage to achieve concurrent sensing for different data states, the embodiments of FIGS. 20 and 21 vary the strobe time voltage to achieve sensing for different data states in response to a common word line voltage.

Using a longer strobe time is effectively sensing the memory cell for a higher threshold voltage than the control gate (word line) voltage being applied. The process of FIG. 20 uses this theory to adjust the strobe time so that for a set of memory cells being connected to a common bit line, some of the memory cells will be verified for VH of data state N-1 and other memory cells will be verified for VL of data state N in response to the same word line/control gate voltage (verify reference voltage). In one set of embodiments, the word line voltage applies is for VH of state N-1, and longer strobe times are used for memory cells to be verified for VL of state N. By adjusting the strobe time, the magnitude of VL tested for can be adjusted so that the Δ (discussed above) can be tuned. This tuning can happen via simulation during the engineering design, during manufacturing (e.g., during testing/trimming), or in the field as part of an automated background process.

FIG. 20 is a flow chart describing one embodiment of a process for verifying programming, and is one example implementation of step 892 of FIG. 14 for a system that is implementing coarse/fine programming. In one embodiment, the process of FIG. 20 is performed during each iteration of step 774 of FIG. 10. The verification process of FIG. 20 includes verifying programming of the memory cells for a first data state using a verify operation for a second data state. In the embodiment of FIG. 20, the VL tested for state N is independently set to a voltage level that is greater than the VH for state N-1; however, memory cells connected to a common word line can be tested for either verify compare levels in response to the same word line/control gate voltage. As a result, the number of verify operations is reduced from thirty down to sixteen. Note that each of the steps of FIG. 20 represent one verify operation. Steps 1304-1330 represent one verify operation being performed using one word line voltage to perform verification for two data states.

In step 1302, the voltage S1VL is applied to the selected word line. Note that the selected word line is the word line connected to the plurality of memory cells being concurrently programmed and verified. While S1VL is applied to the selected word line (and, therefore, applied to the control gates of the memory cells being verified), the sense amplifier (discussed above) is used to sense whether the threshold voltages of the memory cells connected to the selected word line are above or below S1VL. Those memory cells whose threshold voltage is below S1VL will turn on. Those memory cells whose threshold voltage is above S1VL will turn remain off. In step 1302, only data state S1 is being verified.

In step 1304, the voltage S1VH is applied to the selected word. While S1VH is applied to the selected word line (and, therefore, applied to the control gates of the memory cells being verified), the sense amplifier (discussed above) is used to sense after a first strobe time whether the threshold voltages of a first subset of the memory cells connected to the selected word line are above or below S1VH and after a second strobe time whether the threshold voltages of a second subset of the memory cells connected to the selected word line are above or below S2VL. The first subset of the memory cells connected to the selected word line are those memory cells being programmed to data state S1 and verified for S1VH. The second subset of the memory cells are those memory cells being programmed to data state S2 and verified for S2VL. Therefore, as described above, in step 1304, the system is performing verification operations for data states S1 and S2 using a word line voltage (verify reference voltage) for state S1.

In step 1306, the voltage S2VH is applied to the selected word. While S2VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S2VH and after a second strobe time whether the threshold voltages of a second subset of the memory cells connected to the selected word line are above or below S3VL. In this step, the first subset of the memory cells are those memory cells being programmed to data state S2 and verified for S2VH, and the second subset of the memory cells are those memory cells being programmed to data state S3 and verified for S3VL. Therefore, as described above, in step 1306, the system is performing verification operations for data states S2 and S3 using a word line voltage (verify reference voltage) for state S2.

In step 1308, the voltage S3VH is applied to the selected word. While S3VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S3VH and after a second strobe time whether the threshold voltages of a second subset of the memory cells connected to the selected word line are above or below S4VL. In this step, the first subset of the memory cells are those memory cells being programmed to data state S3 and verified for S3VH, and the second subset of the memory cells are those memory cells being programmed to data state S4 and verified for S4VL. Therefore, as described above, in step 1306, the system is performing verification operations for data states S3 and S4 using a word line voltage (verify reference voltage) for state S3.

In step 1310, the voltage S4VH is applied to the selected word. While S4VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S4VH and after a second strobe time whether the threshold voltages of a second subset of the memory cells connected to the selected word line are above or below S5VL. In this step, the first subset of the memory cells are those memory cells being programmed to data state S4 and verified for S4VH, and the second subset of the memory cells are those memory cells being programmed to data state S5 and verified for S5VL. Therefore, as described above, in step 1310, the system is performing verification operations for data states S4 and S5 using a word line voltage (verify reference voltage) for state S4.

In step 1312, the voltage S5VH is applied to the selected word. While S5VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S5VH and after a second strobe time whether the threshold voltages of a second subset of the memory cells connected to the selected word line are above or below S6VL. In this step, the first subset of the memory cells are those memory cells being programmed to data state S5 and verified for S5VH, and the second subset of the memory cells are those memory cells being programmed to data state S6 and verified for S6VL. Therefore, as described above, in step 1312, the system is performing verification operations for data states S5 and S6 using a word line voltage (verify reference voltage) for state S5.

In step 1314, the voltage S6VH is applied to the selected word. While S6VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S6VH and after a second strobe time whether the threshold voltages of a second subset of the memory cells connected to the selected word line are above or below S7VL. In this step, the first subset of the memory cells are those memory cells being programmed to data state S6 and verified for S6VH, and the second subset of the memory cells are those memory cells being programmed to data state S7 and verified for S7VL. Therefore, as described above, in step 1306, the system is performing verification operations for data states S6 and S7 using a word line voltage (verify reference voltage) for state S6.

In step 1316, the voltage S7VH is applied to the selected word. While S7VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S7VH and after a second strobe time whether the threshold voltages of a second subset of the memory cells connected to the selected word line are above or below S8VL. In this step, the first subset of the memory cells are those memory cells being programmed to data state S7 and verified for S7VH, and the second subset of the memory cells are those memory cells being programmed to data state S8 and verified for S8VL. Therefore, as described above, in step 1316, the system is performing verification operations for data states S7 and S8 using a word line voltage (verify reference voltage) for state S7.

In step 1318, the voltage S8VH is applied to the selected word. While S8VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S8VH and after a second strobe time whether the threshold voltages of a second subset of the memory cells connected to the selected word line are above or below S9VL. In this step, the first subset of the memory cells are those memory cells being programmed to data state S8 and verified for S8VH, and the second subset of the memory cells are those memory cells being programmed to data state S9 and verified for S9VL. Therefore, as described above, in step 1318, the system is performing verification operations for data states S8 and S9 using a word line voltage (verify reference voltage) for state S8.

In step 1320, the voltage S9VH is applied to the selected word. While S9VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S9VH and after a second strobe time whether the threshold voltages of a second subset of the memory cells connected to the selected word line are above or below S10VL. In this step, the first subset of the memory cells are those memory cells being programmed to data state S9 and verified for S9VH, and the second subset of the memory cells are those memory cells being programmed to data state S10 and verified for S10VL. Therefore, as described above, in step 1320, the system is performing verification operations for data states S9 and S10 using a word line voltage (verify reference voltage) for state S9.

In step 1322, the voltage S10VH is applied to the selected word. While S10VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S10VH and after a second strobe time whether the threshold voltages of a second subset of the memory cells connected to the selected word line are above or below S13VL. In this step, the first subset of the memory cells are those memory cells being programmed to data state S10 and verified for S10VH, and the second subset of the memory cells are those memory cells being programmed to data state S13 and verified for S13VL. Therefore, as described above, in step 1322, the system is performing verification operations for data states S10 and S13 using a word line voltage (verify reference voltage) for state S10.

In step 1324, the voltage S13VH is applied to the selected word. While S13VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S13VH and after a second strobe time whether the threshold voltages of a second subset of the memory cells connected to the selected word line are above or below S12VL. In this step, the first subset of the memory cells are those memory cells being programmed to data state S13 and verified for S13VH, and the second subset of the memory cells are those memory cells being programmed to data state S12 and verified for S12VL. Therefore, as described above, in step 1324, the system is performing verification operations for data states S13 and S12 using a word line voltage (verify reference voltage) for state S13.

In step 1326, the voltage S12VH is applied to the selected word. While S12VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S12VH and after a second strobe time whether the threshold voltages of a second subset of the memory cells connected to the selected word line are above or below S13VL. In this step, the first subset of the memory cells are those memory cells being programmed to data state S12 and verified for S12VH, and the second subset of the memory cells are those memory cells being programmed to data state S13 and verified for S13VL. Therefore, as described above, in step 1326, the system is performing verification operations for data states S12 and S13 using a word line voltage (verify reference voltage) for state S12.

In step 1328, the voltage S13VH is applied to the selected word. While S13VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S13VH and after a second strobe time whether the threshold voltages of a second subset of the memory cells connected to the selected word line are above or below S14VL. In this step, the first subset of the memory cells are those memory cells being programmed to data state S13 and verified for S13VH, and the second subset of the memory cells are those memory cells being programmed to data state S14 and verified for S14VL. Therefore, as described above, in step 1328, the system is performing verification operations for data states S13 and S14 using a word line voltage (verify reference voltage) for state S13.

In step 1330, the voltage S14VH is applied to the selected word. While S14VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S14VH and after a second strobe time whether the threshold voltages of a second subset of the memory cells connected to the selected word line are above or below S15VL. In this step, the first subset of the memory cells are those memory cells being programmed to data state S14 and verified for S14VH, and the second subset of the memory cells are those memory cells being programmed to data state S15 and verified for S15VL. Therefore, as described above, in step 1330, the system is performing verification operations for data states S14 and S15 using a word line voltage (verify reference voltage) for state S14.

In step 1332, the voltage S15VH is applied to the selected word. While S15VH is applied to the selected word line (and, therefore, applied to the control gates of the memory cells being verified), the sense amplifier (discussed above) is used to sense whether the threshold voltages of the memory cells connected to the selected word line are above or below S15VH.

As described above, in each of steps 1304-1330 the system is configured to verify a first subset of the plurality of memory cells for a first data state using a verify reference voltage and verify a second subset of the plurality of memory cells for a second data state using the same verify reference voltage. That is, the system applies a verify reference voltage for a second data state to the plurality of memory cells, verifies a first subset of the plurality of memory cells for the first data state while applying the verify reference voltage to the first subset of the plurality of memory cells and verifies a second subset of the plurality of memory cells for a second data state while applying the verify reference voltage to second subset of the plurality of memory cells.

FIG. 21 is a flow chart describing a single strobe sensing operation performed during each of steps 1304-1330. In step 1380, the appropriate data state N−1 VH verify reference voltage (e.g., S1VH, S2VH, S3VH, S4VH, S5VH, S6VH, S7VH, S8VH, S9VH, S10VH, S13VH, S12VH, S13VH, and S14VH) is applied is applied to the selected word line. The selected word line is connected to the memory cells being programmed and verified. In step 1382, all bit lines are charged to the nominal bit line voltage (e.g., 0.5 volts). In step 1384, the SEN nodes of the sense amplifiers are pre-charged, as discussed above. In step 1386, the bit lines are allowed to discharge, for example, by discharging the capacitor 516 (see t5-t6 of FIG. 6), as discussed above. In step 1388, after the first strobe time, the voltage of the capacitor 516 (or the SEN node) is sampled as described above to see whether the respective memory cell(s) conducted so that memory cells are sensed for VH of state N−1. In step 1390, after the second strobe time, the voltage of the capacitor 516 (or the SEN node) is sampled as described above to see whether the respective memory cell(s) conducted so that memory cells are sensed for VL of state N. The process of FIGS. 20 and 21 can be performed by any of the one or more control circuits mentioned above. In one embodiment, it is preferred that the process of FIGS. 20 and 21 be performed at the direction of the state machine using the decoders and sense blocks of FIG. 2.

Figure 22:
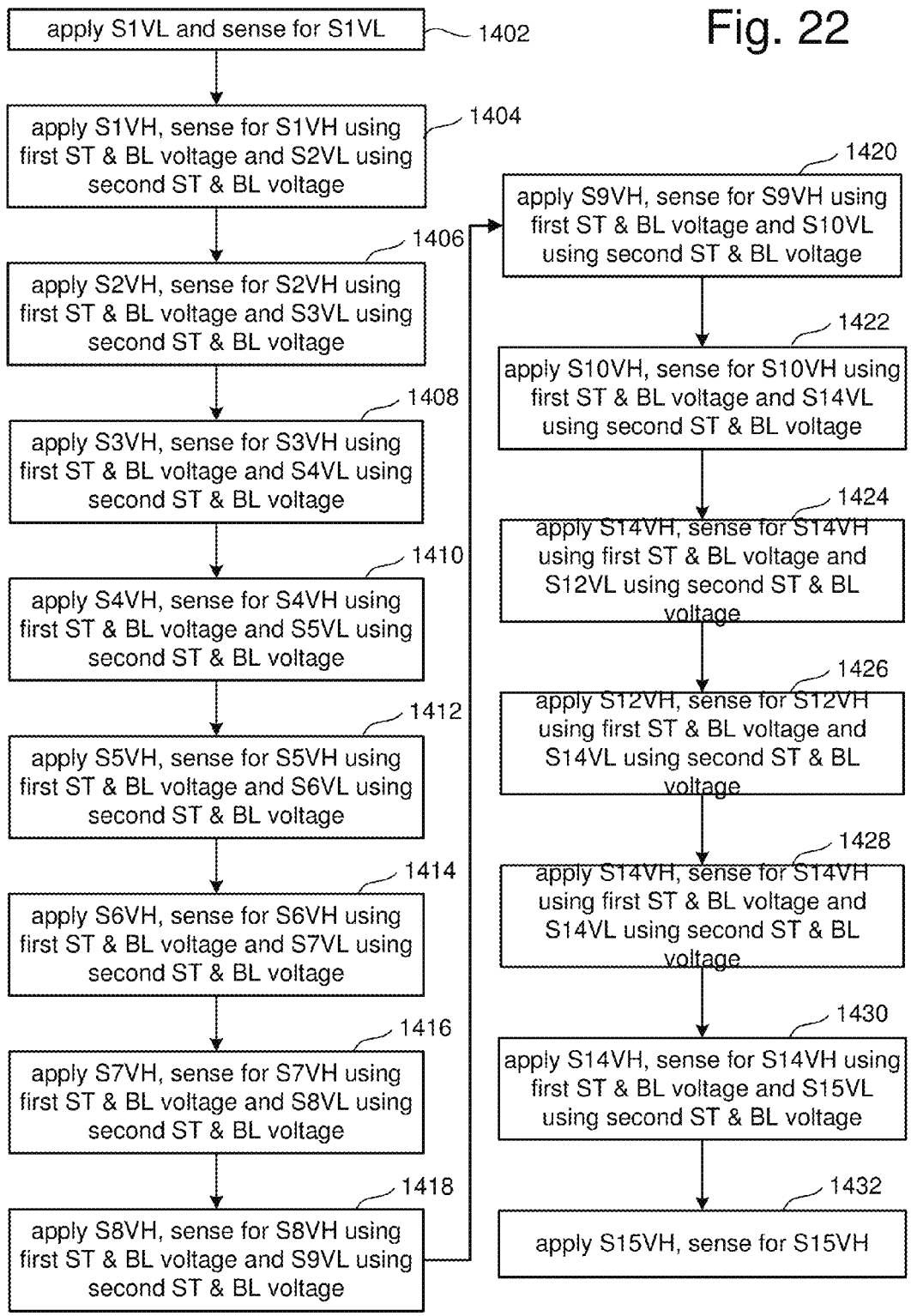
FIG. 22 is a flow chart describing one embodiment of a process for verifying programming.

FIG. 22 describes an embodiment that varies bit line voltage and strobe time. FIG. 22 is a flow chart describing one embodiment of a process for verifying programming, and is one example implementation of step 892 of FIG. 14 for a system that is implementing coarse/fine programming. In one embodiment, the process of FIG. 22 is performed during each iteration of step 774 of FIG. 10. The verification process of FIG. 22 includes verifying programming of the memory cells for a first data state using a verify operation for a second data state. In the embodiment of FIG. 22, the VL tested for state N is independently set to a voltage level that is greater than the VH for state N−1; however, memory cells connected to a common word line can be tested for either verify compare levels in response to the same word line/control gate voltage. As a result, the number of verify operations is reduced from thirty down to sixteen. Note that each of the steps of FIG. 22 represent one verify operation. Steps 1404-1430 represent one verify operation being performed using one word line voltage to perform verification for two data states.

In step 1402, the voltage S1VL is applied to the selected word line. Note that the selected word line is the word line connected to the plurality of memory cells being concurrently programmed and verified. While S1VL is applied to the selected word line (and, therefore, applied to the control gates of the memory cells being verified), the sense amplifier (discussed above) is used to sense whether the threshold voltages of the memory cells connected to the selected word line are above or below S1VL. Those memory cells whose threshold voltage is below S1VL will turn on. Those memory cells whose threshold voltage is above S1VL will turn remain off. In step 1402, only data state S1 is being verified.

In step 1404, the voltage S1VH is applied to the selected word. While S1VH is applied to the selected word line (and, therefore, applied to the control gates of the memory cells being verified), the sense amplifier (discussed above) is used to sense after a first strobe time whether the threshold voltages of a first subset of the memory cells connected to the selected word line are above or below S1VH and after a second strobe time whether the threshold voltages of a second subset of the memory cells connected to the selected word line are above or below S2VL. The first subset of the memory cells connected to the selected word line are those memory cells being programmed to data state S1 and verified for S1VH. The second subset of the memory cells are those memory cells being programmed to data state S2 and verified for S2VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1404, the system is performing verification operations for data states S1 and S2 using a word line voltage (verify reference voltage) for state S1.

In step 1406, the voltage S2VH is applied to the selected word. While S2VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S2VH and after a second strobe time whether the threshold voltages of a second subset of the memory cells connected to the selected word line are above or below S3VL. In this step, the first subset of the memory cells are those memory cells being programmed to data state S2 and verified for S2VH, and the second subset of the memory cells are those memory cells being programmed to data state S3 and verified for S3VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1406, the system is performing verification operations for data states S2 and S3 using a word line voltage (verify reference voltage) for state S2.

In step 1408, the voltage S3VH is applied to the selected word. While S3VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S3VH and after a second strobe time whether the threshold voltages of a second subset of the memory cells connected to the selected word line are above or below S4VL. In this step, the first subset of the memory cells are those memory cells being programmed to data state S3 and verified for S3VH, and the second subset of the memory cells are those memory cells being programmed to data state S4 and verified for S4VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1406, the system is performing verification operations for data states S3 and S4 using a word line voltage (verify reference voltage) for state S3.

In step 1410, the voltage S4VH is applied to the selected word. While S4VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S4VH and after a second strobe time whether the threshold voltages of a second subset of the memory cells connected to the selected word line are above or below S5VL. In this step, the first subset of the memory cells are those memory cells being programmed to data state S4 and verified for S4VH, and the second subset of the memory cells are those memory cells being programmed to data state S5 and verified for S5VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1410, the system is performing verification operations for data states S4 and S5 using a word line voltage (verify reference voltage) for state S4.

In step 1412, the voltage S5VH is applied to the selected word. While S5VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S5VH and after a second strobe time whether the threshold voltages of a second subset of the memory cells connected to the selected word line are above or below S6VL. In this step, the first subset of the memory cells are those memory cells being programmed to data state S5 and verified for S5VH, and the second subset of the memory cells are those memory cells being programmed to data state S6 and verified for S6VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1412, the system is performing verification operations for data states S5 and S6 using a word line voltage (verify reference voltage) for state S5.

In step 1414, the voltage S6VH is applied to the selected word. While S6VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S6VH and after a second strobe time whether the threshold voltages of a second subset of the memory cells connected to the selected word line are above or below S7VL. In this step, the first subset of the memory cells are those memory cells being programmed to data state S6 and verified for S6VH, and the second subset of the memory cells are those memory cells being programmed to data state S7 and verified for S7VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1406, the system is performing verification operations for data states S6 and S7 using a word line voltage (verify reference voltage) for state S6.

In step 1416, the voltage S7VH is applied to the selected word. While S7VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S7VH and after a second strobe time whether the threshold voltages of a second subset of the memory cells connected to the selected word line are above or below S8VL. In this step, the first subset of the memory cells are those memory cells being programmed to data state S7 and verified for S7VH, and the second subset of the memory cells are those memory cells being programmed to data state S8 and verified for S8VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1416, the system is performing verification operations for data states S7 and S8 using a word line voltage (verify reference voltage) for state S7.

In step 1418, the voltage S8VH is applied to the selected word. While S8VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S8VH and after a second strobe time whether the threshold voltages of a second subset of the memory cells connected to the selected word line are above or below S9VL. In this step, the first subset of the memory cells are those memory cells being programmed to data state S8 and verified for S8VH, and the second subset of the memory cells are those memory cells being programmed to data state S9 and verified for S9VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1418, the system is performing verification operations for data states S8 and S9 using a word line voltage (verify reference voltage) for state S8.

In step 1420, the voltage S9VH is applied to the selected word. While S9VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S9VH and after a second strobe time whether the threshold voltages of a second subset of the memory cells connected to the selected word line are above or below S10VL. In this step, the first subset of the memory cells are those memory cells being programmed to data state S9 and verified for S9VH, and the second subset of the memory cells are those memory cells being programmed to data state S10 and verified for S10VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1420, the system is performing verification operations for data states S9 and S10 using a word line voltage (verify reference voltage) for state S9.

In step 1422, the voltage S10VH is applied to the selected word. While S10VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S10VH and after a second strobe time whether the threshold voltages of a second subset of the memory cells connected to the selected word line are above or below S14VL. In this step, the first subset of the memory cells are those memory cells being programmed to data state S10 and verified for S10VH, and the second subset of the memory cells are those memory cells being programmed to data state S14 and verified for S14VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1422, the system is performing verification operations for data states S10 and S14 using a word line voltage (verify reference voltage) for state S10.

In step 1424, the voltage S14VH is applied to the selected word. While S14VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S14VH and after a second strobe time whether the threshold voltages of a second subset of the memory cells connected to the selected word line are above or below S12VL. In this step, the first subset of the memory cells are those memory cells being programmed to data state S14 and verified for S14VH, and the second subset of the memory cells are those memory cells being programmed to data state S12 and verified for S12VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1424, the system is performing verification operations for data states S14 and S12 using a word line voltage (verify reference voltage) for state S14.

In step 1426, the voltage S12VH is applied to the selected word. While S12VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S12VH and after a second strobe time whether the threshold voltages of a second subset of the memory cells connected to the selected word line are above or below S14VL. In this step, the first subset of the memory cells are those memory cells being programmed to data state S12 and verified for S12VH, and the second subset of the memory cells are those memory cells being programmed to data state S14 and verified for S14VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1426, the system is performing verification operations for data states S12 and S14 using a word line voltage (verify reference voltage) for state S12.

In step 1428, the voltage S14VH is applied to the selected word. While S14VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S14VH and after a second strobe time whether the threshold voltages of a second subset of the memory cells connected to the selected word line are above or below S14VL. In this step, the first subset of the memory cells are those memory cells being programmed to data state S14 and verified for S14VH, and the second subset of the memory cells are those memory cells being programmed to data state S14 and verified for S14VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1428, the system is performing verification operations for data states S14 and S14 using a word line voltage (verify reference voltage) for state S14.

In step 1430, the voltage S14VH is applied to the selected word. While S14VH is applied to the selected word line (and, therefore, applied to the control gates of the memory cells being verified), the sense amplifier (discussed above) is used to sense whether after a first strobe time the threshold voltages of a first subset of the memory cells connected to the selected word line are above or below S14VH and after a second strobe time whether the threshold voltages of a second subset of the memory cells connected to the selected word line are above or below S15VL. In this step, the first subset of the memory cells are those memory cells being programmed to data state S14 and verified for S14VH, and the second subset of the memory cells are those memory cells being programmed to data state S15 and verified for S15VL. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1430, the system is performing verification operations for data states S14 and S15 using a word line voltage (verify reference voltage) for state S14.

In step 1432, the voltage S15VH is applied to the selected word. While S15VH is applied to the selected word line (and, therefore, applied to the control gates of the memory cells being verified), the sense amplifier (discussed above) is used to sense whether the threshold voltages of the memory cells connected to the selected word line are above or below S15VH.

As described above, in each of steps 1404-1430 the system is configured to verify a first subset of the plurality of memory cells for a first data state using a verify reference voltage and verify a second subset of the plurality of memory cells for a second data state using the same verify reference voltage. That is, the system applies a verify reference voltage for a second data state to the plurality of memory cells, verifies a first subset of the plurality of memory cells for the first data state while applying the verify reference voltage to the first subset of the plurality of memory cells and verifies a second subset of the plurality of memory cells for a second data state while applying the verify reference voltage to second subset of the plurality of memory cells.

Figure 23:
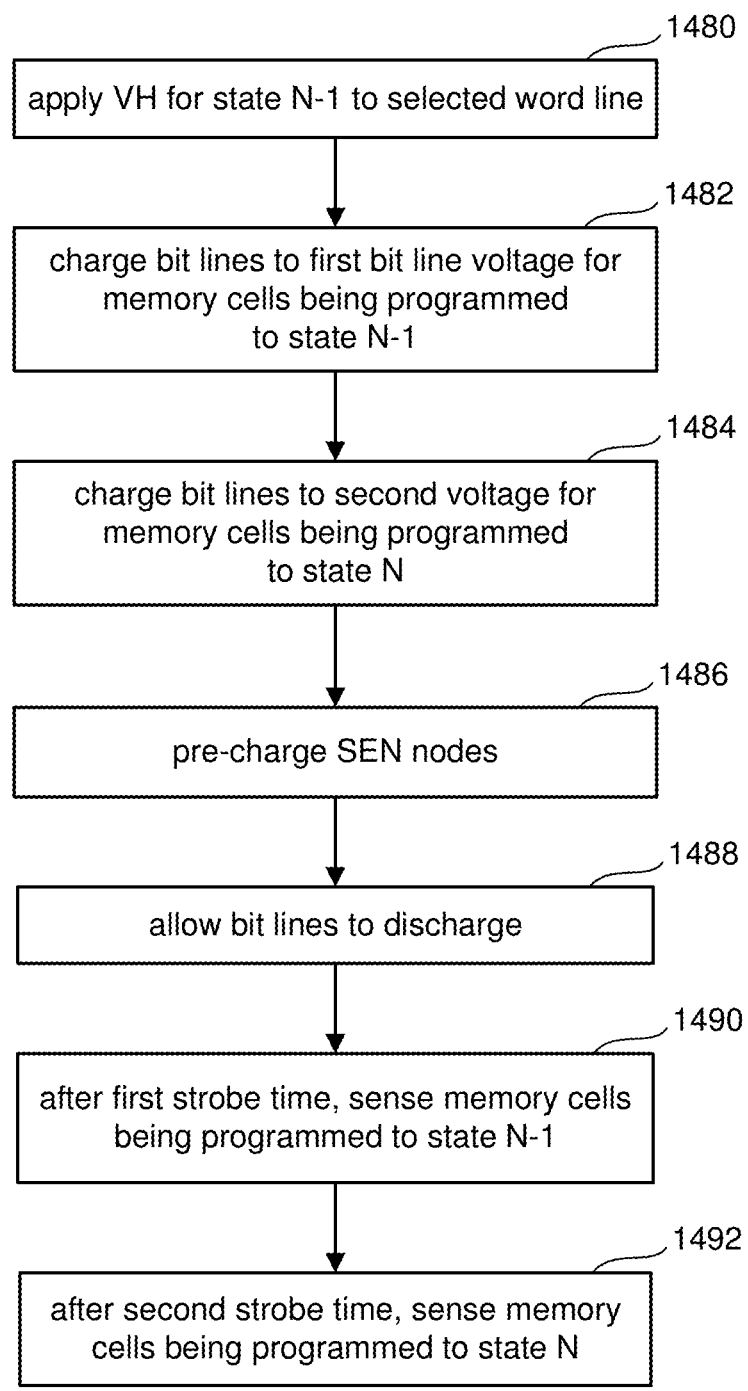
FIG. 23 is a flow chart describing one embodiment of a process for sensing.

FIG. 23 is a flow chart describing a single strobe sensing operation performed during each of steps 1404-1430. In step 1480, the appropriate data state N−1 VH verify reference voltage (e.g., S1VH, S2VH, S3VH, S4VH, S5VH, S6VH, S7VH, S8VH, S9VH, S10VH, S14VH, S12VH, S14VH, and S14VH) is applied is applied to the selected word line. The selected word line is connected to the memory cells being programmed and verified. In step 1482, for those memory cells being programmed to and verified for data state N−1 (e.g., verified to VH for data state N−1), the connected bit lines are charged to the first bit line voltage. In step 1484, for those memory cells being programmed to and verified for data state N (e.g., verified to VL for data state N), the connected bit lines are charged to the second bit line voltage. In step 1486, the SEN nodes of the sense amplifiers are pre-charged, as discussed above. In step 1488, the bit lines are allowed to discharge, for example, by discharging the capacitor 516 (see t5-t6 of FIG. 6), as discussed above. In step 1490, after the first strobe time, the voltage of the capacitor 516 (or the SEN node) is sampled as described above to see whether the respective memory cell(s) conducted so that memory cells are sensed for VH of state N−1. In step 1492, after the second strobe time, the voltage of the capacitor 516 (or the SEN node) is sampled as described above to see whether the respective memory cell(s) conducted so that memory cells are sensed for VL of state N. The process of FIGS. 22 and 23 can be performed by any of the one or more control circuits mentioned above. In one embodiment, it is preferred that the process of FIGS. 22 and 23 be performed at the direction of the state machine using the decoders and sense blocks of FIG. 2.

Figure 24:
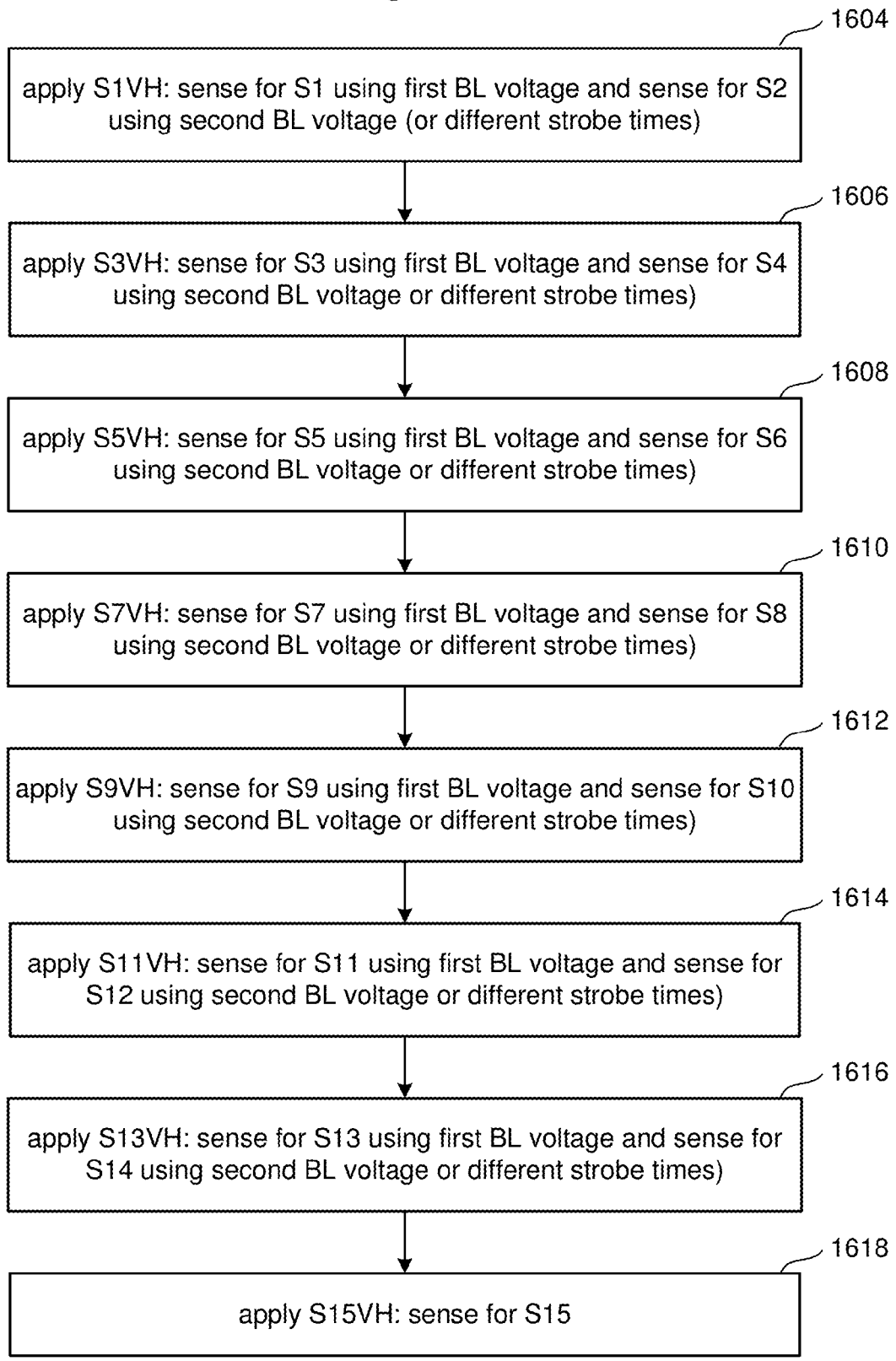
FIG. 24 is a flow chart describing one embodiment of a process for sensing.
Figure 25:
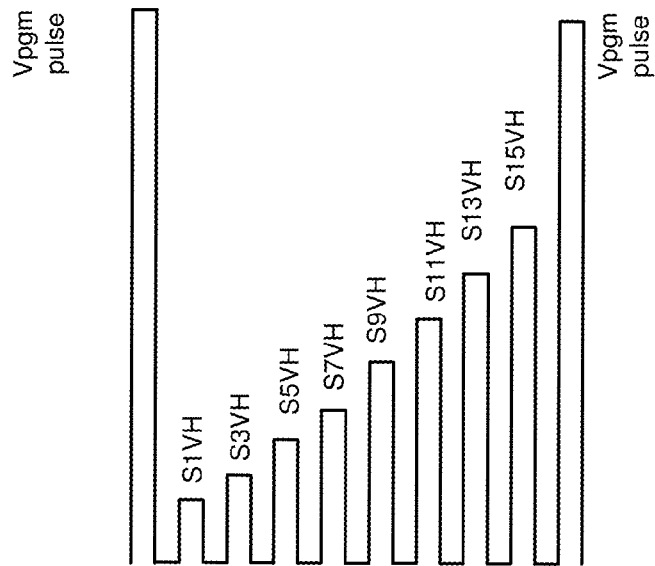
FIG. 25 depicts a signal waveform for a word line voltage.

FIG. 25 depicts a signal waveform for a word line voltage during program/verify, for the embodiment of FIG. 24. Two program pulses (Vpgm pulse) are depicted. Between the two program pulses are nine verify pulses, one verify pulse for each of S1VL, S1VH, S3VH, S5VH, S7VH, S9VH, S11VH, S13VH, and S15VH. Thus, the system of FIG. 24 saves the time needed to perform verify operations as only nine verify operations are set up and performed, rather than thirty.

In the later stages of programming, as various data states finish programming, gradually the verify operations drop out. This means for a portion of programming State N−1 verify reference voltage may not be available for State_N cells to verify with. For example, after data state S3 is finished, VH for S3 drops out. Therefore, for memory cells in the coarse stage for programming to S4 and needing to be judged against VL for S4, VH for S3 is not available anymore. To handle this situation at least three options are proposed: (1) when such a thing happens, we need to trigger data state N VL operation (or continue to do VH for data state N−1) until data state N finishes, and so on . . . for other states; (2) just blindly put all the remaining memory cells of State N into fine programming; or (3) all memory cells of State N that are the fine phase stay in the fine phase and all memory cells of State N that are the coarse phase stay in the coarse phase (with no transition to the fine phase).

The above-described technology for verifying programming can also be used with system that do not employ coarse/fine programming. FIGS. 24-27 provide a set of embodiments that do not implement coarse/fine programming. In the embodiment of FIGS. 24-27, each data state only has one verify level (which for purposes of consistency will be S1VH, S2VH, S3VH, S4VH, S5VH, S6VH, S7VH, S8VH, S9VH, S10VH, S11VH, S12VH, S13VH, S14VH, AND S15VH), Other verify levels can also be used.

FIG. 24 is a flow chart describing another embodiment of a process for verifying programming using multiple bit line voltages. In one embodiment, the process of FIG. 24 is performed during each iteration of step 774 of FIG. 10. The verification process of FIG. 24 includes verifying programming of the memory cells for a first data state using a verify operation for a second data state. Note that each of the steps of FIG. 24 represent one verify operation. Steps 1604-1616 represent one verify operation being performed using one word line voltage to perform verification for multiple data states.

In step 1604, the voltage S1VH is applied to the selected word. While S1VH is applied to the selected word line, the sense amplifier is used to sense whether the threshold voltages of a first subset of the memory cells connected to the selected word line are above or below S1VH and whether the threshold voltages of a second subset of the memory cells connected to the selected word line are above or below S2VH. Verification for both levels is performed concurrently. The first subset of the memory cells connected to the selected word line are those memory cells being programmed to data state S1 and verified for S1VH. The second subset of the memory cells are those memory cells being programmed to data state S2 and verified for S2VH. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1604, the system is concurrently performing verification operations for data states S1 and S2 using a word line voltage for state S1.

In step 1606, the voltage S3VH is applied to the selected word. While S3VH is applied to the selected word line, the sense amplifier is used to sense whether the threshold voltages of a first subset of the memory cells connected to the selected word line are above or below S3VH and whether the threshold voltages of a second subset of the memory cells connected to the selected word line are above or below S4VH. Verification for both levels is performed concurrently. The first subset of the memory cells connected to the selected word line are those memory cells being programmed to data state S3 and verified for S3VH. The second subset of the memory cells are those memory cells being programmed to data state S4 and verified for S4VH. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1606, the system is concurrently performing verification operations for data states S3 and S4 using a word line voltage for state S3.

In step 1608, the voltage S5VH is applied to the selected word. While S5VH is applied to the selected word line, the sense amplifier is used to sense whether the threshold voltages of a first subset of the memory cells connected to the selected word line are above or below S5VH and whether the threshold voltages of a second subset of the memory cells connected to the selected word line are above or below S6VH. Verification for both levels is performed concurrently. The first subset of the memory cells connected to the selected word line are those memory cells being programmed to data state S5 and verified for S5VH. The second subset of the memory cells are those memory cells being programmed to data state S6 and verified for S6VH. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1608, the system is concurrently performing verification operations for data states S5 and S6 using a word line voltage for state S5.

In step 1610, the voltage S7VH is applied to the selected word. While S7VH is applied to the selected word line, the sense amplifier is used to sense whether the threshold voltages of a first subset of the memory cells connected to the selected word line are above or below S7VH and whether the threshold voltages of a second subset of the memory cells connected to the selected word line are above or below S8VH. Verification for both levels is performed concurrently. The first subset of the memory cells connected to the selected word line are those memory cells being programmed to data state S7 and verified for S7VH. The second subset of the memory cells are those memory cells being programmed to data state S8 and verified for S8VH. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1610, the system is concurrently performing verification operations for data states S7 and S8 using a word line voltage for state S7.

In step 1612, the voltage S9VH is applied to the selected word. While S9VH is applied to the selected word line, the sense amplifier is used to sense whether the threshold voltages of a first subset of the memory cells connected to the selected word line are above or below S1VH and whether the threshold voltages of a second subset of the memory cells connected to the selected word line are above or below S10VH. Verification for both levels is performed concurrently. The first subset of the memory cells connected to the selected word line are those memory cells being programmed to data state S9 and verified for S9VH. The second subset of the memory cells are those memory cells being programmed to data state S10 and verified for S10VH. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1612, the system is concurrently performing verification operations for data states S9 and S10 using a word line voltage for state S9.

In step 1614, the voltage S11VH is applied to the selected word. While S11VH is applied to the selected word line, the sense amplifier is used to sense whether the threshold voltages of a first subset of the memory cells connected to the selected word line are above or below S1VH and whether the threshold voltages of a second subset of the memory cells connected to the selected word line are above or below S12VH. Verification for both levels is performed concurrently. The first subset of the memory cells connected to the selected word line are those memory cells being programmed to data state S11 and verified for S11VH. The second subset of the memory cells are those memory cells being programmed to data state S12 and verified for S12VH. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1614, the system is concurrently performing verification operations for data states S11 and S12 using a word line voltage for state S11.

In step 1616, the voltage S13VH is applied to the selected word. While S13VH is applied to the selected word line, the sense amplifier is used to sense whether the threshold voltages of a first subset of the memory cells connected to the selected word line are above or below S1VH and whether the threshold voltages of a second subset of the memory cells connected to the selected word line are above or below S14VH. Verification for both levels is performed concurrently. The first subset of the memory cells connected to the selected word line are those memory cells being programmed to data state S13 and verified for S13VH. The second subset of the memory cells are those memory cells being programmed to data state S14 and verified for S14VH. In this embodiment the bit lines for the first subset of memory cells being verified receive a first bit line voltage for the verify operation and the bit lines for the second subset of memory cells being verified receive a second bit line voltage for the verify operation, with the second bit line voltage being higher than the first bit line voltage. Therefore, as described above, in step 1616, the system is concurrently performing verification operations for data states S13 and S14 using a word line voltage for state S13.

In step 1618, the voltage S15VH is applied to the selected word line. While S15VH is applied to the selected word line, the sense amplifier is used to sense whether the threshold voltages of the memory cells connected to the selected word line are above or below S15VH. Those memory cells whose threshold voltage is below S15VH will turn on. Those memory cells whose threshold voltage is above S15VLH will turn remain off. In step 1618, only data state S15 is being verified.

The process of FIG. 24 includes sensing (or verifying) for multiple data states using different bit line voltages. In another embodiment, the system can sense (or verify) for multiple for multiple data states using different strobe times. For example, step 1604 can sense for data state S1 using a first strobe time and sense for data state S2 using a second strobe time, step 1604 can sense for data state S1 using a first strobe time and sense for data state S2 using a second strobe time, step 1606 can sense for data state S3 using a first strobe time and sense for data state S4 using a second strobe time, step 1608 can sense for data state S5 using a first strobe time and sense for data state S6 using a second strobe time, step 1610 can sense for data state S7 using a first strobe time and sense for data state S8 using a second strobe time, step 1612 can sense for data state S9 using a first strobe time and sense for data state S10 using a second strobe time, step 1614 can sense for data state S11 using a first strobe time and sense for data state S12 using a second strobe time, and step 1616 can sense for data state S13 using a first strobe time and sense for data state S14 using a second strobe time.

As described above, in each of steps 1604-1616 the system is configured to verify a first subset of the plurality of memory cells for a first data state using a verify reference voltage and verify a second subset of the plurality of memory cells for a second data state using the same verify reference voltage. That is, the system applies a verify reference voltage for a second data state to the plurality of memory cells, verifies a first subset of the plurality of memory cells for the first data state while applying the verify reference voltage to the first subset of the plurality of memory cells and verifies a second subset of the plurality of memory cells for a second data state while applying the verify reference voltage to second subset of the plurality of memory cells. The process of FIG. 24 can be performed by any of the one or more control circuits mentioned above. In one embodiment, it is preferred that the process of FIG. 24 performed at the direction of the state machine using the decoders and sense blocks of FIG. 2.

FIG. 25 depicts a signal waveform for a word line voltage during program/verify, for the embodiment of FIG. 24. Two program pulses (Vpgm pulse) are depicted. Between the two program pulses are eight verify pulses, one verify pulse for each of S1VH, S3VH, S5VH, S7VH, S9VH, S11VH, S13VH, and S15VH. Thus, the system of FIG. 24 saves the time needed to perform verify operations as only eight verify operations are set up and performed, rather than thirty.

Figure 26:
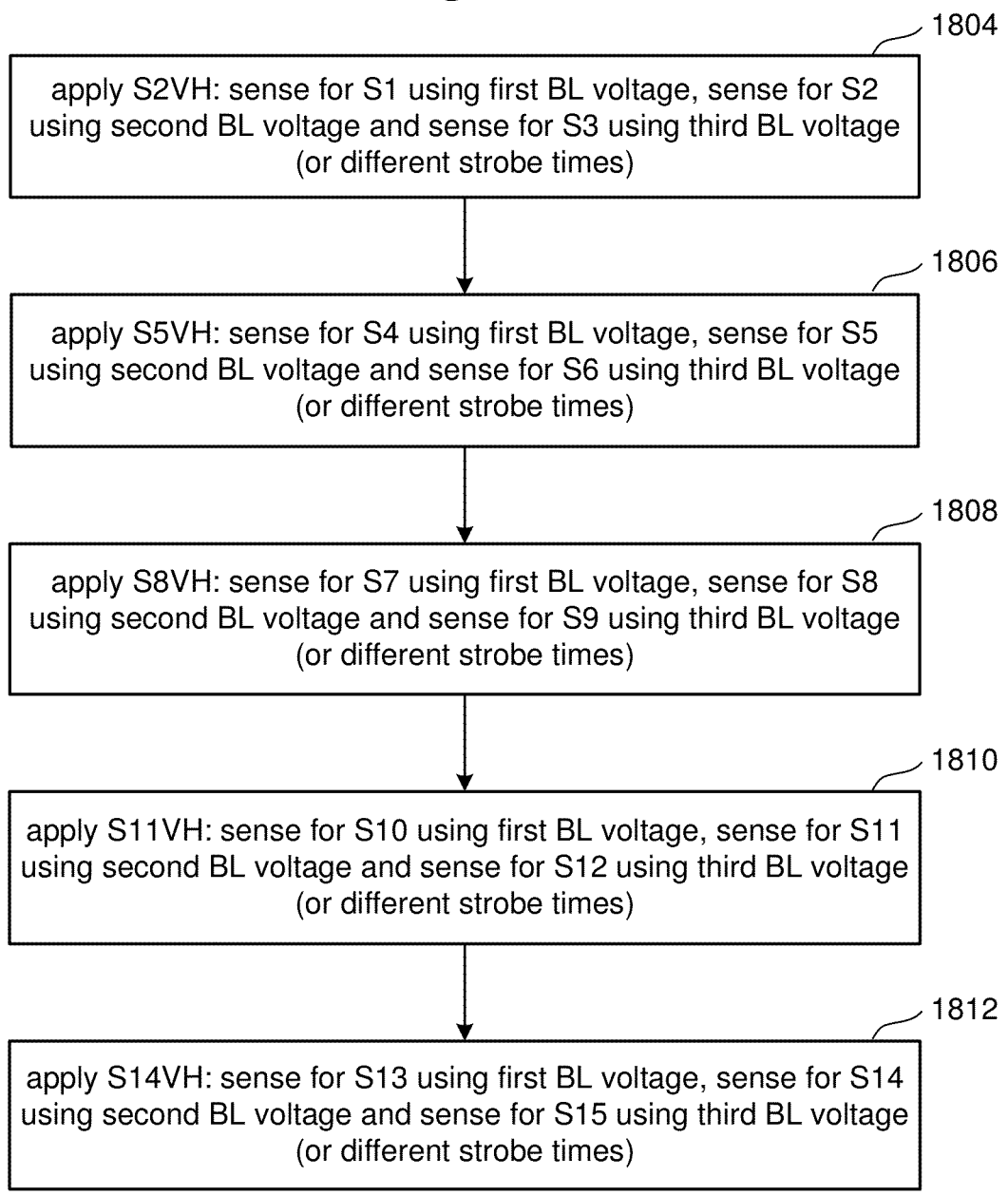
FIG. 26 is a flow chart describing one embodiment of a process for sensing.

FIG. 26 is a flow chart describing another embodiment of a process for verifying programming using multiple bit line voltages. In one embodiment, the process of FIG. 26 is performed during each iteration of step 774 of FIG. 10. The verification process of FIG. 26 includes verifying programming of the memory cells for a first data state using a verify operation for a second data state. Note that each of the steps of FIG. 26 represent one verify operation. Steps 1604-1612 represent one verify operation being performed using one word line voltage to perform verification for multiple data states. While other embodiments verify for two data states using a single verify reference voltage, the process of FIG. 26 verifies for three data states using a single verify reference voltage applied to the common word line by using three bit line voltage levels (or three strobe times). Other embodiments can verify for more than three states using a single verify reference voltage applied to the common word line by using more bit line voltage levels.

In step 1804, the voltage S2VH is applied to the selected word. While S2VH is applied to the selected word line, the sense amplifier is used to sense whether the threshold voltages of a first subset of the memory cells connected to the selected word line are above or below S1VH, whether the threshold voltages of a second subset of the memory cells connected to the selected word line are above or below S2VH and whether the threshold voltages of a third subset of the memory cells connected to the selected word line are above or below S3VH. Verification for all three levels is performed concurrently. The first subset of the memory cells connected to the selected word line are those memory cells being programmed to data state S1 and verified for S1VH. The second subset of the memory cells are those memory cells being programmed to data state S2 and verified for S2VH. The third subset of the memory cells are those memory cells being programmed to data state S3 and verified for S3VH. In this embodiment the bit lines for the first subset of memory cells being verified receive a first bit line voltage for the verify operation, the bit lines for the second subset of memory cells being verified receive a second bit line voltage for the verify operation and the bit lines for the third subset of memory cells being verified receive a third bit line voltage for the verify operation, with the third bit line voltage being higher than the second bit line voltage and second bit line voltage being higher than the first bit line voltage. Therefore, as described above, in step 1604, the system is concurrently performing verification operations for data states S1, S2 and S3 using a word line voltage for state S1. Alternatively (i.e., using the same bit line voltages for all three subsets), or in addition to using different bit line voltages, the first subset of the memory cells can be sensed after a first strobe time, the second subset of the memory cells can be sensed after a second strobe time and the third subset of the memory cells can be sensed after a third strobe time; with the first, second and third strobe times being different.

In step 1806, the voltage S5VH is applied to the selected word. While S5VH is applied to the selected word line, the sense amplifier is used to sense whether the threshold voltages of a first subset of the memory cells connected to the selected word line are above or below S4VH, whether the threshold voltages of a second subset of the memory cells connected to the selected word line are above or below S5VH and whether the threshold voltages of a third subset of the memory cells connected to the selected word line are above or below S6VH. Verification for all three levels is performed concurrently. The first subset of the memory cells connected to the selected word line are those memory cells being programmed to data state S4 and verified for S4VH. The second subset of the memory cells are those memory cells being programmed to data state S5 and verified for S5VH. The third subset of the memory cells are those memory cells being programmed to data state S6 and verified for S6VH. In this embodiment the bit lines for the first subset of memory cells being verified receive a first bit line voltage for the verify operation, the bit lines for the second subset of memory cells being verified receive a second bit line voltage for the verify operation and the bit lines for the third subset of memory cells being verified receive a third bit line voltage for the verify operation, with the third bit line voltage being higher than the second bit line voltage and second bit line voltage being higher than the first bit line voltage. Therefore, as described above, in step 1604, the system is concurrently performing verification operations for data states S4, S5 and S6 using a word line voltage for state S5. Alternatively (i.e., using the same bit line voltages for all three subsets), or in addition to using different bit line voltages, the first subset of the memory cells can be sensed after a first strobe time, the second subset of the memory cells can be sensed after a second strobe time and the third subset of the memory cells can be sensed after a third strobe time; with the first, second and third strobe times being different.

In step 1808, the voltage S8VH is applied to the selected word. While S8VH is applied to the selected word line, the sense amplifier is used to sense whether the threshold voltages of a first subset of the memory cells connected to the selected word line are above or below S7VH, whether the threshold voltages of a second subset of the memory cells connected to the selected word line are above or below S8VH and whether the threshold voltages of a third subset of the memory cells connected to the selected word line are above or below S9VH. Verification for all three levels is performed concurrently. The first subset of the memory cells connected to the selected word line are those memory cells being programmed to data state S7 and verified for S7VH. The second subset of the memory cells are those memory cells being programmed to data state S8 and verified for S8VH. The third subset of the memory cells are those memory cells being programmed to data state S9 and verified for S9VH. In this embodiment the bit lines for the first subset of memory cells being verified receive a first bit line voltage for the verify operation, the bit lines for the second subset of memory cells being verified receive a second bit line voltage for the verify operation and the bit lines for the third subset of memory cells being verified receive a third bit line voltage for the verify operation, with the third bit line voltage being higher than the second bit line voltage and second bit line voltage being higher than the first bit line voltage. Therefore, the system is concurrently performing verification operations for data states S7, S8 and S9 using a word line voltage for state S8. Alternatively (i.e., using the same bit line voltages for all three subsets), or in addition to using different bit line voltages, the first subset of the memory cells can be sensed after a first strobe time, the second subset of the memory cells can be sensed after a second strobe time and the third subset of the memory cells can be sensed after a third strobe time; with the first, second and third strobe times being different.

In step 1810, the voltage S11VH is applied to the selected word. While S11VH is applied to the selected word line, the sense amplifier is used to sense whether the threshold voltages of a first subset of the memory cells connected to the selected word line are above or below S10VH, whether the threshold voltages of a second subset of the memory cells connected to the selected word line are above or below S11VH and whether the threshold voltages of a third subset of the memory cells connected to the selected word line are above or below S12VH. Verification for all three levels is performed concurrently. The first subset of the memory cells connected to the selected word line are those memory cells being programmed to data state S10 and verified for S10VH. The second subset of the memory cells are those memory cells being programmed to data state S11 and verified for S11VH. The third subset of the memory cells are those memory cells being programmed to data state S12 and verified for S12VH. In this embodiment the bit lines for the first subset of memory cells being verified receive a first bit line voltage for the verify operation, the bit lines for the second subset of memory cells being verified receive a second bit line voltage for the verify operation and the bit lines for the third subset of memory cells being verified receive a third bit line voltage for the verify operation, with the third bit line voltage being higher than the second bit line voltage and second bit line voltage being higher than the first bit line voltage. Therefore, the system is concurrently performing verification operations for data states S10, S11 and S12 using a word line voltage for state S11. Alternatively (i.e., using the same bit line voltages for all three subsets), or in addition to using different bit line voltages, the first subset of the memory cells can be sensed after a first strobe time, the second subset of the memory cells can be sensed after a second strobe time and the third subset of the memory cells can be sensed after a third strobe time; with the first, second and third strobe times being different.

In step 1812, the voltage S134VH is applied to the selected word. While S134VH is applied to the selected word line, the sense amplifier is used to sense whether the threshold voltages of a first subset of the memory cells connected to the selected word line are above or below S13VH, whether the threshold voltages of a second subset of the memory cells connected to the selected word line are above or below S14VH and whether the threshold voltages of a third subset of the memory cells connected to the selected word line are above or below S15VH. Verification for all three levels is performed concurrently. The first subset of the memory cells connected to the selected word line are those memory cells being programmed to data state S13 and verified for S13VH. The second subset of the memory cells are those memory cells being programmed to data state S14 and verified for S14VH. The third subset of the memory cells are those memory cells being programmed to data state S15 and verified for S15VH. In this embodiment the bit lines for the first subset of memory cells being verified receive a first bit line voltage for the verify operation, the bit lines for the second subset of memory cells being verified receive a second bit line voltage for the verify operation and the bit lines for the third subset of memory cells being verified receive a third bit line voltage for the verify operation, with the third bit line voltage being higher than the second bit line voltage and second bit line voltage being higher than the first bit line voltage. Therefore, as described above, the system is concurrently performing verification operations for data states S13, S14 and S15 using a word line voltage for state S14. Alternatively (i.e., using the same bit line voltages for all three subsets), or in addition to using different bit line voltages, the first subset of the memory cells can be sensed after a first strobe time, the second subset of the memory cells can be sensed after a second strobe time and the third subset of the memory cells can be sensed after a third strobe time; with the first, second and third strobe times being different.

In each of steps 1804-1812, the system is configured to verify a first subset of the plurality of memory cells for a first data state using a verify reference voltage, verify a second subset of the plurality of memory cells for a second data state using the same verify reference voltage and verify a third subset of the plurality of memory cells for a third data state using the same verify reference voltage. In one embodiment, the system applies a verify reference voltage for a second data state to the plurality of memory cells, verifies a first subset of the plurality of memory cells for the first data state while applying the verify reference voltage to the first subset of the plurality of memory cells, verifies a second subset of the plurality of memory cells for a second data state while applying the verify reference voltage to second subset of the plurality of memory cells and verifies a third subset of the plurality of memory cells for a third data state while applying the verify reference voltage to the third subset of the plurality of memory cells. The process of FIG. 26 can be performed by any of the one or more control circuits mentioned above. In one embodiment, it is preferred that the process of FIG. 26 performed at the direction of the state machine using the decoders and sense blocks of FIG. 2.

Figure 27:
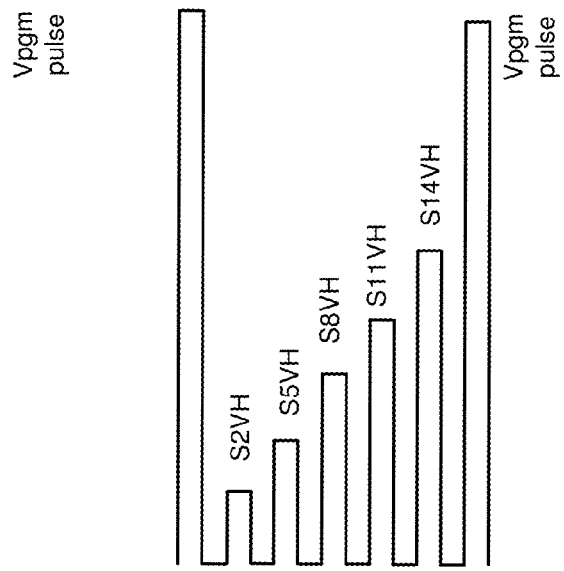
FIG. 27 depicts a signal waveform for a word line voltage.

FIG. 27 depicts a signal waveform for a word line voltage during program/verify, for the embodiment of FIG. 26. Two program pulses (Vpgm pulse) are depicted. Between the two program pulses are eight verify pulses, one verify pulse for each of S2VH, S5VH, S8VH, S11VH, and S14VH. Thus, the system of FIG. 26 saves the time needed to perform verify operations as only five verify operations are set up and performed, rather than thirty.

Although much of the discussion above specifically described verify processes, the technology described herein can be generic to sensing (i.e., both reading and/or verifying) based on using references voltages (i.e., verify reference voltages and/or read reference voltages) as discussed herein.

One embodiment includes a method of operating non-volatile storage, comprising: verifying programming of a plurality of memory cells for a first data state using a verify operation for a second data state.

In one example implementation, the verifying programming includes verifying programming of the plurality of memory cells for the first data state using a verify operation for an adjacent lower data state while applying a reference voltage to the plurality of memory cells for the adjacent lower data state; and the verifying programming further includes verifying programming of a group of memory cells for the adjacent lower data state using the verify operation for the adjacent lower data state.

One embodiment includes a non-volatile storage device, comprising: a word line; a plurality of memory cells connected to the word line, the memory cells are capable of storing data in a first data state and a second data state; and bit lines connected to the memory cells; and one or more control circuits in communication with the word line and the bit lines, the one or more control circuits are configured to apply a verify reference voltage for the second data state to the plurality of memory cells via the word line, the one or more control circuits are configured to verify a first subset of the memory cells for the first data state using the verify reference voltage, the one or more control circuits are configured to verify a second subset of the memory cells for the second data state using the verify reference voltage.

One embodiment includes a plurality of memory cells arranged in a three dimensional memory structure and connected to a common word line, the memory cells are capable of storing data in a first data state and a second data state; and means for applying a verify reference voltage for the second data state to the plurality of memory cells, verifying a first subset of the plurality of memory cells for the first data state while applying the verify reference voltage to the first subset of the plurality of memory cells and verifying a second subset of the plurality of memory cells for the second data state while applying the verify reference voltage to second subset of the plurality of memory cells.

One embodiment includes a method of verifying non-volatile storage while performing programming that includes a coarse phase and a fine phase, comprising: applying a verify reference voltage for a lower data state to a plurality of memory cells connected to a common word line; and verifying a first subset of the plurality of memory cells for a fine verify level for the lower data state while applying and in response to the verify compare and verifying a second subset of the plurality of memory cells for a coarse verify level for a higher data state while applying and in response to the verify reference voltage.

In one example implementation, the verifying the first subset of the plurality of memory cells for the fine verify level for the lower data state includes applying a first bit line voltage to the first subset of the plurality of memory cells; and the verifying the second subset of the plurality of memory cells for the coarse verify level for the higher data state while applying and in response to the verify reference voltage includes applying a second bit line voltage to the second subset of the plurality of memory cells, the second bit line voltage is different than the first bit line voltage.

One embodiment includes a non-volatile storage device, comprising: a plurality of memory cells; and one or more control circuits in communication with the memory cells, the one or more control circuits are configured to apply a reference voltage to the memory cells, while applying the reference voltage to the plurality of memory cells the one or more control circuits are configured to sense whether different memory cells of the plurality of memory cells are in different data states by applying different bit line voltages to different bit lines connected to the different memory cells.

One embodiment includes a method for sensing non-volatile storage, comprising: applying a first reference voltage to a plurality of memory cells connected to a common word line and different bit lines; applying a first bit line voltage to a first subset of the bit lines, the first subset of bit lines are connected to a first subset of the memory cells; applying a second bit line voltage to a second subset of the bit lines, the second subset of bit lines are connected to a second subset of the memory cells; sensing whether the first subset of the memory cells are in a first data state in response to the first reference voltage and the first bit line voltage; and sensing whether the second subset of the memory cells are in a second data state in response to the first reference voltage and the second bit line voltage.

One embodiment includes a plurality of memory cells arranged in a three dimensional memory structure; and means for applying different bit line voltages to the different memory cells in order to sense whether different memory cells of the plurality of memory cells are in different data states.

One example implementations further comprises a common word line connected to the plurality of memory cells; and a plurality of bit lines, each of the plurality of memory cells are connected to a different bit line of the plurality of bit lines. Wherein the means for applying different bit line voltages is configured to sense whether different memory cells of the plurality of memory cells are in different data states by applying a reference voltage to the plurality of memory cells via the common word line, applying a first bit line voltage to a first subset of the bit lines connected to a first subset of the memory cells, applying a second bit line voltage to a second subset of the bit lines connected to a second subset of the memory cells, sensing whether the first subset of the memory cells are in a first data state in response to the reference voltage and the first bit line voltage, and sensing whether the second subset of the memory cells are in a second data state in response to the first reference voltage and the second bit line voltage.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method, comprising:
    verifying programming of a plurality of memory cells for a first data state using a verify operation for a second data state including verifying the plurality of memory cells for a coarse verify level for the first data state in response to a reference voltage for the second data state and verifying a group of memory cells for a fine verify level for the second data state in response to the reference voltage for the second data state.

2. The method of claim 1, wherein:
    the verifying programming includes verifying programming of the plurality of memory cells for the first data state using a verify operation for an adjacent lower data state while applying a reference voltage to the plurality of memory cells for the adjacent lower data state; and
    the verifying programming further includes verifying programming of the group of memory cells for the adjacent lower data state using the verify operation for the adjacent lower data state.

3. The method of claim 2, wherein:
    the verifying programming includes applying a first bit line voltage to the plurality of memory cells and a second bit line voltage to the group of memory cells.

4. The method of claim 1, wherein:
    the plurality of memory cells are part of a set of memory cells; and
    the verifying programming includes applying different bit line voltages to bit lines connected to different memory cells of the set of memory cells in order to sense whether different memory cells of the set of memory cells are in different data states, the different states include the first data state and the second data state.

5. The method of claim 1, wherein:
the second data state is an adjacent lower data state to the first data state.

6. The method of claim 1 wherein:
the verify operation for the second data state comprises sensing the plurality of memory cells for a first strobe time and sensing the group of memory cells for a second strobe time.

7. The method of claim 1 wherein:
the verifying the plurality of memory cells for the coarse verify level for the first data state in response to the reference voltage for the second data state includes applying a first bit line voltage to bit lines connected to the plurality of memory cells; and
the verifying the group of memory cells for the fine verify level for the second data state in response to the reference voltage for the second data state includes applying a second bit line voltage to bit lines connected to the group of memory cells, the second bit line voltage is different than the first bit line voltage.

8. The method of claim 1 wherein:
the verifying the first group of memory cells for the coarse verify level for the first data state in response to the reference voltage for the second data state includes sensing the plurality of memory cells after a first strobe time; and
the verifying the second group of memory cells for the fine verify level for the second data state in response to the reference voltage for the second data state includes sensing the group of memory cells after a second strobe time, the second strobe time is different than the first strobe time.

9. The method of claim 8, wherein:
the verifying the plurality of memory cells for the coarse verify level for the first data state in response to the reference voltage for the second data state includes applying a first bit line voltage to bit lines connected to the plurality of memory cells and sensing the plurality of memory cells after the first strobe time; and
the verifying the group of memory cells for the fine verify level for the second data state in response to the reference voltage for the second data state includes applying a second bit line voltage to bit lines connected to the group of memory cells and sensing the group of memory cells after a second strobe time, the second strobe time is different than the first strobe time, the second bit line voltage is different than the first bit line voltage.

10. The method of claim 1, wherein:
the plurality of memory cells are arranged in a three dimensional memory structure.

11. A non-volatile storage device, comprising:
a word line;
a plurality of memory cells connected to the word line, the memory cells are capable of storing data in a first data state and a second data state;
bit lines connected to the memory cells; and
one or more control circuits in communication with the word line and the bit lines, the one or more control circuits are configured to apply a verify reference voltage for the second data state to the plurality of memory cells via the word line, the one or more control circuits are configured to verify a first subset of the memory cells for a coarse verify level of the first data state using the verify reference voltage, the one or more control circuits are configured to verify a second subset of the memory cells for a fine verify level of the second data state using the verify reference voltage.

12. The non-volatile storage device of claim 11, wherein:
the one or more control circuits are configured to verify the first subset of the memory cells for the first data state using the verify reference voltage and a first bit line voltage, the one or more control circuits are configured to verify the second subset of the memory cells for the second data state using the verify reference voltage and a second bit line voltage that is different than the first bit line voltage.

13. The non-volatile storage device of claim 11, wherein:
the one or more control circuits are configured to verify the first subset of the memory cells for the first data state using the verify reference voltage and a first strobe time, the one or more control circuits are configured to verify the second subset of the memory cells for the second data state using the verify reference voltage and a second strobe time that is different than the first strobe time.

14. The non-volatile storage device of claim 11, wherein:
the second data state is an adjacent lower data state to the first data state.

15. The non-volatile storage device of claim 11, wherein:
the plurality of memory cells are arranged in a three dimensional memory structure.

16. The non-volatile storage device of claim 11, wherein:
the memory cells are part of NAND strings in a three dimensional memory structure;
the three dimensional memory structure includes multiple vertical levels of memory cells; and
each of the memory cells of the plurality of memory cells are on a common level of the three dimensional memory structure.

17. non-volatile storage device, comprising:
a plurality of memory cells arranged in a three dimensional memory structure and connected to a common word line, the memory cells are capable of storing data in a first data state and a second data state; and
means for applying a verify reference voltage for the second data state to the plurality of memory cells, verifying a first subset of the plurality of memory cells for the first data state while applying the verify reference voltage to the first subset of the plurality of memory cells and using a first strobe time, and verifying a second subset of the plurality of memory cells for the second data state while applying the verify reference voltage to second subset of the plurality of memory cells and using a second strobe time, the second strobe time is different than the first strobe time.

18. The non-volatile storage device of claim 17, wherein:
the means for verifying the first subset of the memory cells for the first data state while applying the verify reference voltage to the first subset of the memory cells applies a first bit line voltage to the first subset of the memory cells.

19. The non-volatile storage device of claim 17, wherein:
the means for verifying the first subset of the memory cells for the first data state while applying the verify reference voltage to the first subset of the memory cells tests for a coarse verify level of the first data state; and
the means for verifying a second subset of the memory cells for the second data state while applying the verify reference voltage to the second subset of the memory cells tests for a fine verify level of the second data state.

20. A method, comprising:
applying a verify reference voltage for a lower data state to a plurality of memory cells connected to a common word line; and
verifying a first subset of the plurality of memory cells for a fine verify level for the lower data state while applying and in response to the verify reference voltage and verifying a second subset of the plurality of memory cells for a coarse verify level for a higher data state while applying and in response to the verify reference voltage.

21. The method of claim 20, wherein:
the verifying the first subset of the plurality of memory cells for the fine verify level for the lower data state includes applying a first bit line voltage to the first subset of the plurality of memory cells; and
the verifying the second subset of the plurality of memory cells for the coarse verify level for the higher data state while applying and in response to the verify reference voltage includes applying a second bit line voltage to the second subset of the plurality of memory cells, the second bit line voltage is different than the first bit line voltage.

* * * * *